United States Patent
Northcutt et al.

(10) Patent No.: US 10,931,284 B2
(45) Date of Patent: Feb. 23, 2021

(54) RESONATORS AND DEVICES WITH PIXEL BASED ELECTRODES OPERATING ACROSS A GAP

(71) Applicant: FOX ENTERPRISES, INC., Fort Myers, FL (US)

(72) Inventors: James Bryan Northcutt, Lehigh Acres, FL (US); Eugene S. Trefethen, Fort Myers, FL (US)

(73) Assignee: FOX ENTERPRISES, INC., Fort Myers, FL (US)

( * ) Notice: Subject to any disclaimer, the term of this patent is extended or adjusted under 35 U.S.C. 154(b) by 0 days.

(21) Appl. No.: 16/405,257

(22) Filed: May 7, 2019

(65) Prior Publication Data

US 2020/0358445 A1 Nov. 12, 2020

(51) Int. Cl.
| | |
|---|---|
| H03B 5/34 | (2006.01) |
| H03L 1/02 | (2006.01) |
| H01L 41/047 | (2006.01) |
| H03H 9/19 | (2006.01) |
| H03L 1/04 | (2006.01) |

(52) U.S. Cl.
CPC .......... *H03L 1/028* (2013.01); *H01L 41/0472* (2013.01); *H03H 9/19* (2013.01); *H03L 1/04* (2013.01)

(58) Field of Classification Search
CPC ....... H03L 1/028; H03L 1/04; H01L 41/0472; H03H 9/19
USPC .......................................................... 331/73
See application file for complete search history.

(56) References Cited

U.S. PATENT DOCUMENTS

| | | | |
|---|---|---|---|
| 2,240,449 A | 4/1941 | Wolfskill | |
| 2,813,048 A | 11/1957 | Pfann | |
| 3,431,392 A | 3/1969 | Garland et al. | |
| 3,569,750 A | 3/1971 | Beaver | |
| 3,617,923 A | 11/1971 | Paradysz et al. | |

(Continued)

OTHER PUBLICATIONS

Handbook of Acoustic Signal Processing. BAW Delay Lines. Andersen Laboratories. 15 pages.

(Continued)

*Primary Examiner* — Richard Tan
(74) *Attorney, Agent, or Firm* — Shumaker, Loop & Kendrick, LLP; James D. Miller

(57) ABSTRACT

A family of resonators and other devices which employ virtual electrodes using pixel based projection across a gap onto a material. In many embodiments, the pixels are projected onto a piezoelectric material, such as quartz crystal, by an integrated circuit die placed opposite a face of the crystal. The die projects individual pixels of electromagnetic energy onto the crystal, which vibrates and produces its own electromagnetic energy which is received by the pixels. Pixel projection onto other materials, including non-resonant materials, is also disclosed. The pixel based projected electrodes may be used in combination with, or in lieu of, conventional metal electrodes. Individual pixels may be turned on and off, and gain- and phase-controlled, in order to achieve specific desired resonator response characteristics. Many types of devices using pixel based electrode projection are disclosed—including resonators having one or more electrodes, oscillators, filters, delay lines, antennas and others.

37 Claims, 26 Drawing Sheets

(56) References Cited

U.S. PATENT DOCUMENTS

| | | |
|---|---|---|
| 4,076,559 A | 2/1978 | Chang et al. |
| 4,088,969 A | 5/1978 | Crowley et al. |
| 4,135,108 A | 1/1979 | Besson |
| 4,159,213 A | 6/1979 | Houston et al. |
| 4,365,182 A | 12/1982 | Ballato et al. |
| 4,451,755 A | 5/1984 | Vig et al. |
| 4,575,690 A | 3/1986 | Walls et al. |
| 4,596,697 A | 6/1986 | Ballato |
| 4,710,731 A | 12/1987 | Sugita et al. |
| 4,859,969 A | 8/1989 | Malinowski et al. |
| 5,051,643 A | 9/1991 | Dworsky et al. |
| 5,963,098 A | 10/1999 | MacMullen et al. |
| 5,970,393 A | 10/1999 | Khorrami et al. |
| 6,016,122 A | 1/2000 | Malone et al. |
| 7,154,212 B1 | 12/2006 | Kosinski |
| 7,207,222 B2 | 4/2007 | Thompson et al. |
| 7,427,819 B2 | 9/2008 | Hoen et al. |
| 7,508,286 B2 | 3/2009 | Ruby et al. |
| 7,788,979 B2 | 9/2010 | Vetelino et al. |
| 7,915,965 B2 | 3/2011 | Hardy et al. |
| 8,624,470 B2 | 1/2014 | Takahashi |
| 9,257,958 B2 | 2/2016 | Yong et al. |
| 9,431,955 B1 | 8/2016 | Northcutt et al. |
| 9,660,324 B2 | 5/2017 | Baringer |
| 2004/0223089 A1* | 11/2004 | Hong .................. G06F 3/046 349/12 |
| 2012/0235867 A1 | 9/2012 | Kim et al. |
| 2014/0204712 A1 | 7/2014 | Skinner et al. |
| 2018/0205152 A1* | 7/2018 | Tegreene ............. H04B 7/0413 |

OTHER PUBLICATIONS

Kistler—The Piezoelectric Effect, Theory, Design and Usage https://web.itu.edu.tir/~palabiyiky/Kistler%20-%20Pieozoelectric%20Theory.pdf. 1-12 pages. Feb. 22, 2007.

Iowa State University. Digital Repository. Retrospective Theses and Dissertations. Iowa State University Capstones, Theses and Dissertations. Acoustically driven integrated microstrip antennas and electromagnetic radiation from piezoelectric devices. 1993. Charles Forrest Campbell. https://lib.dr.iastate.edu/cgi/viewcontent.cgi?referer=https://www.google.com/&httpsredir=1&article=11786&context=rtd. 141 pages.

1996 IEEE International Frequency Control Symposium. An Analysis of Drive Level Sensitivity in Thickness Shear Quartz Resonators. Errol P. Eernisse. Auartzdyne, Inc., 1020 Atherton Dr., Bldg. C, Salt Lake City, UT 84123. 801 266 6958.

\* cited by examiner

RESONATORS AND DEVICES WITH PIXEL BASED ELECTRODES OPERATING ACROSS A GAP

BACKGROUND

Field

The present disclosure relates generally to resonators used in electronic circuits and, more particularly, to a family of resonators and related devices using projected virtual electrodes in lieu of or in addition to physical electrodes, where the virtual electrodes are projected in a pixel array which is adaptable to optimize resonator frequency response modes, resonator response to environmental factors such as temperature and vibration, and other parameters.

Discussion

Resonators are known in the art, including quartz crystal resonators which are packaged in various ways, including ceramic packages with a quartz crystal and a metal lid. These packages generally contain the minimum number of features and layers possible in order to reduce cost and size while still serving to protect the resonator, provide support, provide an inert environment and electrical interconnects from the resonator to pads located on the outside of the package. Other materials for packaging and resonators are known. This example serves as one embodiment particularly common and preferred for quartz resonators showing the essential features to make complete and functional packaged resonators available as a discrete component for use in an electronic assembly.

An oscillator is an active circuit which produces periodic voltage or current signals using a resonator as described above as a component. Oscillators use the mechanical resonance of a vibrating crystal of piezoelectric material to create an electrical signal with a precise frequency. This frequency is often used to keep track of time, as in quartz wristwatches, to provide a stable clock signal for digital integrated circuits, and to stabilize frequencies for radio transmitters and receivers. The most common type of piezoelectric resonator used is the quartz crystal, so oscillator circuits incorporating them became known as crystal oscillators, but other piezoelectric materials including polycrystalline ceramics are used in similar circuits.

A crystal in an oscillator works by being distorted by an electric field when voltage is applied to an electrode near or on the crystal. This property is known as inverse piezoelectricity. When the field is removed, the quartz—which oscillates at a precise frequency—generates an electric field as it returns to its previous shape, and this generates a voltage. The result is that a quartz crystal's motional behavior can be modeled as an RLC circuit.

The resonators and oscillators described above have been used successfully in electronic circuits for many years. However, there is still a need for resonators and oscillators with improved performance, particularly as related to control of spurious response modes, reduced insertion loss/spurious loss ratio and reduced acceleration sensitivity.

Furthermore, there is also a need for resonators and related devices with improved response characteristics, including response characteristics which are tuned via precise electrode projection, where the electrode projection may be adaptively controlled during device operation.

SUMMARY

The present disclosure describes a family of resonators and other devices which employ virtual electrodes using pixel based projection across a gap onto a material. In many embodiments, the pixel projection is onto a piezoelectric material, such as quartz crystal, by an integrated circuit die placed opposite a face of the crystal. The die projects individual pixels of electromagnetic energy onto the crystal, which vibrates and produces its own electromagnetic energy which is received by the pixels. Pixel projection onto other materials, including non-resonant materials, is also disclosed. The pixel based projected electrodes may be used in combination with, or in lieu of, conventional metal electrodes. Individual pixels may be turned on and off, and gain- and phase-controlled, in order to achieve specific desired resonator response characteristics. Many types of devices using pixel based electrode projection are disclosed—including resonators having one or more electrodes, oscillators, filters, delay lines, antennas and others.

Additional features of the presently disclosed devices will become apparent from the following description and appended claims, taken in conjunction with the accompanying drawings.

DETAILED DESCRIPTION OF THE EMBODIMENTS

The following discussion of the embodiments of the disclosure directed to monolithic composite resonator devices with intrinsic mode control resonators and other devices with pixel-based electrodes operating across a gap is merely exemplary in nature, and is in no way intended to limit the disclosed devices or their applications or uses.

Resonators are known in the art, including resonators which use a quartz crystal as the resonant element. Resonators are often provided in a package containing the minimum number of features and layers possible in order to reduce cost and size while still serving to protect the resonator, provide support, provide an inert environment and electrical interconnects from the resonator to pads located on the outside of the package. Oscillators, filters and other devices are also available which use a resonator as a component for establishing a frequency. Resonators and oscillators such as these have been used successfully in electronic circuits for many years. However, there is still a need for resonators and related devices with improved performance, particularly as related to increased control of spurious response modes, reduced insertion loss/spurious loss ratio and reduced acceleration sensitivity.

Figure 1:
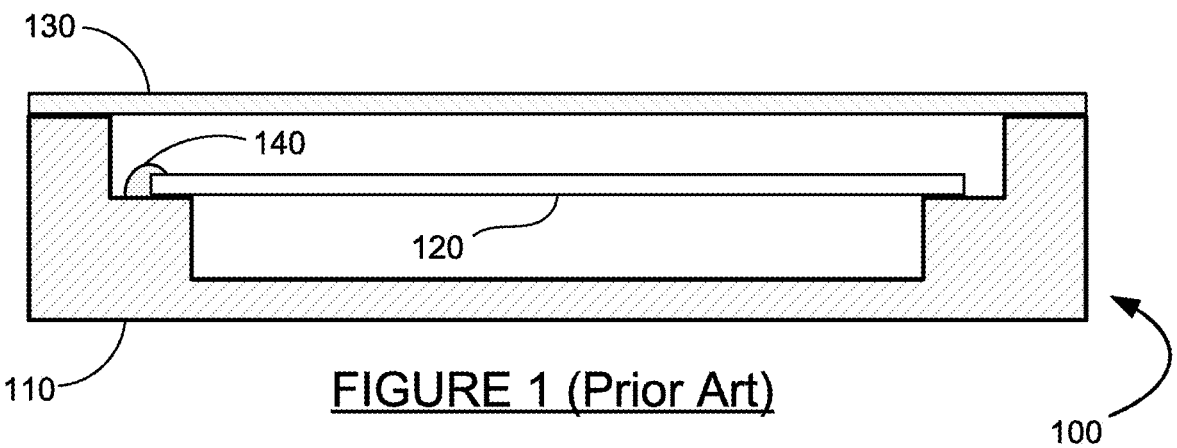
FIG. 1 is a cross-sectional side-view illustration of a conventional resonator device for use in an electronic circuit, as known in the art.

FIG. 1 is a cross-sectional side-view illustration of a conventional resonator device 100 for use in an electronic circuit, as known in the art. The resonator device 100 includes a ceramic base or package 110, a crystal 120 and a metal lid 130. The component that determines the frequency of oscillation is the crystal 120. The crystal 120 is typically a quartz crystal, as quartz, when subjected to an alternating voltage, vibrates at a very precise frequency, possesses piezoelectric properties which enable an electrical signal at the resonant frequency to be developed between the electrodes, and exhibits fairly stable resonance properties under varying temperature and other environmental factors. The ceramic base may have a stairstep-shaped cross-section providing a shelf for supporting the outer edge of the crystal 120, a lower basin, and a raised rim for sealing the metal lid 130.

The metal lid 130 is affixed to the ceramic base 110 by seam welding or other appropriate process which provides an enclosed, sealed package. In one common design, the crystal 120 is bonded to the ceramic base 110 with a bead of a suitable material, such as a conductive epoxy 140, at one or more points along the edge of the crystal 120. Connections such as conductive tracing on the base 110 and external contact pads ("pinouts") are not shown in FIG. 1, but will be discussed later. Although the component materials discussed above are commonly used, other materials besides those mentioned are also possible. For example, the base 110 may be made of something other than ceramic, and the lid 130 may not be metal. Even the crystal 120 may be made of another type of piezoelectric material besides quartz, as discussed below.

Figure 2:
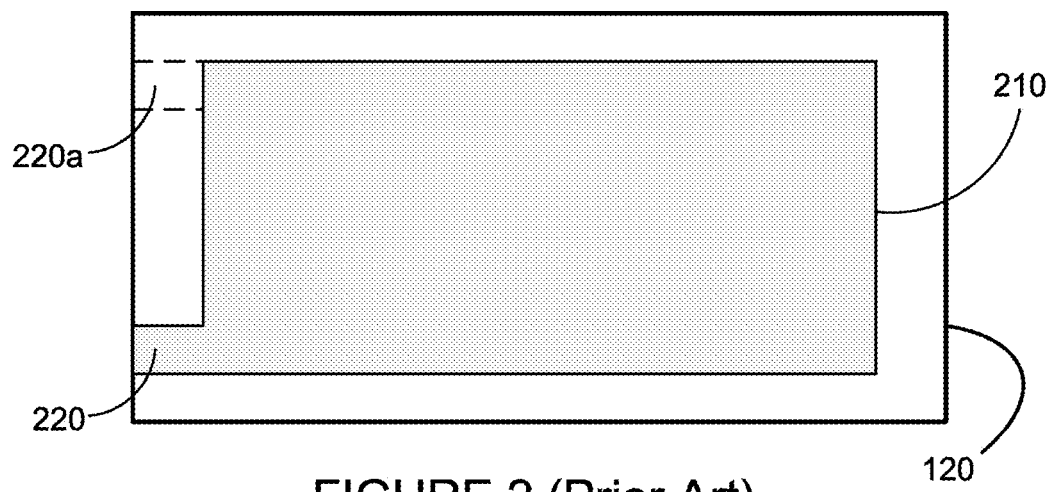
FIG. 2 is a top-view illustration of the crystal of the device shown in FIG. 1, including a resonator electrode on the crystal, as known in the art.

FIG. 2 is a top-view illustration of the crystal 120 of the device 100 shown in FIG. 1, including a resonator electrode 210 on the crystal 120, as known in the art. The resonator electrode 210 is a thin sheet of conductive metal applied to the face of the crystal 120, such as by evaporative deposition or sputtering. The resonator electrode 210 includes a small extension known as a flag 220 extending to the edge of the crystal 120 at one location, where the flag 220 (and thus the resonator electrode 210) contacts the conductive epoxy 140 and the conductive tracing discussed above, thereby enabling signal connections to the resonator electrode 210.

An identical resonator electrode 210 is also typically affixed to the opposite face of the crystal 120. The resonator electrode 210 on the bottom of the crystal 120 is apparent in FIG. 2 only via a flag 220a (seen as a dashed line) which extends to the edge of the crystal 120 for signal connectivity in the manner discussed above.

An ideal resonator would exhibit a strong resonance behavior at a single fundamental frequency, with virtually no resonant response at other frequencies. However, because the crystal 120 has many degrees of freedom, it therefore has many modes of vibration (bending, thickness shear, torsion, etc.) and many other frequencies at which it can vibrate besides the fundamental frequency. As a result, a resonator such as the device 100 behaves like many RLC series circuits arranged in parallel, with a resistance RX1, a capacitance CX1 and an inductance LX1 determining the fundamental frequency of the resonator, a resistance RX3, a capacitance CX3 and an inductance LX3 determining a third overtone frequency, etc. At frequencies other than the fundamental and the overtones, the resonator device 100 acts as a capacitor having a capacitance C0.

The quartz crystal 120 used in a resonator or oscillator is a very small, thin piece or wafer of cut quartz with the two parallel surfaces metalized to make the required electrical connections as discussed above. The physical size and thickness of a piece of quartz crystal is tightly controlled since it affects the final frequency of oscillations. The crystal's bulk acoustic wave characteristic is inversely proportional to its physical thickness between the two metalized surfaces, and other modes such as overtones and spurious responses are also determined by the crystal's size and shape. All of the crystal's response modes—although primarily dictated by its size and shape—are also affected by mounting configuration, temperature, and other factors.

Figure 3:
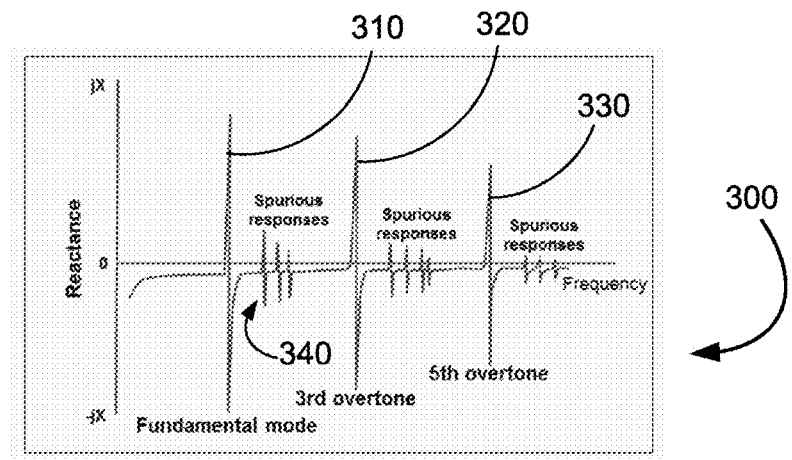
FIG. 3 is a graph of a frequency response of the crystal in the conventional resonator device of FIGS. 1 and 2, as known in the art.

FIG. 3 is a graph 300 of a frequency response of the crystal 120 in the conventional resonator device 100, as known in the art. The graph 300 plots reactance of the crystal 120 on the vertical axis as a function of frequency on the horizontal axis. The graph 300 shows a fundamental mode 310 having the greatest amplitude, a third overtone 320 and a fifth overtone 330 with successively lower amplitudes than the fundamental mode 310, and some unwanted modes commonly known as spurious responses 340. In oscillator applications, the oscillator usually selects the strongest mode. However, there are various ways in which the spurious responses can adversely affect the performance of the resonator device 100.

For example, some of the unwanted modes have steep frequency vs. temperature characteristics. The frequency of an unwanted mode can cross the target mode at a certain temperature, which causes an "activity dip". At the activity dip, excitation of the unwanted mode results in extra energy dissipation in the resonator, which results in a decrease in the Q factor (the ratio of the energy stored in the oscillating resonator to the energy dissipated per cycle), an increase in the equivalent series resistance, and a change in the frequency of the oscillator. In extreme cases, when the resistance increase is sufficiently large, the oscillation stops—that is, the oscillator fails. When the temperature changes away from the activity dip temperature, the oscillation restarts. In the critical case, the oscillator does not stop but can fail to meet specifications.

Unwanted modes can be partially controlled by proper design and fabrication methods. Maintaining the correct relationships among electrode and resonator plate dimensions (i.e., applying energy trapping rules), and minimizing fabrication errors such as contamination, can minimize the unwanted modes.

The use of different crystal cuts in frequency control applications also result in different performance. The AT cut type is used widely in the industry. It delivers good performance over a wide temperature range. The AT cut is popular because of the temperature characteristics of the resulting crystals. They can be used from −40° C. to +125° C. and have an inflection point—the symmetry point from which the frequency goes higher or lower with temperature—of about 25° C. Another type of crystal cut is SC, which refers to "Stress Compensated". SC cut crystals will have an inflection temperature of about 92° C. SC and other crystal cuts can benefit from the principles disclosed.

Pipe beveling is another technique which can be used to affect crystal performance. Pipe beveling involves turning a batch of crystal blanks in a "pipe" or barrel with a powder for a period of time. The mechanical action and the abrasiveness of the powder cause the edges of the crystals to be rounded. Pipe beveling can affect the presence of spurious response modes in crystals, and can dramatically reduce the Equivalent Series Resistance (ESR) at the fundamental frequency while having less effect on the ESR at the third overtone and higher modes.

The conventional resonator device 100 using the quartz crystal 120 enables very good resonator/oscillator performance under controlled conditions, and the techniques discussed above (such as crystal cut types, pipe beveling and careful dimensional control) can improve performance under some conditions. However, applications exist that create a need for resonator devices with further improved frequency-related performance—including suppression of spurious modes, reduced acceleration sensitivity and other enhanced performance characteristics. Many different resonator devices having these improved performance characteristics are disclosed below, where all of the disclosed devices have certain asymmetric design features and/or mounting configurations which give rise to some performance improvements inclusive of the asymmetry in features or mounting configurations.

Figure 4:
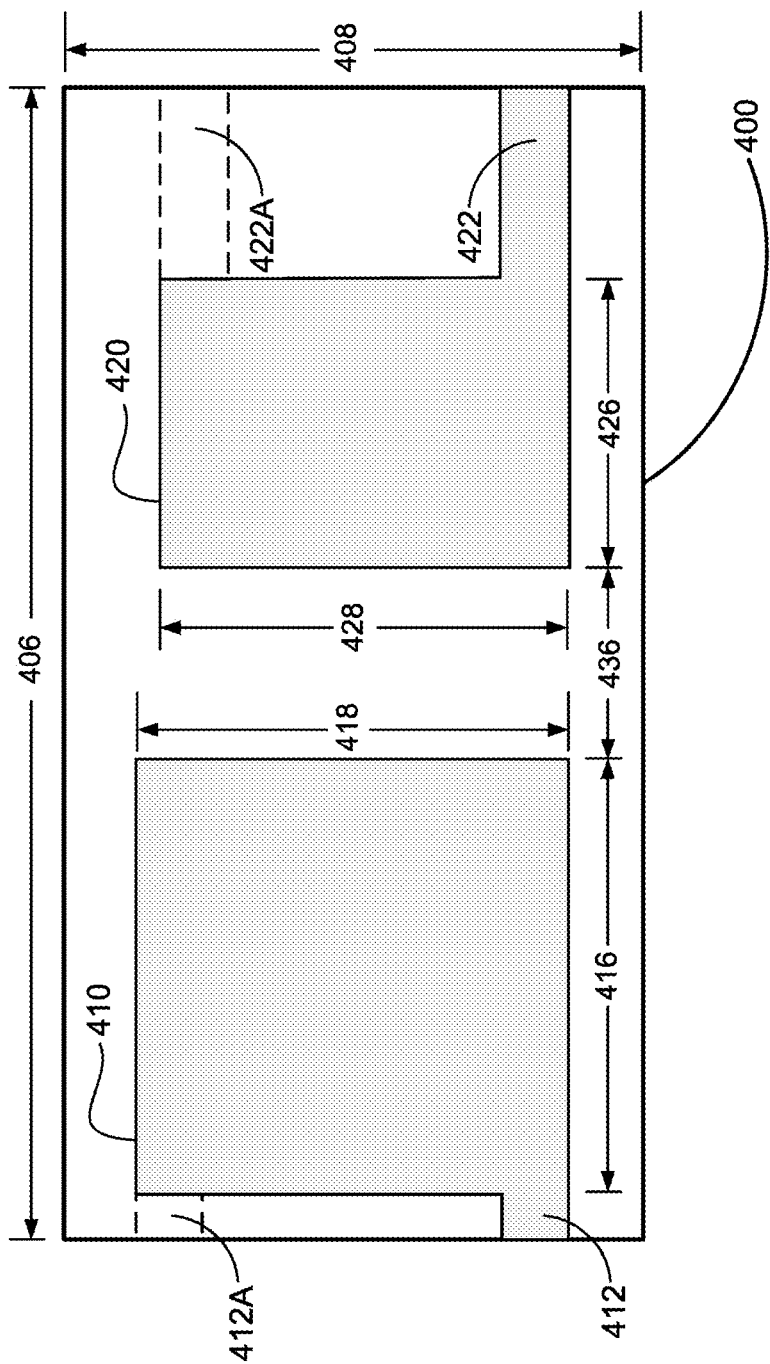
FIG. 4 is a top-view illustration of a crystal with dual, unequal-area resonator electrodes, according to an embodiment of the present disclosure.

FIG. 4 is a top-view illustration of a crystal 400 with dual, unequal-area resonator electrodes, according to an embodiment of the present disclosure. The crystal 400 is designed to be used in resonators and resonator-based devices such as oscillators, delivering the needed enhanced performance characteristics described above. The crystal 400 is a single crystal blank ("monolith") which includes dual resonators—a resonator electrode 410 and a resonator electrode 420—affixed to one face of the crystal 400. The resonator electrodes 410 and 420 each have a flag extending to the edge of the crystal 400, including a flag 412 of the resonator electrode 410 and a flag 422 of the resonator electrode 420. In a preferred embodiment, identical copies of the resonator electrodes 410 and 420 are affixed to the opposite (bottom) face of the crystal 400, as witnessed by a flag 412A and a flag 422A visible as dashed lines.

The crystal 400 itself has a length dimension 406 and a width dimension 408. The resonator electrodes 410 and 420 have unequal areas, the benefit of which is discussed below.

The resonator electrode 410 has a length dimension 416 (excluding the flag 412) and a width dimension 418, resulting in an area A1. The resonator electrode 420 has a length dimension 426 and a width dimension 428, resulting in an area A2. In the embodiment of FIG. 4, the area A1 is not equal to the area A2, which provides the ability to tune the spectral response of the composite device, discussed further below. Other design parameters which can affect performance include a distance 436 between the electrodes 410 and 420, and distances from the edges of the electrodes 410 and 420 to the edge of the crystal 400.

Figure 5:
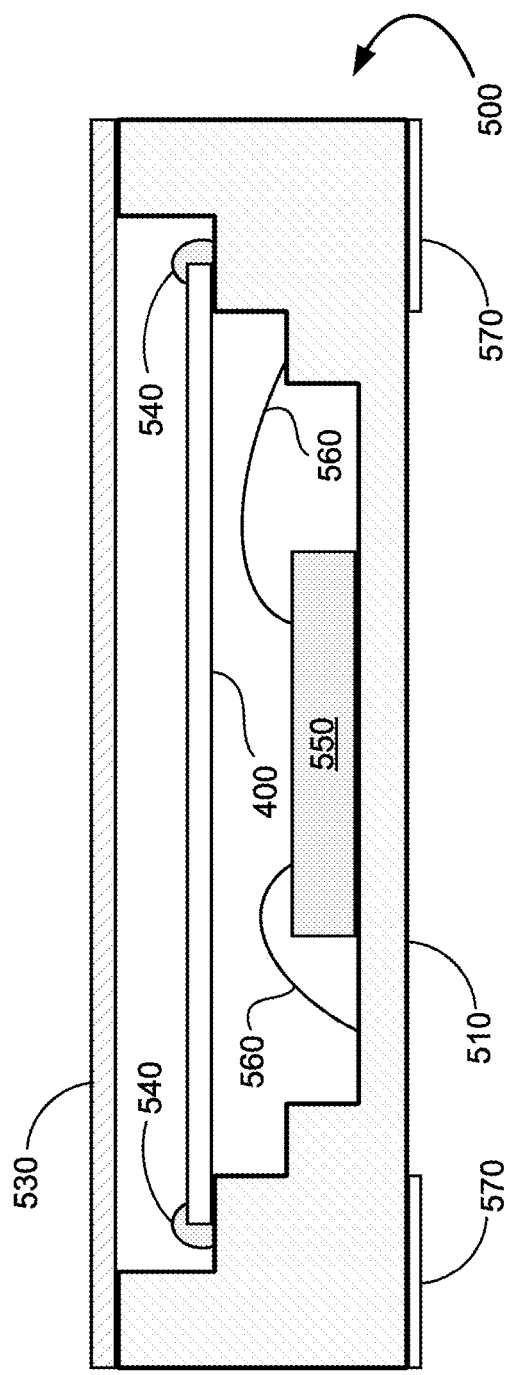
FIG. 5 is a cross-sectional side-view illustration of a composite resonator device for use in an electronic circuit, according to an embodiment of the present disclosure.

FIG. 5 is a cross-sectional side-view illustration of a composite resonator device 500 for use in an electronic circuit, according to an embodiment of the present disclosure. The composite resonator device 500 includes a ceramic base 510, the crystal 400 of FIG. 4 (with dual resonator electrodes) and a metal lid 530. The crystal 400 is mounted on the ceramic base 510 with beads or drops of conductive epoxy 540, where a drop of the epoxy 540 is placed at an outer edge of the crystal 400 at the location of each of the flags 412, 412A, 422 and 422A. Other configurations for mounting the crystal 400 to the base 510 will be discussed later.

The composite resonator device 500 may also include a semiconductor die (integrated circuit) 550 connected to traces on the ceramic base via leads 560. A die, in the context of integrated circuits, is a small block of semiconducting material on which a given functional circuit is fabricated. The die 550 is a programmable device which may be used for enhancing resonator performance by tuning the signals from the resonator electrodes 410 and 420 to optimize the desired mode control. It is to be understood that the die 550 includes at least one active component, such as a transistor, which can introduce net energy into a circuit. The die 550 is understood to be programmable and able to retain the programmed feature for performance enhancement of the resonator device 500. The die 550 can be a "flip chip" (wirelessly bonded) or in the wire bonded configuration shown.

The die 550 may also include the oscillator function, thereby transforming the composite resonator device 500 into a composite oscillator device. To be clear, the composite resonator device 500 of the present disclosure may be packaged with no active components (that is, without the die 550), or with the die 550 programmed for resonator performance enhancement, or with the die 550 programmed with the oscillator function and oscillator performance enhancement.

The composite resonator device 500 also includes conductive mounting pads 570 on the bottom of the base 510. As would be known by one skilled in the art, there are typically four of the mounting pads 570 on the bottom of the composite resonator device 500—one at each corner. The functions of the mounting pads 570 depend on the function of the die 550—that is, whether the device 500 is a performance-enhanced resonator, or whether the device 500 is a performance-enhanced oscillator. Though four of the pads 570 is the preferred embodiment, any practical and sufficient number of pads on the package can contain the performance-enhancing devices.

Figure 6A:
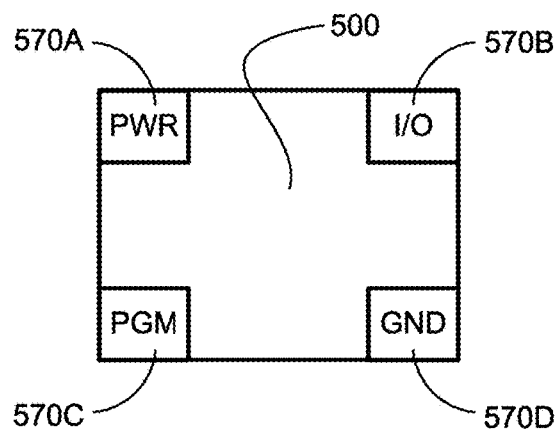
FIGS. 6A and 6B are illustrations of the bottom of the composite resonator device of FIG. 5 showing the functions of the mounting pads when the device is a performance-enhanced resonator.
Figure 6B:
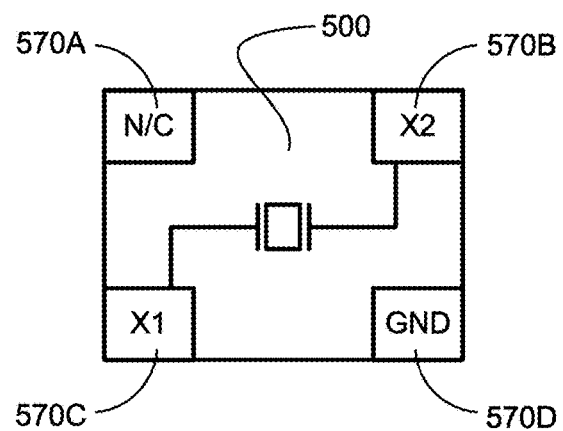

FIGS. 6A and 6B are illustrations of the bottom of the composite resonator device 500 showing the functions of the mounting pads 570 when the device 500 is a performance-enhanced resonator. FIG. 6A shows the "pinout" (mounting pad functions) before programming the die 550. A pad 570A is a power connection—such as 3.3 VDC, for example. A pad 570B is an input/output connection. A pad 570C is used for programming the die 550. A pad 570D is a ground connection. After programming the die 550, the performance-enhanced resonator device 500 uses the pinout of FIG. 6B. In this operational configuration, the pad 570A has no connection because power is not needed (the device 500 operates passively). The pads 570B and 570C provide the two connections (X2 and X1) for the resonator; this is true whether or not the die 550 is included in the composite resonator device 500. The pad 570D is still a ground connection.

Figure 7A:
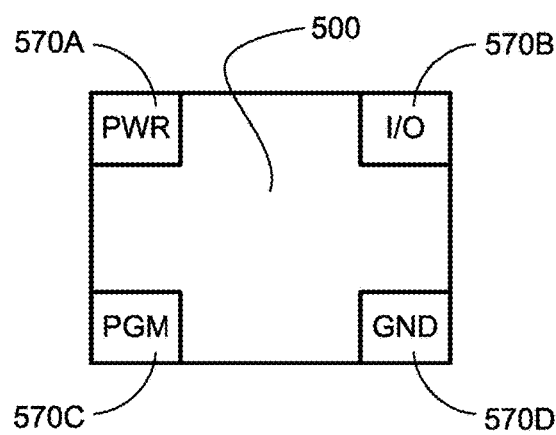
FIGS. 7A and 7B are illustrations of the bottom of the composite resonator device of FIG. 5 showing the functions of the mounting pads when the device is a performance-enhanced oscillator.
Figure 7B:
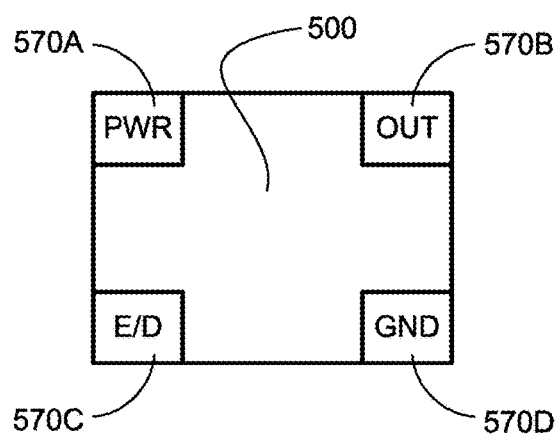

FIGS. 7A and 7B are illustrations of the bottom of the composite resonator device 500 showing the functions of the mounting pads 570 when the device 500 is a performance-enhanced oscillator. FIG. 7A shows the pinout before programming the die 550, which is functionally the same as FIG. 6A for the resonator device. That is, the pad 570A is power, the pad 570B is input/output, the pad 570C is for programming, and the pad 570D is ground. After programming the die 550, the performance-enhanced oscillator device 500 uses the pinout of FIG. 7B. In this operational configuration, the pad 570A remains as a power connection because power is needed for the oscillator. The pad 570B is used to connect to the oscillator output signal. The pad 570C provides an enable/disable function. The pad 570D is still a ground connection.

The above discussion of the pinouts for the composite resonator device 500—whether or not the programmable die 550 is included, and whether the composite resonator device 500 operates as a resonator device or an oscillator device—illustrates how the unequal-area dual-resonator crystal 400 can be used simply as a resonator with intrinsic mode control, or up-integrated with performance enhancing features and/or into an oscillator device. The composite resonator device 500 may also be up-integrated into a number of products besides oscillators—such as filters, delay lines, acoustic frequency multipliers, and sensors.

The composite resonator device 500 may be constructed with the two resonator electrodes 410 and 420 of the crystal 400 connected in series, or in parallel. Series vs. parallel connection of the resonator electrodes 410 and 420 provide different mode control characteristics, each with its own advantages. As will be discussed in detail below, connecting the resonator electrodes 410 and 420 in series provides a dramatic reduction in spurious modes, while connecting the resonator electrodes 410 and 420 in parallel results in a trade-off between insertion loss and spurious mode reduction.

The following discussion of FIGS. 8A-8D will be used to illustrate how the characteristics of the composite resonator device 500 can be used for intrinsic mode control. Because both the resonator 410 and the resonator 420 reside on the single crystal 400, they both naturally have characteristics much like the configuration and frequency response in FIGS. 2 and 3. However, because the resonators 410 and 420 have unequal areas, their responses are slightly different relative to each other. The difference can be tailored to enhance some modes and suppress others, as discussed below.

FIGS. 8A-8D are frequency response graphs for four different configurations of resonators, according to embodiments of the present disclosure. These figures plot amplitude in decibels (dB) vs frequency in megahertz (MHz) over a small portion of the frequency range around 40 MHz, with all of FIGS. 8A-8D using the same horizontal axis scaling (range=39.99 MHz to 40.15 MHz) and vertical axis scaling (range=0 to −77 dB).

Figure 8A:
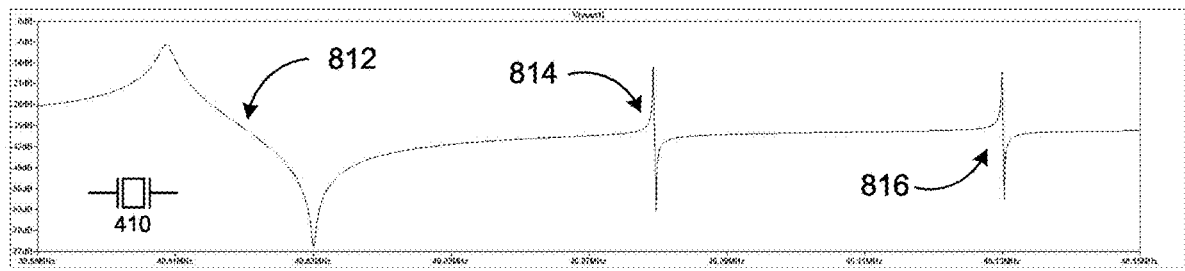
FIGS. 8A-8D are frequency response graphs for four different configurations of resonators, according to embodiments of the present disclosure.
Figure 8B:
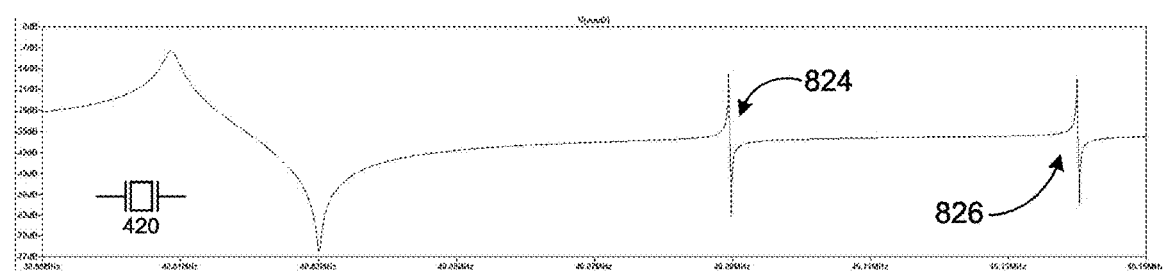

FIG. 8A is a graph 810 of part of the frequency response curve for the resonator 410 of the composite resonator device 500. FIG. 8B is a graph 820 of part of the frequency response curve for the resonator 420 of the composite resonator device 500. Because the resonators 410 and 420 are on the same single crystal 400 but have unequal areas, their responses are similar but slightly different. In particular, for the design of the resonators 410 and 420 being considered here, the fundamental mode is at the same frequency for both resonators but the spurious modes are at different frequencies. This phenomenon is clearly visible in FIGS. 8A and 8B.

In FIG. 8A, the curve 810 includes a fundamental frequency response 812 and two spurious responses 814 and 816. For the properties of the resonator 410 being considered in this example, the single resonator 410 exhibits a spurious "suppression"—which is defined as the difference in magnitude between the peak response at the target (fundamental) frequency and the peak spurious response—of about 9 dB. In FIG. 8B, the curve 820 includes a fundamental frequency response (same frequency as in FIG. 8A) and two spurious responses 824 and 826. For the properties of the resonator 420 being considered in this example, the spurious suppression in the curve 820 is also about 9 dB, although the "spurs" are at different frequencies than in FIG. 8A.

Figure 8C:
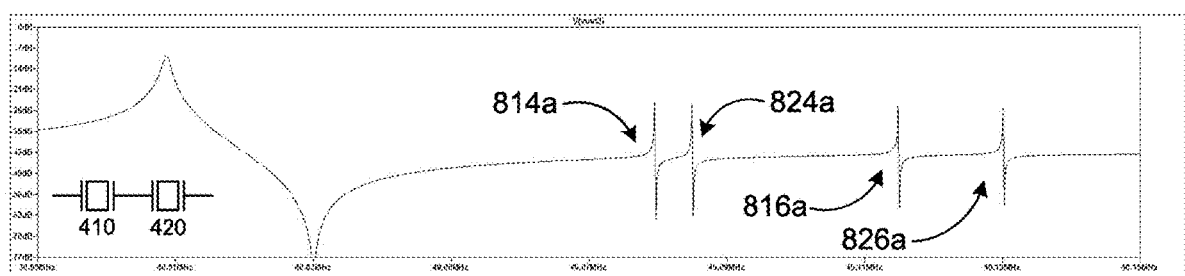

FIG. 8C is a graph 830 of the same part of the frequency response curve for the composite resonator device 500 with the resonator 410 connected in series with the resonator 420. When the resonators 410 and 420 are electrically in series, the overall response as shown in the curve 830 is suppressed—following a lower level on the dB scale—because the resistance of the resonators is in series. The spurious responses from the two resonators—which are not at the same frequencies—are also suppressed, having smaller peak to peak values. The result of this is that the overall spurious suppression of the resonator device 500 with the resonators in series—the difference between the peak response at the desired frequency (fundamental) and the peak spurious response—is much greater than in a single resonator device. FIG. 8C reveals a spurious suppression 830 of about 18 dB for the composite resonator device 500 with the resonators connected in series, compared to the 9 dB for the individual resonators discussed above. This is a dramatic improvement in spurious suppression demonstrated by the composite resonator device 500 with the resonators in series compared to prior art resonator devices.

Figure 8D:
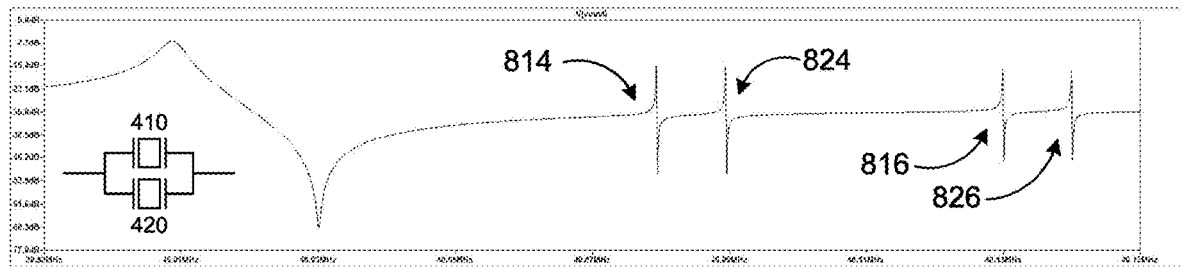

FIG. 8D is a graph 840 of the same part of the frequency response curve for the composite resonator device 500 with the resonator 410 connected in parallel with the resonator 420. In the composite resonator device 500 with intrinsic mode control operating at the fundamental response frequency, electrically in parallel, the electrode areas of the resonators 410 and 420 can be slightly different by design yet work together to produce a composite response. For the fundamental response in this case, the resistances of the two resonators 410 and 420 are in parallel and at the same frequency, so the composite resistance (the insertion loss) is reduced. On the other hand, the different electrode areas according to FIG. 3 (discussed above) makes the spurious responses of the two resonators 410 and 420 occur at different frequencies relative to each other. For this case the spurious resistances of the two resonators 410 and 420 are in parallel but not at the same frequency, so the composite resistance of any one spur is not reduced. In this way, the spurious modes are intrinsically reduced relative to the target mode, the fundamental mode in this example.

Figure 9:
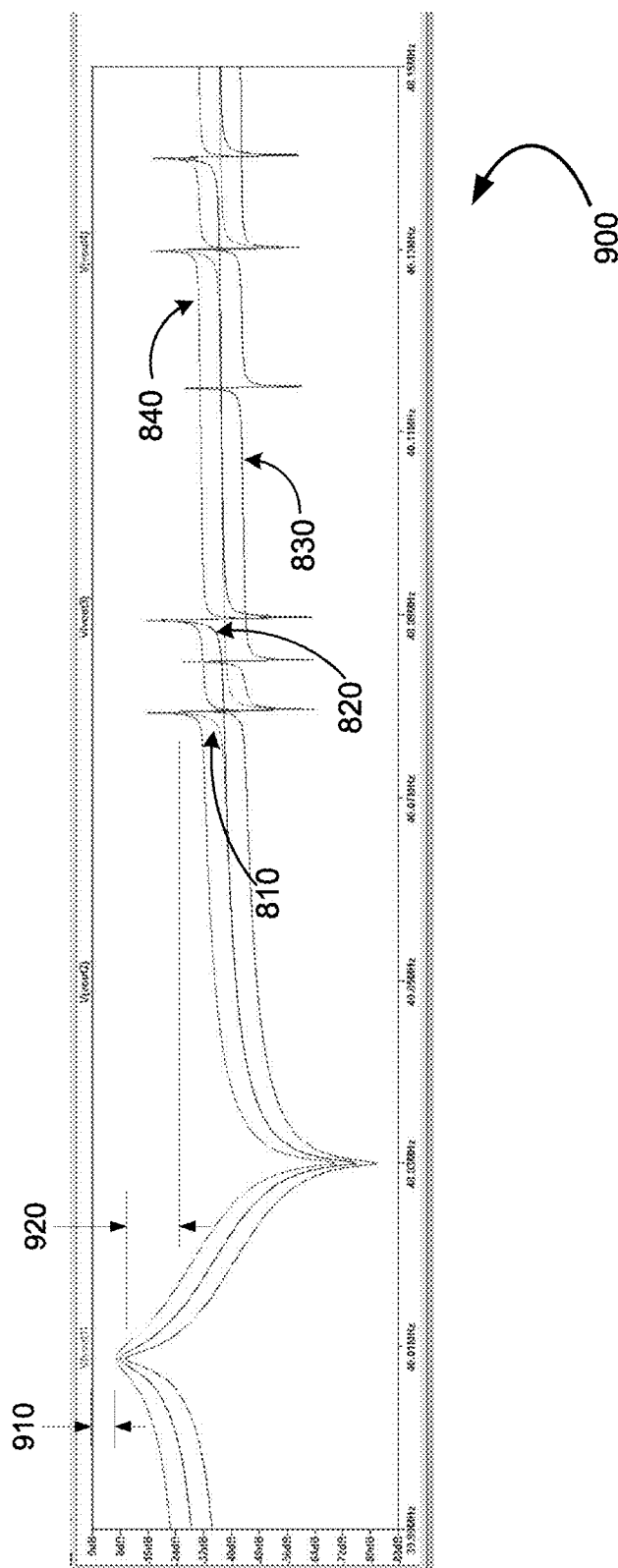
FIG. 9 is a graph of the same part of the frequency response curve as FIG. 8, for the composite resonator device of FIG. 5, where all of the curves of FIGS. 8A-8D are overlaid.

FIG. 9 is a graph 900 of the same part of the frequency response curve for the composite resonator device 500 including the curve 810 for the resonator 410, the curve 820 for the resonator 420, the curve 830 for the series connection of the resonators 410 and 420, and the curve 840 for the parallel connection of the resonators 410 and 420. Some of the performance enhancements of the composite resonator device 500 discussed above relative to FIGS. 8A-8D are more visually apparent when the curves 810-840 are all superimposed on one graph, as is done in FIG. 9.

The curve 840 is seen as having the highest overall average value toward the right of the graph 900, because the capacitance C0 (discussed earlier) of the resonators is in parallel. But the curve 840 also has the highest peak at the fundamental frequency toward the left of the graph 900. The absolute value of the peak at the fundamental frequency is known as the insertion loss of the resonator device, and is shown for the curve 840 (parallel connection) as reference number 910 on FIG. 9. The insertion loss 910 for the parallel connection is a few dB better than either the series connection curve 830 or the individual resonator curves 810 and 820. Reduced insertion loss, while achieving some spurious suppression—makes the parallel connection of the resonators 410 and 420 in the device 500 a good option for some applications. The ratio and trade-off between insertion loss and spurious suppression can still surpass the prior art of FIGS. 2 and 3.

The curve 830 is seen as having the lowest overall average value toward the right of the graph 900, because the capacitance C0 of the resonators is in series. The curve 830 also has the smallest peak amplitudes at the spurious frequencies. The difference between the peak value at the fundamental frequency and the highest peak at a spurious frequency is known as the spurious suppression of the resonator device, and is shown for the curve 830 (series connection) as reference number 920 on FIG. 9. The spurious suppression 920 for the series connection is about 18 dB as mentioned earlier, and this is much better than either the parallel connection curve 840 or the individual resonator curves 810 and 820. Dramatically improved spurious suppression makes the series connection of the resonators 410 and 420 in the device 500 a good option for some applications.

The disclosed composite resonator device 500 has several advantages compared to two or more independent pieces of piezoelectric or other resonator materials. The monolithic nature of the disclosed device is an advantage firstly because of the possibility of size and cost reduction. In addition, because both the resonators 410 and 420 are on the same crystal 400, they will respond consistently to environmental factors such as temperature, vibration, and shock. Individual instances of the composite resonator device 500 will have closely matching frequency versus temperature, aging, Q factor, surface roughness, etc. That is to say, unless deliberate steps are introduced to cause mismatch in these parameters, equivalent processing results in a high degree of uniformity from one resonator to the next. For example, a multi-blade wire saw cutting up a quartz bar into individual pieces introduces slightly different angles from one piece to the next, but any two or more resonators constructed on a single piece so cut will have the same starting relative angle. Similar arguments can be made for inclusions, contaminants, surface roughness, etc. and the properties they influence. In matching and passive cancellation, similarity can be a priority.

The factors described above, and the examples of FIGS. 8 and 9, illustrate how the composite resonator device 500, having unequal area resonators connected either in series or in parallel, provides performance advantages and design latitude over other resonator devices.

Another application of intrinsic mode control in the composite resonator device 500 is to suppress at least one other mode relative to a target mode. For example, mode control using two separate resonators (410, 420) on a single substrate such as the crystal 400, can be used to suppress the fundamental frequency while retaining the third overtone. This can again be done by making the areas of the respective electrodes for the resonator 410 different from the resonator 420. By design of the resonator areas, the third overtone frequencies of the two resonators 410 and 420 can be made close enough to combine (lock) and be used as a composite resonator at the third overtone. By the same design, simultaneously, the frequencies of the two resonators 410 and 420 at the fundamental mode can be intrinsically wide enough so that they cannot combine. If the two resonators 410 and 420 are connected in series, the fact that the fundamental modes do not combine means that a signal which can pass easily through the resonator 410 is guaranteed to be attenuated by the resonator 420. An oscillator which has such a composite resonator in its feedback loop can then be more easily designed which cannot run on the fundamental mode due to this intrinsic suppression and simultaneously much more easily designed to run on the intended mode, in this example, the third overtone. Of note, it can do so without various trap circuits and other circuit design which either add complexity, size and cost, or reduce performance.

In the preceding discussion, the composite resonator device 500 with unequal area resonators on a single crystal was disclosed, and the advantages of the dual resonator design with unequal areas were discussed—including both series and parallel connection of the resonators, and applications designed for fundamental frequency operation, third overtone operation, etc. There are other ways to achieve the benefits of two resonators with slightly dissimilar properties on a single crystal, besides having the resonator areas be unequal. Following are descriptions of other embodiments of composite resonator devices where the two resonators may or may not have the same area, but in all cases have some property which makes them respond differently so that the inherent response difference can be used to enhance the properties of the composite resonator device (increase suppression, reduce insertion loss/spurious loss ratio, etc.) as discussed above.

Many different resonator properties can be adjusted—that is, made asymmetric—so that the two resonators exhibit different resonant responses. These properties include, but are not limited to, unequal areas of the electrodes (discussed above), equal area electrodes located asymmetrically about a centerline of the crystal 400, equal area electrodes located symmetrically about the centerline of the crystal 400 but where the crystal 400 has asymmetric mounting pads, electrodes of equal or unequal area with different thicknesses, electrodes of dissimilar metals, and asymmetric use of mass loading electrodes vs projected electrodes (discussed in detail later). Each of these properties will be discussed further below.

Figure 10:
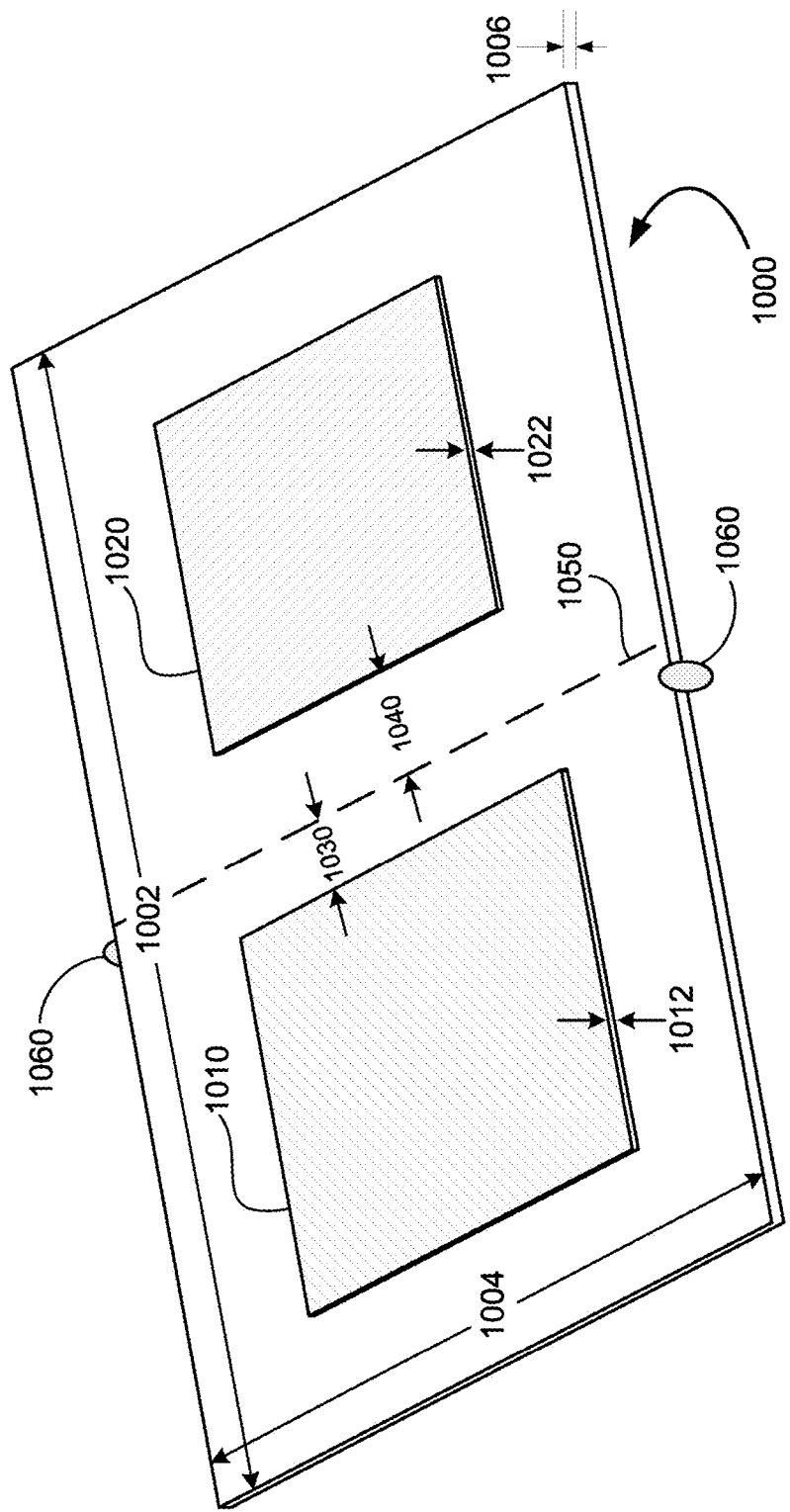
FIG. 10 is an isometric view illustration of a resonator crystal with dual, asymmetrically-configured resonator electrodes, according to an embodiment of the present disclosure.

FIG. 10 is an isometric view illustration of a resonator crystal 1000 with dual, asymmetrically-configured resonator electrodes, according to an embodiment of the present disclosure. The crystal 1000 is designed to be used in resonators and resonator-based devices such as oscillators, similarly to the crystal 400 discussed above. The crystal 1000 is a single crystal blank ("monolith") which includes dual resonators—a resonator electrode 1010 and a resonator electrode 1020—affixed to one face of the crystal 1000. The resonator electrodes 1010 and 1020 could each have a flag extending to the edge of the crystal 1000, as discussed previously but not shown in FIG. 10 for the sake of clarity. Identical copies of the resonator electrodes 1010 and 1020 are affixed to the opposite (bottom) face of the crystal 1000, as also discussed previously. The crystal 1000 has a length dimension 1002, a width dimension 1004 and a thickness 1006.

The crystal 1000 with resonator electrodes 1010 and 1020 offers many ways in which asymmetric properties can be used to achieve a composite response which includes intrinsic mode control. As discussed earlier, and shown again in FIG. 10, the areas of the resonator electrodes 1010 and 1020 can be made different to achieve the desired mode control (spurious mode suppression, selection of third overtone frequency, etc.).

Thicknesses of the resonator electrodes may also be used to achieve the desired mode control. The resonator electrode 1010 has a thickness 1012, and the resonator electrode 1020 has a thickness 1022. The thicknesses 1012 and 1022 may be made different to cause the responses of the resonator electrodes 1010 and 1020 to be slightly different and enable intrinsic mode control via the response differences. The thicknesses 1012 and 1022 may also be made variable over the area of the resonator electrodes 1010 and 1020. These thickness differences and variations may be used with the areas of the resonator electrodes 1010 and 1020 being the same, or with different areas. In other words, the thickness and area properties may be used together or separately to achieve the desired frequency response from each of the resonator electrodes and thereby achieve the desired mode control when the signals from the resonator electrodes 1010 and 1020 are combined.

The resonator electrodes 1010 and 1020 may also be made of different materials, causing another type of response difference. For example, one of the resonator electrodes may be made of aluminum, while the other resonator electrode is made of gold or silver. The differing electrode materials may be used in combination with thickness and/or area differences, to achieve the desired mode control.

Other design parameters which can be configured to achieve asymmetry and intrinsic mode control include asymmetric placement of the resonator electrodes 1010 and 1020. The crystal 1000 has a centerline 1050 which bisects the crystal 1000 into two equal halves. If the resonator electrodes 1010 and 1020 are placed at different distances from the centerline 1050, as shown in dimensions 1030 and 1040, respectively, then the frequency responses of the resonator electrodes 1010 and 1020 will be different, even if their areas are the same. Again, the asymmetric placement can be used in combination with different areas and differences in other parameters to achieve the composite response which is desired.

Properties of the crystal 1000 itself, and/or its mounting to the ceramic base of the resonator device, can also be configured to achieve asymmetry and intrinsic mode control. The thickness 1006 of the crystal 1000 can be made variable rather than constant, which will affect the frequency response of the resonator electrodes 1010 and 1020. Many different thickness-tapering designs are discussed below. Specific patterns or shapes can also be etched into one or both faces of the crystal 1000, where, if the patterns are asymmetric about the centerline 1050, they will have an asymmetric effect on the resonator electrodes 1010 and 1020.

Asymmetric mounting of the crystal 1000 to its ceramic base (such as the ceramic base 510 of the resonator device 500 in FIG. 5) can also be used to achieve the desired mode control. The crystal 1000 is shown in FIG. 10 as having a pair of epoxy mounting beads 1060. If the mounting beads 1060 are not located on the centerline 1050, then the crystal 1000 will exhibit an asymmetric resonant response, and the resonator electrodes 1010 and 1020 will therefore also produce different responses. Different numbers and placements of the mounting beads 1060 are possible (corners, etc.), where asymmetric response of the resonator electrodes 1010 and 1020 can be achieved by asymmetric crystal mounting. Different types of mounting besides epoxy beads may also be employed, where asymmetric mounting placement can be used as a design parameter for the composite resonator with intrinsic mode control.

All of the asymmetric parameter configurations discussed above can be used alone or in combination with others to achieve the desired resonator mode control.

Another concept which can be used to achieve a composite resonator device with intrinsic mode control is to use a combination of a projected electrode and a mass loading electrode. A mass loading electrode, as known in the art, is an electrode of the type discussed above relative to the crystals 120, 400 and 1000—where a thin metallic electrode is deposited on the surface of the piezoelectric element (crystal). The effect of the mass of the metallic electrode is to lower the frequency of oscillation of the crystal, among other things. Projected electrodes are also known in the art, where there is no electrode material bonded to the piezoelectric element (i.e., the crystal). Instead, a first and second disk or plate of dielectric material are arranged opposite each other and spaced apart from one another, with a piezoelectric crystal arranged between the first and second disk. No metal electrodes are adhered to the crystal; instead, signals are obtained by metallization on the faces of the first and second projecting disks which are adjacent to the crystal and which respond to the piezoelectric effect of the vibrating crystal.

Figure 11A:
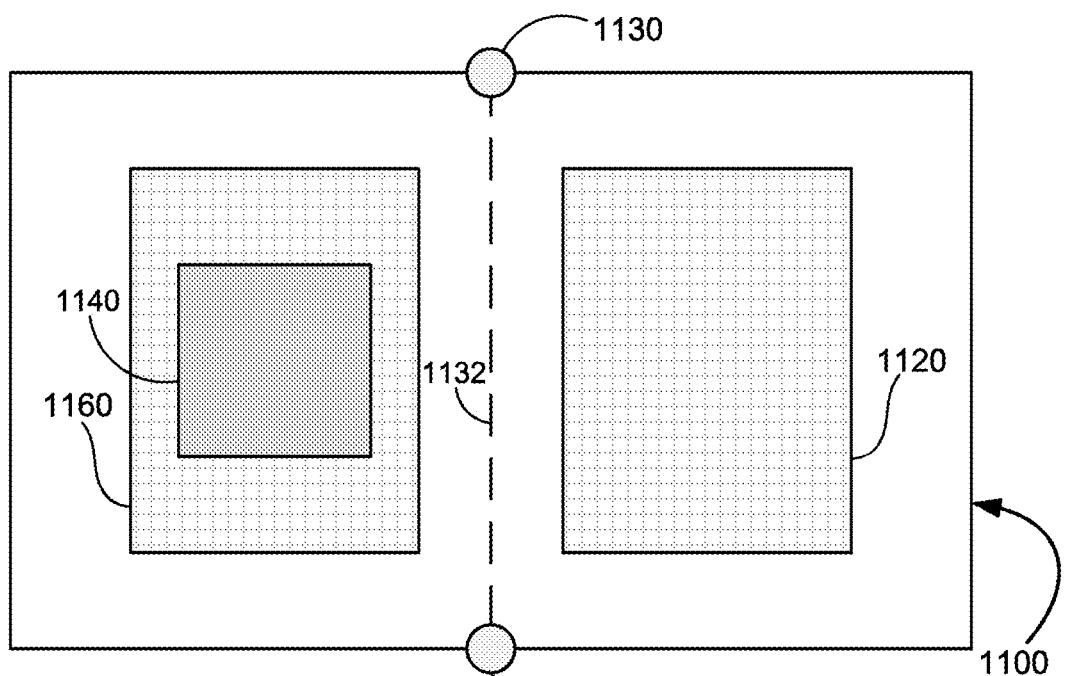
FIG. 11A is a top view illustration of a piezoelectric crystal and FIGS. 11B and 11C are side view illustrations of the crystal with asymmetric resonators comprising a mass loading electrode and a projected electrode, according to embodiments of the present disclosure.
Figure 11B:
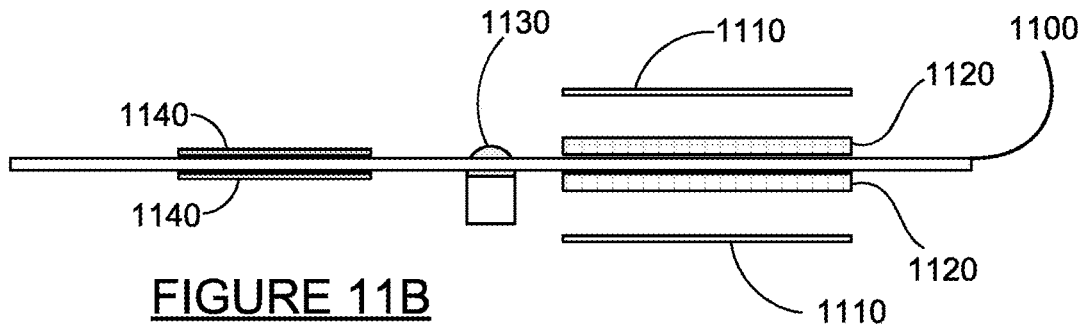
Figure 11C:
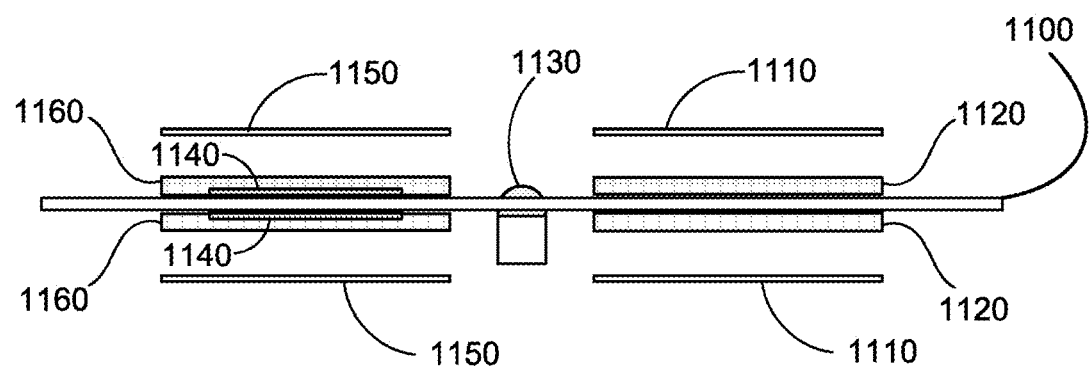

FIG. 11A is a top view illustration of a crystal 1100 and FIGS. 11B and 11C are side view illustrations of the crystal 1100 with asymmetric resonators comprising a mass loading electrode and a projected electrode, according to embodiments of the present disclosure. In the side view of FIG. 11B, the right side of the crystal 1100 includes a projecting electrode 1110 above and below the crystal 1100, and a projected "electrode" 1120 on the upper and lower faces of the crystal 1100. The projected electrodes 1120 are virtual; there is no physical material adhered to the crystal 1100. The gaps between the projecting electrodes 1110 and the crystal 1100 are kept as small as practical. The effect of the projecting electrodes 1110 with the crystal 1100 is to stabilize signals in the projecting electrodes 1110 at the resonant vibration frequency of the crystal 1100, in a manner similar to a physical crystal-mounted electrode. The notion of the projected electrodes 1120 is used to convey the idea that there is an interaction between the electromagnetic signals in the projecting electrodes 1110 and the mechanical vibration of the crystal 1100 in this area.

Mounting beads (e.g., epoxy beads) 1130 are shown in the top view FIG. 11A on each side of the crystal 1100, along a centerline 1132 in this case. One of the mounting beads 1130 is visible in FIGS. 11B and 11C. Although the mounting of the crystal 1100 is symmetric in these illustrations, asymmetric crystal mounting is one of several different options available for creating asymmetric resonator response using differing electrode types, which can be used to create a composite signal with intrinsic mode control.

One option for asymmetric resonators is to use conventional metal electrodes 1140 on the left side of the crystal 1100, as shown in FIG. 11B. The metal resonator electrodes 1140 would typically include flags for connection to wiring or tracing at the edge of the crystal 1100, as discussed previously. Flags can be omitted as in FIGS. 11A and 11B for combining with projected electrodes. In this configuration, the projected (virtual) electrodes 1120 are used on one side of the crystal 1100, and the conventional metal electrodes 1140 are used on the other side of the crystal 1100. The absence of mass loading on the right side (projected electrode side) of the crystal 1100 will cause a change in resonant frequency on that side, and the frequency response of the projected electrodes 1120 will therefore be different from the frequency response of the conventional metal electrodes 1140. This difference can be used to create a composite resonator device with intrinsic mode control (spurious suppression, reduced insertion loss/spurious loss ratio, etc.) as discussed earlier.

The areas of the projected electrodes 1120 are seen in FIG. 11A to be different than the areas of the conventional metal electrodes 1140. Projected electrode areas can be different than conventional metal electrode areas, as shown in these figures, or the electrode areas can be the same. Even if the areas are the same, the mass loading and other differences between the two types of electrodes will cause the frequency response to be different on one side of the crystal 1100 than on the other.

Another option is to use a combination of the conventional metal electrodes 1140 with projected electrodes on the left side of the crystal 1100, as shown in FIG. 11C. (Left vs. right is of course arbitrary, and is used here simply to describe locations of items on FIGS. 11A-11C.) Along with the conventional metal electrodes 1140 on the crystal 1100 in FIG. 11C, projecting electrodes 1150 are situated above and below the crystal 1100, resulting in virtual projected electrodes 1160 on the crystal 1100. The signals from the projecting electrodes 1150 can be combined with the signals from the metal electrodes 1140 to provide a composite signal for the left side of the crystal 1100, which can then be combined in series or parallel with the signal from the projecting electrodes 1110 on the right side of the crystal 1100, resulting in a composite resonator signal with many types of possible mode control.

FIGS. 11A-11C illustrate how combinations of metal electrodes and projected electrodes can be used to provide asymmetric frequency response signals which can be combined to advantageously enhance target resonance frequencies and suppress undesirable frequencies. All of the different parameters mentioned thus far—resonator area, resonator thickness, resonator material, crystal thickness variation, asymmetric resonator placement on the crystal, asymmetric mounting of the crystal, and asymmetric usage of metal electrodes vs. projected electrodes—may be used in any desired combination in order to achieve the desired difference in frequency response and thus the desired mode control.

Another form of projected resonator electrodes involves the use of pixel-based projection. This technique can also be employed in an asymmetric composite resonator device to achieve intrinsic mode control, as will be discussed below. The term "pixel" as used here does not refer to the conventional optical picture element, but rather refers to an area element of electromagnetic wave projection. The same is true of the projected electrodes discussed above.

The idea is that in the same way optical pixels can be addressed by row and column with data that ultimately forms a projected optical image, an array of pixels can be addressed on the semiconductor material so that the shape of the projected electrode is defined by the pixel image. The pixels can for example be in the shape of squares, rectangles, etc., as discussed further below. The semiconductor material mechanically supporting the projecting pixels can also contain an integrated circuit which can turn some pixels "on" while leaving others "off" as well as other functions. Signals couple to and from the "on" pixel array to the resonator material (e.g., crystal) across a gap. The pixels can be any size convenient to semiconductor processing. The space between pixels is generally kept as small as the semiconductor processing allows. There is some dispersion, or spreading, of the electric field that occurs laterally depending on the distance of the gap. This is convenient for making any two adjacent "on" pixels spread in such a way that the projected image combines these areas. Too much gap or too small a pixel will not allow the "off" pixels to be effective, so an optimum exists based on these parameters.

Figure 12:
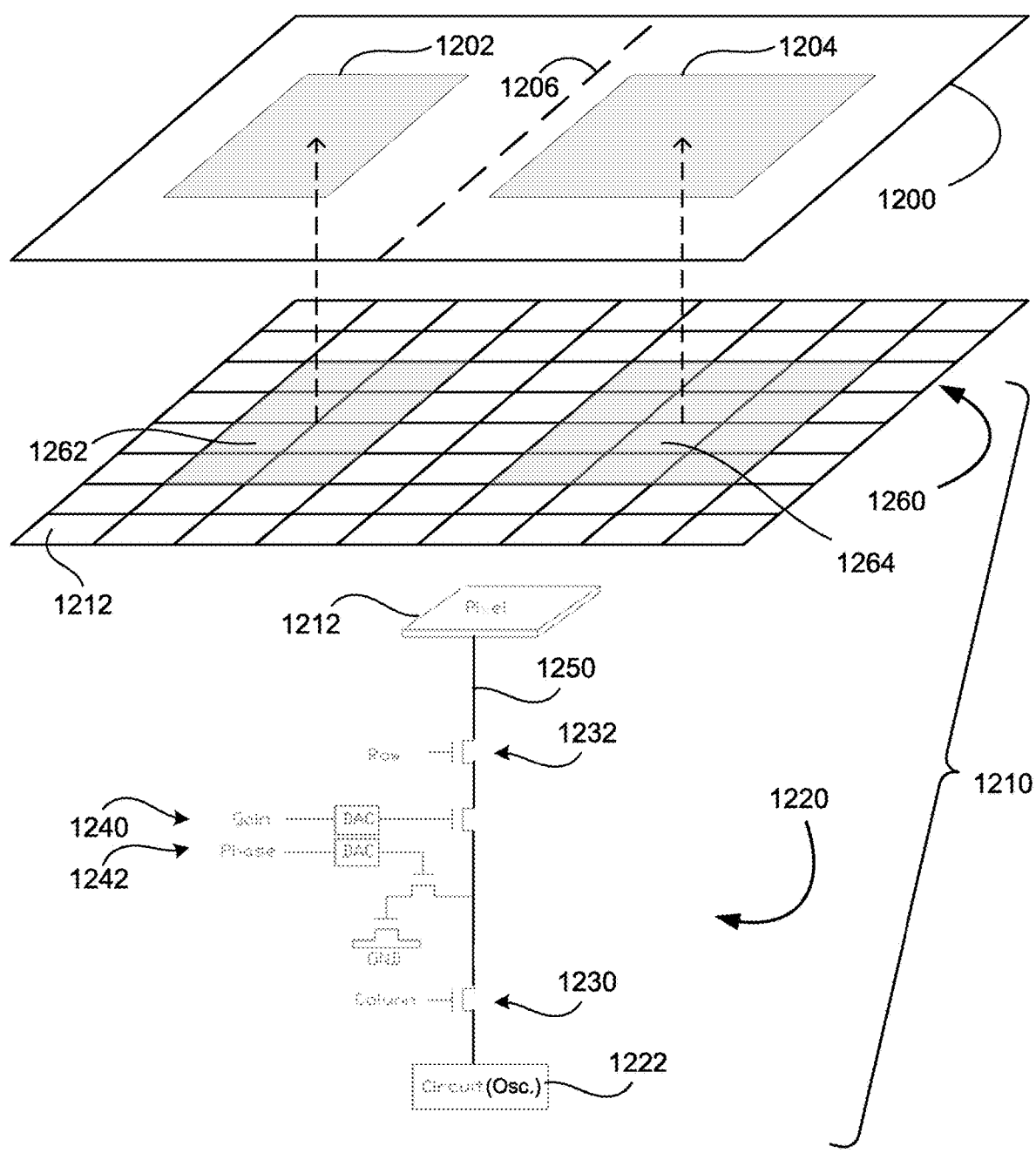
FIG. 12 is an illustration of a pixel-projection composite resonator system with intrinsic mode control, according to an embodiment of the present disclosure.

FIG. 12 is an illustration of a pixel-projection composite resonator system with intrinsic mode control, according to an embodiment of the present disclosure. The pixel-projection system includes a crystal 1200 with no physical electrodes affixed to it, and a projection system 1210. In a preferred embodiment, the projection system 1210 is a semiconductor device configured with a switching circuit 1220 (discussed below) and a top metal layer 1260 which serves as a projection surface for projecting pixels to the crystal 1200. An identical projection system 1210 may also be located above the crystal 1200, in the same manner as described with respect to FIGS. 11A-11C.

The projection system 1210 includes a grid of pixels 1212, shown both in the top metal layer 1260 and (one) at the top of the switching circuit 1220 below. The pixel-projection composite resonator system is connected to an oscillator circuit 1222, whereby the resonator system provides the desired resonant amplification. A signal from the oscillator circuit 1222 is coupled to the pixel 1212 by way of a column control switch 1230 and a row control switch 1232. The switches 1230 and 1232 are preferably field effect transistor (FET) switches in the semiconductor device, and control the particular pixel 1212 which is projected by way of row and column selection.

An optional gain control branch 1240 enables gain control for each individual pixel's projection, and an optional phase control branch 1242 enables phase control for each individual pixel's projection. The gain control branch 1240 and the phase control branch 1242 may employ any suitable design, such as taking a digital gain/phase command from a microprocessor, converting the digital command to an analog signal through a digital to analog converter (DAC), and coupling the analog signal into a pixel control line 1250. Gain control and phase control may be pre-established and remain static throughout the usage of the resonator system (for example, by using gain control to taper a stronger signal toward the center of the projected electrodes in order to achieve the desired resonator response), or gain and phase control may be dynamically adapted by a microprocessor or other device (ASIC, etc.) during resonator system usage based on external circuit conditions, environmental conditions, etc.

It is to be understood that the projection system 1210 both sends signals to the pixels 1212 and receives signals back from the pixels 1212. The sent signals are the projection signals to the crystal 1200, while the received signals are the result of the piezoelectric effect from the vibration of the crystal 1200 and are used to create the desired resonator response. In order to both send and receive signals on the line 1250 to the pixels, a multiplexing approach can be used in the switching circuit 1220, where diodes, switches and/or amplifiers are used to selectively send the signal to the pixel 1212 or receive the signal from the pixel 1212.

The projection system 1210 ultimately projects a signal from some of the pixels on the top metal layer 1260. Shown toward the center of FIG. 12 are a first pixel area 1262 (shaded pixels) which projects a (virtual) projected electrode 1202 on the crystal 1200, and a second pixel area 1264 which projects a (virtual) projected electrode 1204 on the crystal 1200. Because the projected electrodes 1202 and 1204 are asymmetric in size, shape and/or placement with respect to a crystal centerline 1206, the responses of the projected electrodes 1202 and 1204 will be different, the signals received back by the projecting electrodes (the areas 1262 and 1264) will also be different, and this difference can be used advantageously to create a composite resonator response with intrinsic mode control.

Certain types of resonators require electrodes on only one side of the crystal. Others require electrodes on both sides. Accordingly, a second semiconductor supporting and controlling pixels across a gap (that is, another projection system 1210 above the crystal 1200) is included within the scope of the present disclosure, for projecting a second independent image or images on the opposite side from the first. The resonator material (the crystal 1200) between the semiconductor materials can be completely free of all metallization (physical electrodes), or it may have metallization. The pixel based electrode operating across the gap can project an image larger, smaller or the same size as any metallization on the resonator, as shown previously in FIGS. 11A-11C. The signals transmitted and received can be single tone or more than one tone.

Another embodiment of the pixel based electrode across a gap would include a separation of the pixels from the semiconductor device, but letting them remain controlled by the semiconductor device. This allows a trade-off between the cost of the IC with increased area to support the pixels directly versus the added complexity to form the pixels on a lower cost dielectric or semiconductor material and interconnecting the IC to the pixels. An example and advantage of this embodiment is that it would allow the pieces in closest proximity to the resonator material to potentially be the same material as the resonator material or a better match with respect to coefficient of expansion with temperature than certain semiconductor materials. Though interconnect complexity will tend to limit high pixel count, the separation technique has potential where one IC controls pixels on both sides.

Each pixel at minimum can be independently controlled with respect to on and off. In addition, each can have its own amplifier for controlling the magnitude of the signal(s) received or transmitted by the pixel. Each can have its own phase shifter for controlling the phase, as discussed above. It is also possible to aggregate the combined effect of all or some portion of the enabled pixels without amplifying or phase shifting or post amplifying and phase shifting for further processing. In this way, wide latitude is afforded to the designer for "drawing" electrodes of various shapes and combinations and "projecting" them onto the resonator material. Pixels deleterious to mode control, for example spurious mode control, are left "off".

The pixels 1212 shown in FIG. 12 are square or rectangular shape. However, other pixel shapes and patterns may be employed as suitable and advantageous. These shapes include, but are not limited to, shapes which will tessellate (squares, equilateral triangles and hexagons), and patterns such as a herringbone pattern of rectangles or an alternating pattern of right triangles. Each of the pixels 1212 is electrically isolated from its neighbor by a strip of insulation or dielectric material, so that each of the pixels 1212 can independently project an EM signal. Also, the metal layer 1260 is, in one embodiment, a top layer of the projection system semiconductor device, but pixels may also be projected from lower layers of the semiconductor device, as discussed further below.

All of the techniques discussed previously for creating asymmetric conditions in the crystal and/or the resonators are applicable to the pixel-projection composite resonator system of FIG. 12. This includes, but is not limited to, different areas of the resonator electrodes 1202 and 1204, asymmetric placement of the electrodes 1202 and 1204 with respect to the centerline 1206, different projection gains or phases to the electrodes 1202 and 1204, asymmetric crystal mounting, variable crystal thickness, and combination of virtual (pixel projection) and physical (metal layer) electrodes. Any one or more of these asymmetric properties can be designed to achieve the difference in resonator signals which can then be combined to provide the desired intrinsic mode control. Two mechanically antiparallel resonators would have advanced trimming options for reducing acceleration sensitivity vector, which will be discussed further below. Other combinations will occur to those skilled in the art.

Also known in the art is a resonator design in which a piezoelectric material whose frequency is primarily determined by its thickness is produced in the shape of a wedge. By adjusting which portion of the crystal is used, a resonator device can be created with a tuning range larger than what is possible by electronic tuning using combinations of varactors, inductors and capacitors for "pulling" a resonator's frequency. Prior art disclosures describe using a wedge-shaped crystal with a mechanical roller determining the active portion of the crystal. However, improvements in the use of wedge-shaped or tapered crystals are possible, and are discussed below.

A wedge shape piezoelectric material may advantageously be used with electronically controlled pixels as previously described to "project" an electrode onto the wedge shape resonator by way of coupling to the resonator material across a gap. In this approach, as discussed above with respect to FIG. 12, the pixels form a projected electrode and there is no contact with the crystal. The pixels may be configured in any arbitrary shape within the resolution of the pixel array. Pixels which prove to induce spurious modes can be identified and turned "off". Two resonators electrically in series or in parallel can be used to further suppress residual spurious modes relative to the target mode.

Figure 13A:
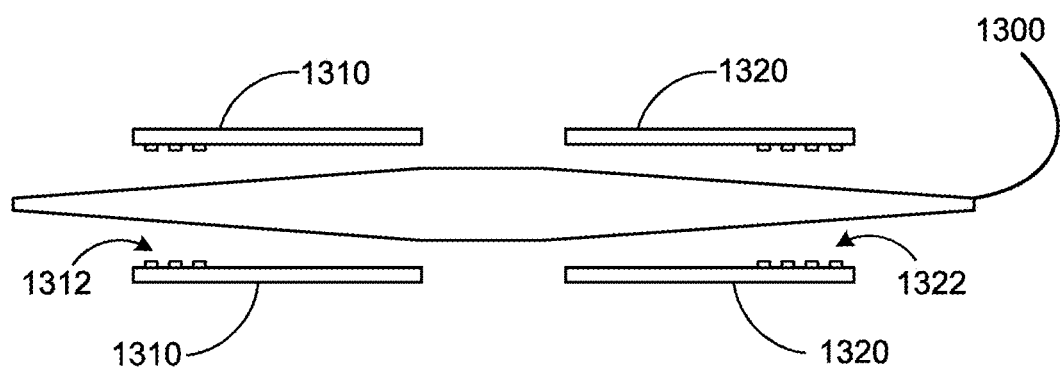
FIGS. 13A-13D are side view illustrations of dual wedge shaped or tapered crystals for use with a pixel-projection electrode system, according to embodiments of the present disclosure.

FIG. 13A is a side view illustration of a dual wedge shaped crystal 1300 with a pixel-projection electrode system, according to an embodiment of the present disclosure. A pixel-projection electrode system 1310 is provided on the left side of the crystal 1300. The pixel-projection electrode system 1310 is shown including projecting elements above and below the crystal 1300. The pixel-projection electrode system 1310 includes an array of pixels 1312 as discussed previously. The pixels 1312 are selectively controlled to project an electrode area onto the surface of the crystal 1300, and to pick up electromagnetic signals produced by the crystal 1300 due to its piezoelectric effect and its resonant vibration.

A pixel-projection electrode system 1320 having pixels 1322 is provided on the right side of the crystal 1300. The pixels 1322 project an electrode area onto the crystal 1300 which is preferably different than the projected electrode from the pixels 1312. The actual hardware of the projection systems 1310 and 1320 may be identical, but the programmed pixel projection would be different from one side to the other, in order to achieve different resonator signals combinable to achieve the desired mode control.

As mentioned above, pixels can be projected on both sides of the wedge shaped crystal 1300, or on only one side. In the case of one side, there can be metallization on the opposite side of the crystal 1300, or conductive material on a surface across a gap, combinations of these and also the option of neither.

One method for creating wedge shaped resonators is by immersing the crystal in etchant and withdrawing at constant rate. Another, less precise way to accomplish dual wedge shape crystals with individual processing is by beveling. In this method, the shape is rounder and also rounder in the width direction for which there is no independent control. Where the performance is adequate, a dual wedge crystal created by beveling has the advantage of low cost and large existing capacity by many vendors. Other tapered shapes besides wedges can also be created.

Figure 13B:
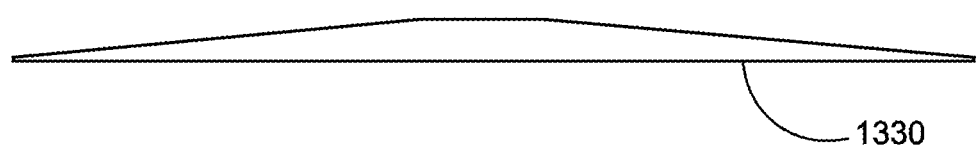
Figure 13C:

FIGS. 13B and 13C are side view illustrations of other crystal shapes which may be used with pixel-projection of electrodes for creating a composite resonator device with intrinsic mode control. A crystal 1330 has a dual-incline shape which is known to produce resonance behavior which is advantageous for some applications. A crystal 1340 includes a dual-incline shape crystal such as the crystal 1330 on top of a secondary substrate 1350, resulting in a composite crystal shape with different resonant properties than either of the component parts.

Figure 13D:
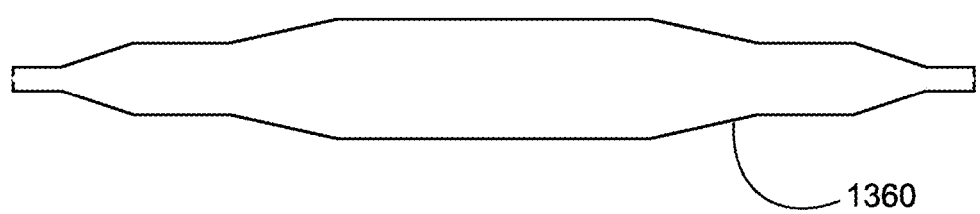

A crystal 1360 with multiple wedges and plateaus is also possible, as shown in FIG. 13D. The multiple plateau crystal 1360 again exhibits different resonance behaviors than any of the other crystal shapes shown, and offers further configurability via electrode projection onto any of the tapered surfaces or any of the plateaus. In FIGS. 13B-13D, only the piezoelectric element or crystal is shown, for the sake of simplicity. In each of these figures, the pixel-projection systems 1310 and 1320 are used to project virtual electrodes onto one or both surfaces of the crystal, as discussed previously. It is to be understood that the cross-sectional shape of the crystal, as shown in FIGS. 13A-13D, can be used as a design parameter for achieving the desired resonant response. These cross-sectional shapes can be used in combination with the many other design parameters discussed above—such as resonator areas and placement, crystal mounting, strength of resonator projection signal, etc.— to achieve a composite resonator device with the desired intrinsic mode control.

In the crystal 1360 shown in FIG. 13D, the plateaus are readily created by stopping the crystal withdrawal from the etchant periodically and for a pre-determined length of time as part of the withdrawal process. For example, an etchant of ammonium bifluoride or hydrofluoric acid may be used in the case of quartz resonators, and for zinc oxide resonators ferric chloride may be employed. Other combinations of etchants may be used to create crystal or other resonators having a cross-sectional shape included within the scope of this disclosure.

In the earlier discussion of FIGS. 6 and 7, it was disclosed that a composite resonator device according to the present disclosure could either be packaged as a passive device (a resonator—as in FIGS. 6A-6B) or as an active device (an actively tuned resonator or an oscillator—as in FIGS.

7A-7B). Following is an explanation of how such a composite resonator device can be one-time programmed or configured, and thenceforth be used as a passive resonator.

Figure 14:
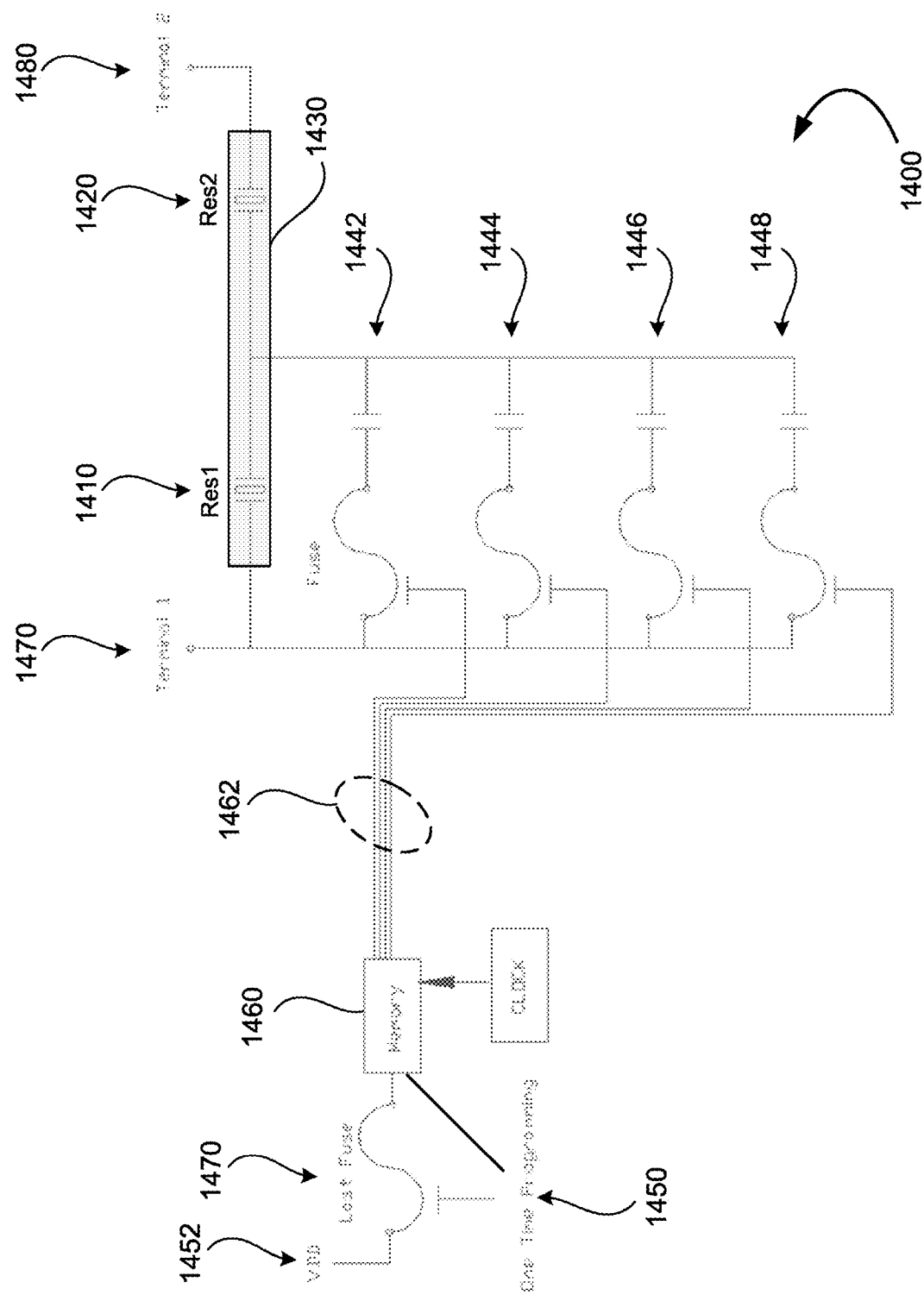
FIG. 14 is a schematic diagram illustration of a composite resonator device with one-time programming capability, according to an embodiment of the present disclosure.

FIG. 14 is a schematic diagram illustration of a composite resonator device 1400 with one-time programming, according to an embodiment of the present disclosure. A first resonator 1410 and a second resonator 1420 reside on a single monolithic crystal 1430, in the manner discussed relative to FIG. 4 and several times since. It has been discussed earlier that the connectivity of the resonators 1410 and 1420, along with certain tuning adjustments, could be configured to suit a particular application. Such connectivity and tuning can be accomplished by using power and program signals (from the mounting pads 570A and 570C of FIG. 6A) to selectively blow a certain set of fuses, leaving other fuses intact to define the connectivity and configuration of the passive composite resonator device.

In FIG. 14, the variable configuration is depicted by four branches 1442, 1444, 1446 and 1448. Each branch includes a capacitor (of which all four may have different capacitances, or some of them may be the same), and a fuse. If, for example, the desired end configuration is for only the capacitor in the branch 1442 to remain in parallel with the resonator 1410, then the fuses in the branches 1444, 1446 and 1448 will be blown (open circuited) during the one-time programming. Two or more of the capacitors in the branches 1442-1448 may remain in parallel in the final circuit by blowing less than three of the fuses.

It is recalled from FIG. 6A that, in the programming configuration (before use of the resonator device), the pad 570C receives a programming signal and the pad 570A receives a power signal (such as a drain voltage $V_{OO}$). These are shown on lines 1450 and 1452 in FIG. 14. The programming and power are provided to a memory module 1460 (all of this would be contained in the programmable die 550 of FIG. 5), which provides a current flow on selected ones of lines 1462, where the current flow is sufficient to blow the fuse to which it is provided. After blowing the selected ones of the fuses on the branches 1442-1448, power and ground connections can be used to blow a last fuse 1470, thereby permanently disabling the power connection 1452 and turning the composite resonator device 1400 into a passive device having two resonator terminals 1470 and 1480 according to industry standard, and shown as the mounting pads 570B and 570C of FIG. 6B.

It is to be understood that the configurability of the composite resonator device 1400 in preparation for its use as a passive device can be extended to more than just the parallel capacitors shown in FIG. 14. The two resonators 1410 and 1420 can be connected electrically in series or parallel, and any passive component (resistor, capacitor, inductor) can be placed in the circuit, using the techniques disclosed in FIG. 14. This connectivity and tuning enables the different resonator responses of the resonators 1410 and 1420 to be combined in the appropriate manner to achieve the desired mode control. For active resonator devices (oscillators or actively tuned resonators), the programmable die 550 includes active transistor-based components, and the device retains a power connection when in usage, as shown in FIGS. 7A-7B. Other embodiments for programming and other types of memory, including latches and the like for temporary or soft programming, the capability of re-programming and the like, programming uploaded from external device, and programming occurring wirelessly are within the scope of the present disclosure.

Using the pixel projection of electrodes discussed above, an active wide band voltage controlled crystal oscillator and wide band voltage controlled oscillators with other types of resonators could be constructed. For oscillators and specialty oscillators such as voltage controlled crystal oscillators (VCXO), the constraint of no dedicated power supply pin ($V_{DD}$) is lifted. With a power supply available, the pixels do not have to be fixed, passive, and fused in one state for all time. Rather, they may be dynamically reprogrammed according to some stimulus whether internally sensed, or externally provided. For the VCXO, an external control voltage can provide a stimulus for moving a thin rectangular electrode projected by the pixels up or down the wedge shaped resonator. The pixels on the leading edge of the rectangular electrode turn on, while the pixels at the trailing edge turn off. Pixels between the edges provide continuity and smoothing during transitions. Pixels which cause or enhance spurious modes are kept off. The use of pixels and the wedge do not preclude the use of electronic trim. This also can be used advantageously for smoothing, etc. In this way, the modulation bandwidth of the VCXO is at least on parity with the prior art and potentially greater.

Because crystal resonance frequency is known to vary with temperature, movement of the electrode-projection pixels up or down the wedge in response to temperature changes may be advantageous. Several types of temperature sensors, including self-sensing by way of dual mode could be used to provide a signal which is used to control pixel location on the crystal wedge. A TCXO, temperature compensated crystal oscillator, or temperature compensated oscillator with other types of resonators, would conventionally use such a sensor to synthesize a voltage which applied to a voltage variable capacitor "pulls" the resonator back to its target frequency. However the pull range of some resonators and some modes do not have sufficient pulling range by these means to cover a wide operating temperature range. Pixel and wedge based frequency adjustment is independent of this "pulling" constraint, and represents another wide degree of latitude that can be used independent of or in conjunction with conventional methods for temperature compensation.

Temperature compensation using pixel projection on a wedge-shaped crystal offers other advantages as well. For example, a less expensive crystal cut may be used for a particular application, where the required frequency vs. temperature characteristics are achieved with active location of pixel projection. In another example, a crystal such as a BT cut which offers improved quality factor compared to AT cut, but does not have tight enough frequency vs. temperature characteristics for most applications, could be used with active location of pixel projection to improve both the acceleration sensitivity and temperature characteristics.

The foregoing discussion has focused mainly on the benefits of a monolithic piezoelectric element (crystal) having two or more resonators—with the benefits specifically related to mode control features such as suppressed spurious modes, reduced insertion loss/spurious loss ratio and suppression of lower main modes to feature a single higher overtone much such as third, fifth, etc. There is another attribute of crystal resonators which can also benefit from the composite monolithic resonator design discussed above—that attribute being the acceleration sensitivity vector.

The acceleration sensitivity of quartz resonators arises from the stresses caused by the mass of the resonator blank (crystal) reacting against the resonator mounting structure during acceleration. A common method of representing the acceleration sensitivity is by the acceleration sensitivity vector gamma (Γ), made up of the frequency shifts observed for unit acceleration in three orthogonal axes. The acceleration-induced frequency response of a resonator is then the dot product of the Γ vector and the applied acceleration.

There are generally two classes of methods to minimize the effects of acceleration forces on crystal resonators. The first class is known as active compensation. In active compensation, an acceleration sensor is used to detect the characteristics of applied forces and a signal is then processed and fed back to the oscillator circuit to adjust the frequency by an equal magnitude but in the opposite direction from the acceleration induced shifts. This method can be effective over certain vibration frequency ranges, but it requires a relatively complex circuit, can be very expensive to implement, and is only possible for oscillators (not resonators, filters or sensors).

The second class is referred to as passive compensation. Passive methods do not attempt to sense the applied acceleration. Generally, in passive methods, the crystal resonator or resonators are constructed using special methods that render them less sensitive to acceleration forces. Passive methods can be effective, but they generally require an involved and difficult fabrication process to produce the required crystal or composite crystal assembly, and may cause other problems such as increased temperature sensitivity. For example, in one prior art technique, a monolithic composite resonator was constructed for the purpose of Γ control. However, the base quartz material in this case has the prerequisite of displaying simultaneously a right hand and left hand lattice orientation. Such materials are not readily available and would have to be grown special, from non-standard seed material, using non-standard practice.

Another prior art technique for passive Γ control involves using two essentially identical crystals and mounting the crystals in a resonator device so that they are oppositely oriented (acceleration vector is in opposite directions relative to the crystal structure). Still other prior art discloses methods for spurious mode control, but these methods involve combining resonators in a way that increases acceleration sensitivity. None of the prior art techniques disclose composite monolithic resonator devices with both intrinsic mode control and passive r control.

Figure 15:
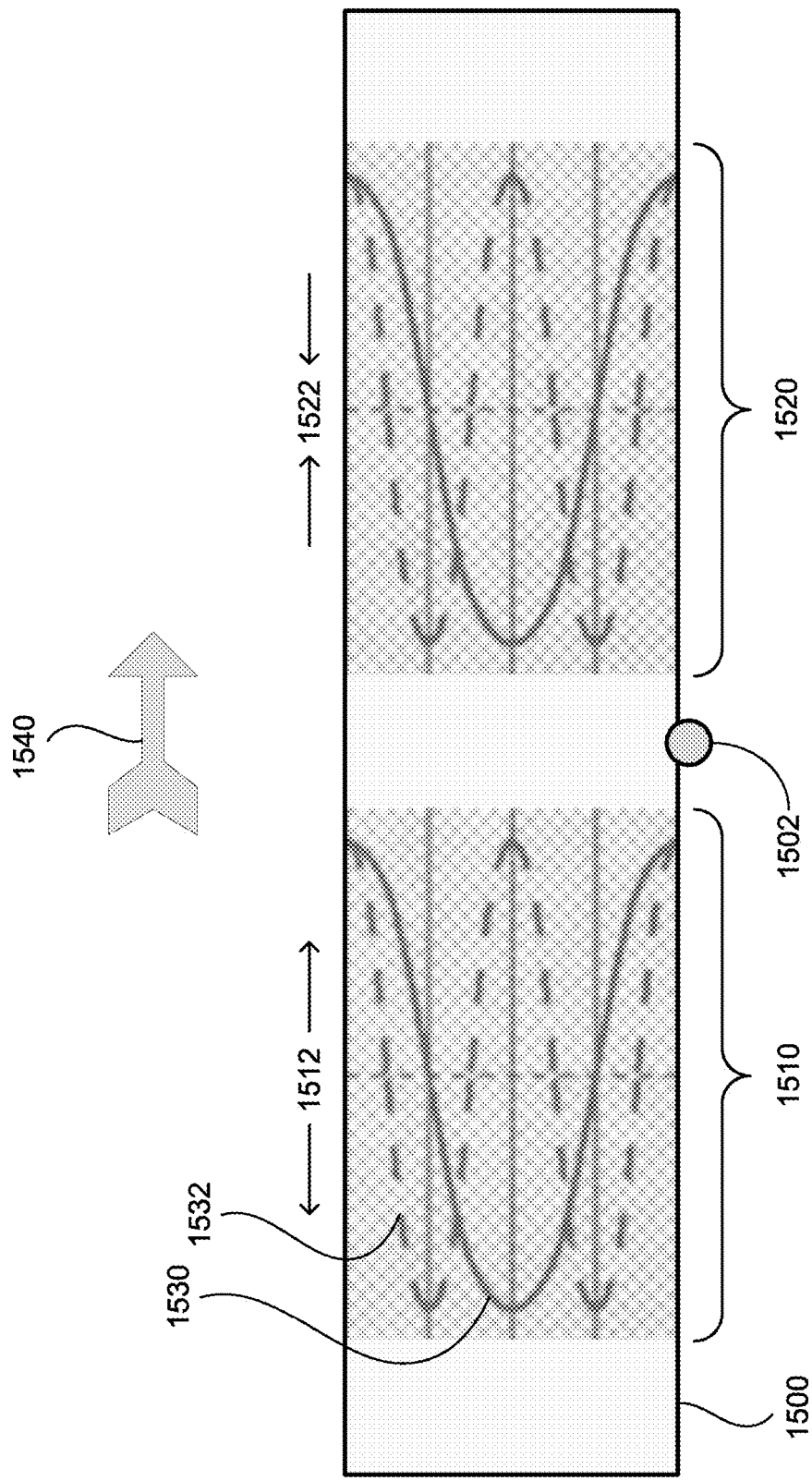
FIG. 15 is a cross-sectional side view illustration of a composite resonator device with intrinsic mode control and passive acceleration sensitivity control, according to an embodiment of the present disclosure.

FIG. 15 is a cross-sectional side view illustration of a composite resonator device with intrinsic mode control and passive acceleration sensitivity control, according to an embodiment of the present disclosure. A monolithic crystal 1500 includes two resonators configured asymmetrically in some way, as discussed several times previously. A resonator 1510 is located on a left side of a mounting point 1502, and a resonator 1520 is located on a right side of the mounting point 1502. The mounting "point" 1502 is actually two mounting points forming a line perpendicular to the sheet of FIG. 15, bisecting the crystal 1500 with the resonators 1510 and 1520 on opposite sides. The resonators 1510 and 1520 include electrodes (not shown) on the top and/or bottom surfaces of the crystal 1500, as discussed previously. The electrodes in the resonators 1510 and 1520 may be physical (metal) or projected, or a combination of physical and projected, according to the previous discussion.

In each of the resonators 1510 and 1520, a fundamental mode of vibration 1530 and a third overtone mode 1532 are shown. These modes are thickness shear modes of vibration. Because the resonators 1510 and 1520 are both on the single crystal 1500, there is no possibility to mount the two resonators with opposite crystal lattice orientations relative to each other as in some prior art disclosures using two discrete crystals. Also, although it has been suggested in the art that a single crystal with differing lattice orientation on the two halves can be used to control Γ, the reality is that such a crystal is not commercially available. However, a deliberate choice of mounting configuration can provide a composite resonator device on a single crystal which does provide passive partial Γ cancellation.

When a lateral acceleration vector 1540 is applied to the device package, the mounting point 1502 "pulls" the resonator 1510 and causes the resonator 1510 to be put in tension as shown by arrows 1512, while the resonator 1520 is put in compression ("pushed") as shown by arrows 1522. Thus, the acceleration sensitivity-based frequency shift experienced by the resonator 1510 offsets the acceleration sensitivity-based frequency shift experienced by the resonator 1520. Regardless of the acceleration sensitivity vector Γ of the crystal 1500, this anti-parallel mechanical arrangement of the resonators 1510 and 1520 on a single crystal provides a level of intrinsic passive Γ cancellation. This intrinsic passive partial Γ cancellation is achievable in all three planes through arrangement of the electrical connections and mechanical connections. All of the other mode control features of the composite monolithic resonator devices discussed previously—such as asymmetric resonator areas and placement, crystal mounting, strength of resonator projection signal, etc.—are obtainable while simultaneously achieving reduction in acceleration sensitivity-induced frequency shift. It is also noteworthy that asymmetric resonator properties can be used to bias the acceleration sensitivity so that Γ cancellation is only needed on one side (one of the resonators 1510 or 1520), and only in the capacitive direction (easier, smaller and cheaper to implement).

Other types of resonators exist—besides those built on a quartz crystal—which can also benefit from the disclosed techniques for intrinsic mode control and passive Γ cancellation. Following is a discussion of how these techniques can be applied to thin-film bulk acoustic resonator (FBAR) devices and high-overtone bulk acoustic resonator (HBAR) devices.

Figure 16:
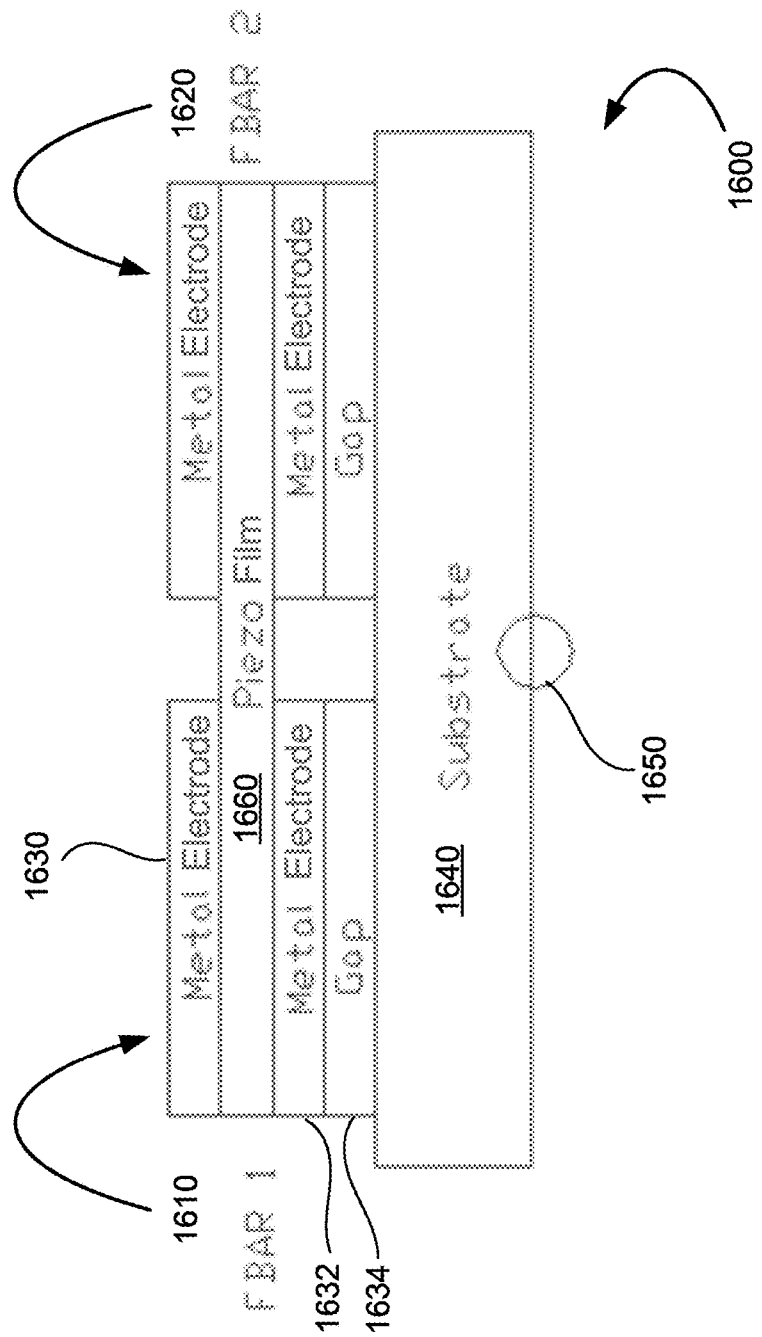
FIG. 16 is a cross-sectional side view illustration of a composite thin-film bulk acoustic resonator (FBAR) device with intrinsic mode control and passive acceleration sensitivity control, according to an embodiment of the present disclosure.

FIG. 16 is a cross-sectional side view illustration of a composite thin-film bulk acoustic resonator (FBAR) device 1600 with intrinsic mode control and passive acceleration sensitivity control, according to an embodiment of the present disclosure. The composite FBAR device 1600 includes a first FBAR 1610 and a second FBAR 1620. As is known in the art, FBAR devices such as the device 1600 are thin-film devices which use a piezoelectric film 1660 made of a material such as aluminum nitride or zinc oxide, rather than a quartz crystal.

The FBAR 1610 includes a top electrode 1630 applied to an upper surface of the piezoelectric film 1660 and a bottom electrode 1632 arranged for the lower surface of the piezoelectric film 1660. The electrodes 1630 and 1632 are typically made of a metal such as molybdenum, gold, aluminum or cobalt, although many other metals and materials have been used in FBAR electrodes. A gap 1634 separates the bottom electrode 1632 from a substrate 1640, which is typically made of silicon, quartz, etc., and can include the shapes shown in FIG. 13. The gap 1634 may be occupied by air, nitrogen, some other gas or a vacuum. Bridging structure, not visible in the cross-sectional view of FIG. 16, supports the electrode 1610 over the substrate 1640.

The FBAR 1620 is constructed in the same manner as the FBAR 1610, however, by making the electrodes different in some way (area, thickness, etc.) or asymmetric in placement about a piezoelectric film centerline, the responses of the FBARs 1610 and 1620 will be different and therefore combinable to achieve intrinsic mode control—that is, enhancement of a desired mode and/or suppression of an undesired mode. Furthermore, by arranging the FBARs 1610 and 1620 on opposite sides of a pair of mounting pads 1650 (one of which is visible in the side view of FIG. 16), the composite FBAR device 1600 provides a level of intrinsic passive $\Gamma$ cancellation as describe above with respect to FIG. 15.

HBAR devices are constructed with a thin film of a piezoelectric material sandwiched between two electrodes. The lower electrode has no gap to the substrate which may be of the same material as the film. HBAR devices differ from FBAR devices in construction, wave propagation principles and output properties (modes available, Q factor, etc.). However, HBAR devices can also be arranged with an asymmetric pair of resonator electrodes, as discussed above with respect to the FBAR device 1600, to obtain a composite response which achieves intrinsic mode control. In addition to this intrinsic improvement in mode control and simultaneous $\Gamma$ cancellation, monolithic FBAR and HBAR devices as disclosed herein can include trim capability, both by discrete passive devices and/or by integrated circuits with programmability. The electrodes of both the FBAR and HBAR can be metal, virtual projections from pixels, or combinations thereof.

Resonator devices are known in which three resonators are deposited on quartz. Each resonator has a progressively higher frequency than the preceding one and the middle one has a target of the geometric mean frequency between the outer two. Coupling from the outer to the middle electrode can be accomplished by adjusting the distance between them. The result is that the middle electrode will have both electrical and acoustic energy at the beat frequency, which is the difference frequency between the outer two resonators. In this way, a high Q factor, low frequency signal can be produced. In such a triple-resonator design, the beat frequency (difference frequency produced at/by the middle resonator) has improved frequency versus temperature performance compared to traditional resonators. However, in the prior art disclosures, no provision is made for achieving spurious mode control or for reducing $\Gamma$. In fact, the figures and disclosure of the prior art suggest that $\Gamma$ is uncontrolled, random and additive for each of the three resonators.

Figure 17:
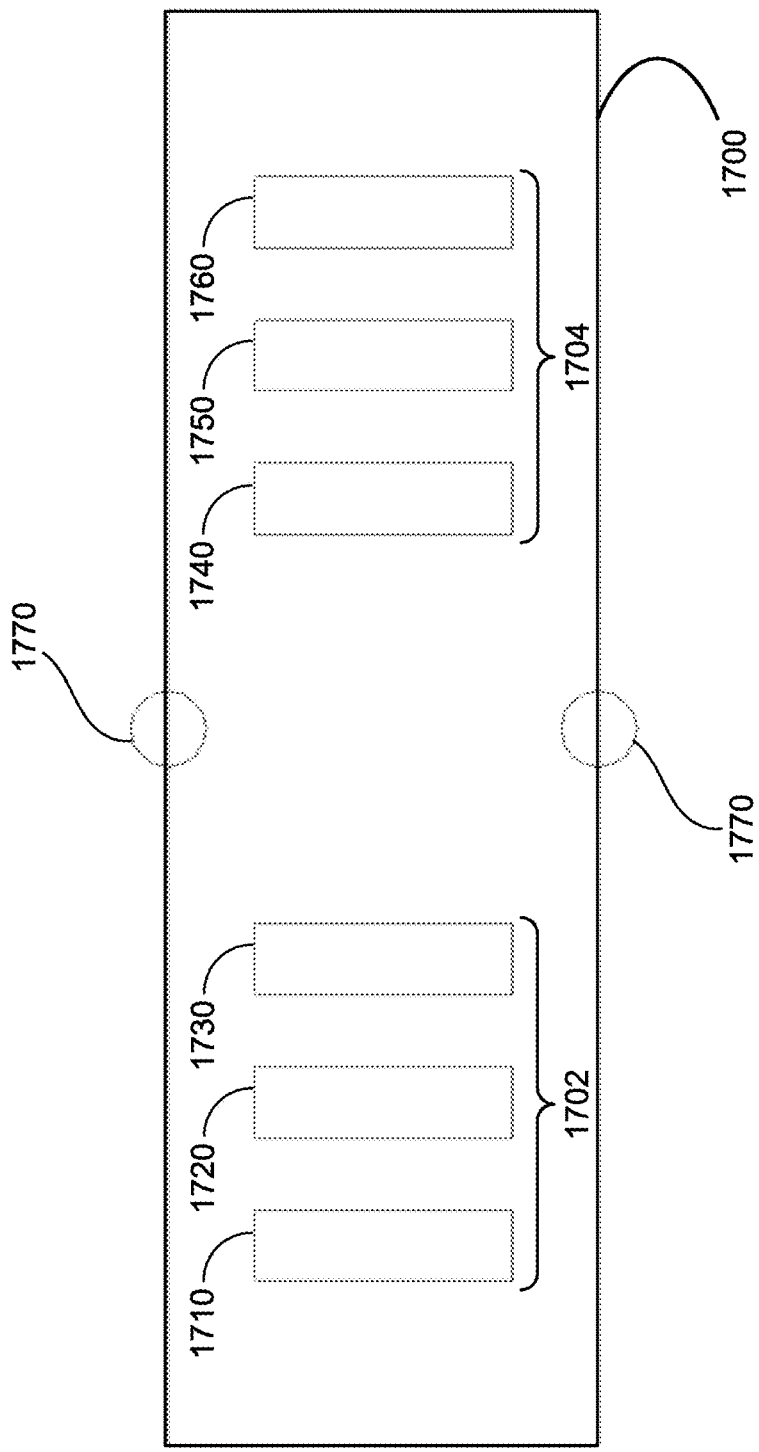
FIG. 17 is a top view illustration of a monolithic composite resonator device configured for beat frequency resonance using a resonator triplet, with intrinsic mode control and passive acceleration sensitivity control, according to an embodiment of the present disclosure.

FIG. 17 is a top view illustration of a composite resonator device configured for beat frequency resonance using a resonator triplet, with intrinsic mode control and passive acceleration sensitivity control, according to an embodiment of the present disclosure. A monolithic crystal 1700 includes two resonator triplets configured asymmetrically in some way, as discussed several times previously, in order to achieve mode control via the differing signals. A resonator triplet 1702 includes resonators 1710, 1720 and 1730, while a resonator triplet 1704 includes resonators 1740, 1750 and 1760. The resonator triplet 1702 is located on a left side of a pair of mounting points 1770, and the resonator triplet 1704 is located on a right side of the mounting points 1770. The mounting points 1770 may be offset from a centerline of the crystal 1700, and/or the resonator triplets 1702 and 1704 may be asymmetrically placed or sized, in order to achieve the difference in signals used to achieve the desired mode control.

The resonator triplets 1702 and 1704 are configured to provide a beat frequency signal from the center resonator electrode of each triplet—that is, from the resonators 1720 and 1750. As described above, the beat frequency resonance signal from the resonator triplets provides a high quality, low frequency signal which has improved frequency vs. temperature characteristics compared to a traditional low frequency resonator. Furthermore, by providing a beat frequency signal from two separate resonator triplets, with the two triplets being different or asymmetric in some way (area, electrode type, placement, mounting, etc.), intrinsic mode control can be achieved in the composite resonance signal. In addition, by mounting the crystal 1700 in the mechanically antiparallel manner described above in the discussion of FIG. 15, acceleration sensitivity is reduced by combining the signals from the resonators 1720 and 1750—one of which is in tension and the other of which is in compression for a given acceleration vector.

The electrodes in the resonators 1710-1760 may be physical (metal) or pixel-projected, or a combination of physical and pixel-projected, according to the previous discussion. The crystal 1700 may be flat, or have a tapered cross-sectional shape such as dual wedge or dual incline, as also discussed previously. The many options for crystal shape and electrode type may be combined advantageously with the mechanically antiparallel mounting for $\Gamma$ control and the resonator asymmetry for intrinsic mode control in a triple-resonator beat frequency resonator for low frequency applications.

Resonators and other devices such as delay lines are known in which surface acoustic waves are employed to achieve the desired resonance, delay or other behavior. Surface acoustic waves (SAWs) are sound waves that travel parallel to and along the surface of an elastic material, with their displacement amplitude decaying into the material so that the waves are confined to within roughly one wavelength of the surface. In a piezoelectric material such as gallium arsenide or quartz, the mechanical deformation associated with the SAW produces electric fields. The electric fields do not significantly affect the propagation of the mechanical wave, so the result is a variation in electrostatic potential that travels along with the SAW. Metal or other electrodes can be placed on the surface of the piezoelectric material to detect the electrostatic potential variation around them, while the mechanical SAW propagates largely unaffected.

A SAW device typically uses electrodes configured with an interdigital shape, where "fingers" of a first electrode are interspersed between fingers of a second electrode. Although the benefits of SAW devices in some applications are known, previous provisions for reducing $\Gamma$ in such devices have been limited. In many prior art disclosures, the $\Gamma$ is uncontrolled, random and additive. Furthermore, there has been no previous disclosure of combining pixel-based SAW devices in a composite resonator device in order to achieve intrinsic mode control.

Figure 18:
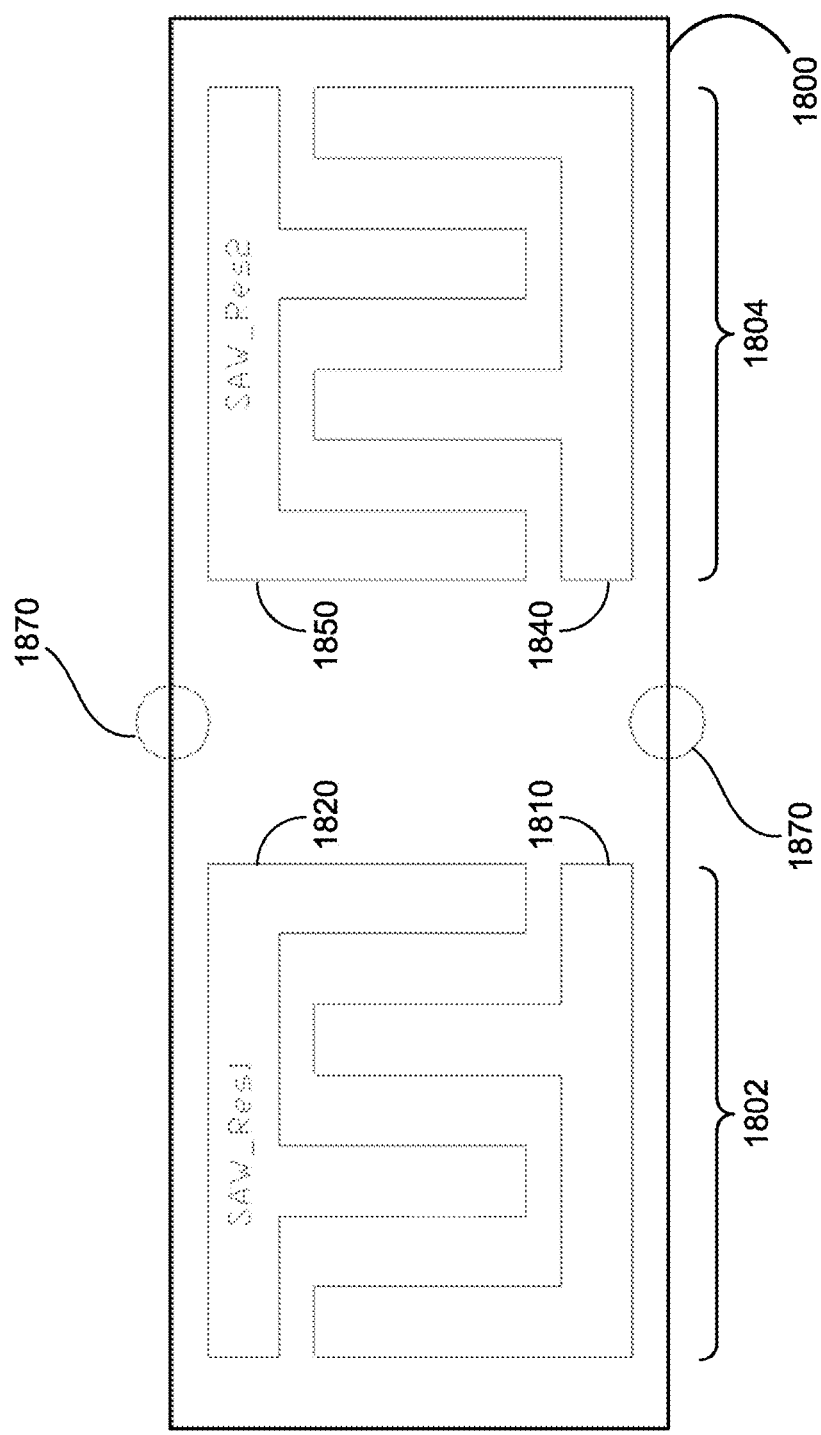
FIG. 18 is a top view illustration of a composite surface acoustic wave resonator device, with intrinsic mode control and acceleration sensitivity control, according to an embodiment of the present disclosure.

FIG. 18 is a top view illustration of a monolithic composite SAW resonator device, with intrinsic mode control and passive acceleration sensitivity control, according to an embodiment of the present disclosure. A monolithic crystal 1800 includes two SAW resonators configured asymmetrically in some way, as discussed several times previously, in order to achieve mode control via the differing signals. A first SAW resonator 1802 includes electrodes 1810 and 1820, while a second SAW resonator 1804 includes electrodes 1840 and 1850. The SAW resonator 1802 is located on a left side of a pair of mounting points 1870, and the SAW resonator 1804 is located on a right side of the mounting points 1870. The mounting points 1870 may be offset from a centerline of the crystal 1800, and/or the resonators 1802 and 1804 may be asymmetrically placed or sized, in order to achieve the difference in signals used to achieve the desired mode control.

The SAW resonators 1802 and 1804 are each configured to provide the desired resonance, delay or other desired behavior, taking advantage of the features of SAW devices. While the electrodes 1810, 1820, 1840 and 1850 in the SAW resonators 1802 and 1804 are illustrated in FIG. 18 as having an "F" shape with two fingers each, they may have any suitable number of fingers in order to achieve the desired response. Furthermore, by providing a SAW-generated signal from two separate resonator couplets, with the resonators 1802 and 1804 being different or asymmetric in some way (area, electrode type, placement, mounting, etc.), intrinsic mode control can be achieved in the composite response. In addition, by mounting the crystal 1800 so that the SAW resonators 1802 and 1804 are arranged in the mechanically antiparallel manner described above in the discussion of FIG. 15, acceleration sensitivity is reduced by combining the signals from the resonators 1802 and 1804—one of which is in tension and the other of which is in compression for a given lateral acceleration vector, as discussed earlier.

The electrodes in the resonators 1802 and 1804 may be physical (metal) or pixel-projected, or a combination of physical and pixel-projected, according to the previous discussion. For example, pixels are easily configured to project any line and space needed for SAW interdigital transducer type electrodes within the resolution limit of the pixel array. Many options for electrode designs may be combined advantageously with the mechanically antiparallel mounting for r control and the resonator asymmetry for intrinsic mode control in a SAW resonator as shown in FIG. 18.

Components based on surface acoustic wave (SAW) and bulk acoustic wave (BAW) technology both employ acoustic waves but in different ways and with different performance levels, especially at higher frequencies. In contrast to SAW devices where acoustic waves travel across the surface of the piezoelectric material, the acoustic waves in a BAW component travel through the piezoelectric material. In addition to traditional BAW devices, the SAW device of FIG. 18 can be combined with a BAW resonator to create an upconverted resonator with mode control and $\Gamma$ control benefits, according to the discussion below.

Figure 19:
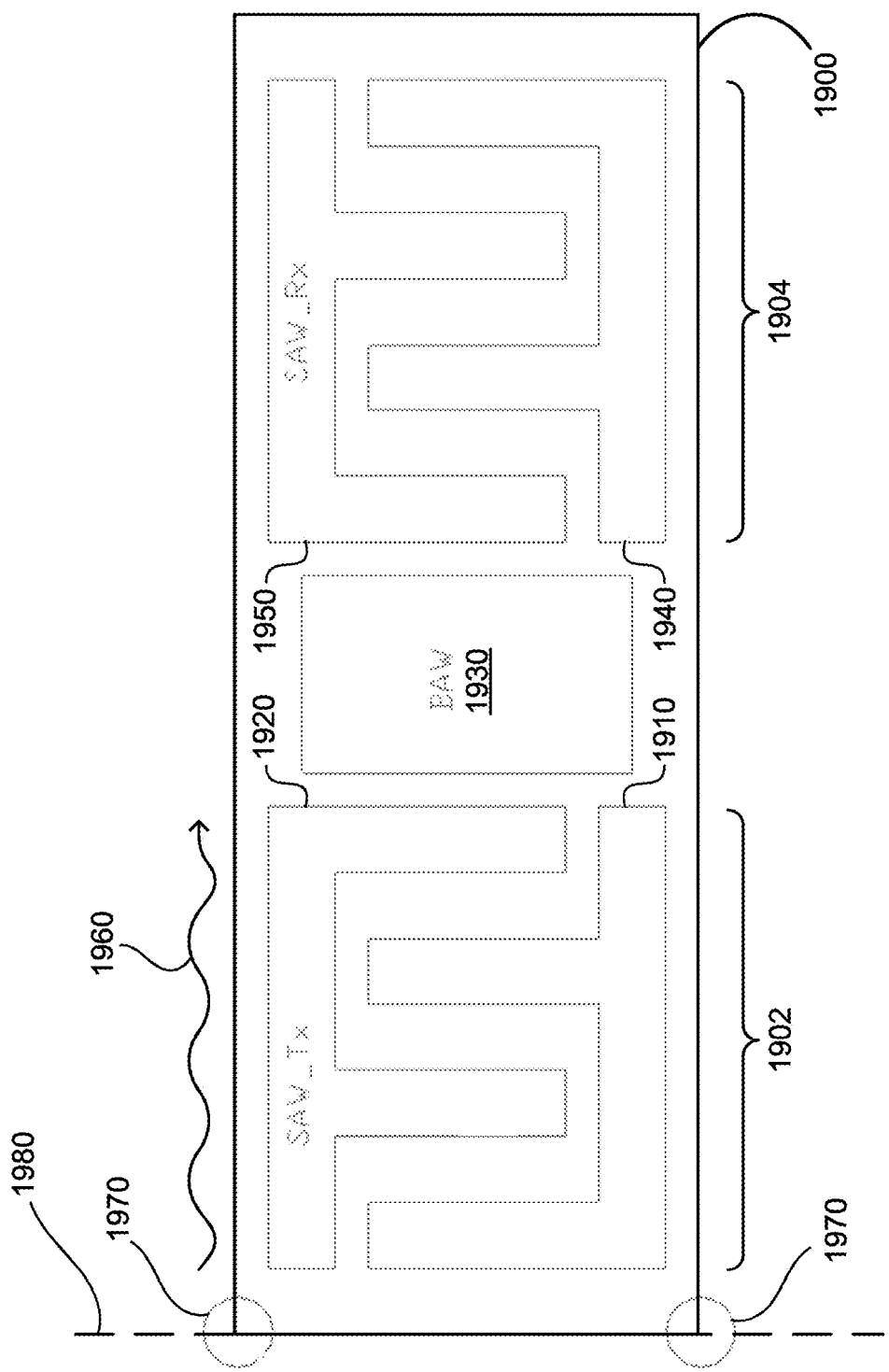
FIG. 19 is a top view illustration of one half of a monolithic composite surface acoustic wave/bulk acoustic wave resonator device, with intrinsic mode control and passive acceleration sensitivity control, according to an embodiment of the present disclosure.

FIG. 19 is a top view illustration of one half of a monolithic composite SAW/BAW resonator device, with intrinsic mode control and passive acceleration sensitivity control, according to an embodiment of the present disclosure. Only the right side half of a monolithic crystal 1900 is shown in FIG. 19. The right side of the crystal 1900 includes a SAW delay line with a BAW resonator in between. A SAW transmitter (Tx) resonator 1902 includes electrodes 1910 and 1920, while a SAW receiver (Rx) resonator 1904 includes electrodes 1940 and 1950. Positioned between the SAW Tx resonator 1902 and the SAW Rx resonator 1904 is a BAW resonator 1930.

A near-identical opposite half (not shown) exists to the left of a pair of mounting points 1970 and a centerline 1980, where the left half is configured asymmetrically from the right half in some way, as discussed several times previously, in order to achieve mode control via the differing signals. For example, the mounting points 1970 may be offset from the centerline 1980, and/or the right-side SAW resonators 1902 and 1904 may be asymmetrically placed or sized relative to their left-side counterparts, in order to achieve the difference in signals used to achieve the desired mode control.

The SAW Tx resonator 1902 launches a SAW to the right as indicated by wavy arrow 1960. When the launched wave hits the BAW resonator 1930, through proper configuration, the BAW resonator 1930 can be tuned to induce a spurious mode that couples to the higher frequency launched by the SAW. That is, the BAW device creates its own strong acceleration force meant to affect the SAW response. In this way, the SAW to BAW coupling results in a frequency upconversion. The upconverted acoustic wave emerges at the SAW Rx resonator 1904 on the right. The signal from the SAW Rx resonator 1904 will retain all of the characteristics of the bulk acoustic wave, i.e. high Q factor, good frequency versus temperature, etc., but exhibit these characteristics at the new upconverted frequency.

In order to ensure that the SAW Tx resonator 1902 only launches a wave to the right (and its counterpart on the left side of the crystal 1900 only launches to the left), a surface discontinuity might be needed along the centerline 1980 of the crystal 1900. Nonconductive epoxy and other absorbing techniques are known in SAW technology for this.

In the resonator device of FIG. 19, there are many ways to create the left-to-right asymmetry needed for intrinsic mode control. In the case of dissimilar electrode areas for example, the interdigital transducer "fingers" could be longer on one side than the other, or there could be a different number of them. This is particularly easy to accomplish using pixel projection electrodes. Dissimilar electrode areas could be used for the SAW resonators 1902/1904 and their counterparts across the mirror line 1980 for example for gamma control, and also dissimilar areas for the BAW resonator 1930 and its counterpart across the mirror line 1980 for example for spurious suppression.

At the same time, the device of FIG. 19 is designed with inherent $\Gamma$ control to discriminate against every other vibration induced by whatever external source might be present. By using the mechanically antiparallel mounting arrangement described previously, the resonators on one side of the crystal 1900 are placed in tension while the resonators on the opposite side of the crystal 1900 are placed in compression for a given acceleration, thereby achieving the inherent reduction in acceleration sensitivity.

It is also possible to combine the embodiments discussed above in a unique device wherein pixels are used to project the shape of the three electrodes of FIG. 17 (for beat frequency resonance) into the open area of the SAW delay line of FIG. 18 or the SAW/BAW device of FIG. 19. The low beat frequency acoustic energy is designed to be within the modulation bandwidth of the SAW delay line oscillator, and/or resonant with respect to the BAW thickness of the delay line. The idea is that a low beat frequency, but high Q factor, "spur" could be coupled to, and upconverted by, the relatively low Q SAW delay line oscillator. Further signal processing (filtering) provides for an acoustic frequency translator with potential power and performance improvement.

It has been shown in prior art disclosures that there exists an optimum position for the electrode to minimize $\Gamma$. That is, the center of the area of the electrode should be centered above the optimum position on the resonator. Using a solid mass-loading electrode (e.g., metal), manufacturing tolerances for aligning these points have the potential for error. There is no easy and effective way to correct for any such error introduced. Referring again to the concept of pixel based electrodes, another advantage is apparent. With pixels, one area is shifted easily with respect to the other to achieve optimal electrode position. Active controls can be used to shift as often as needed.

Figure 20:
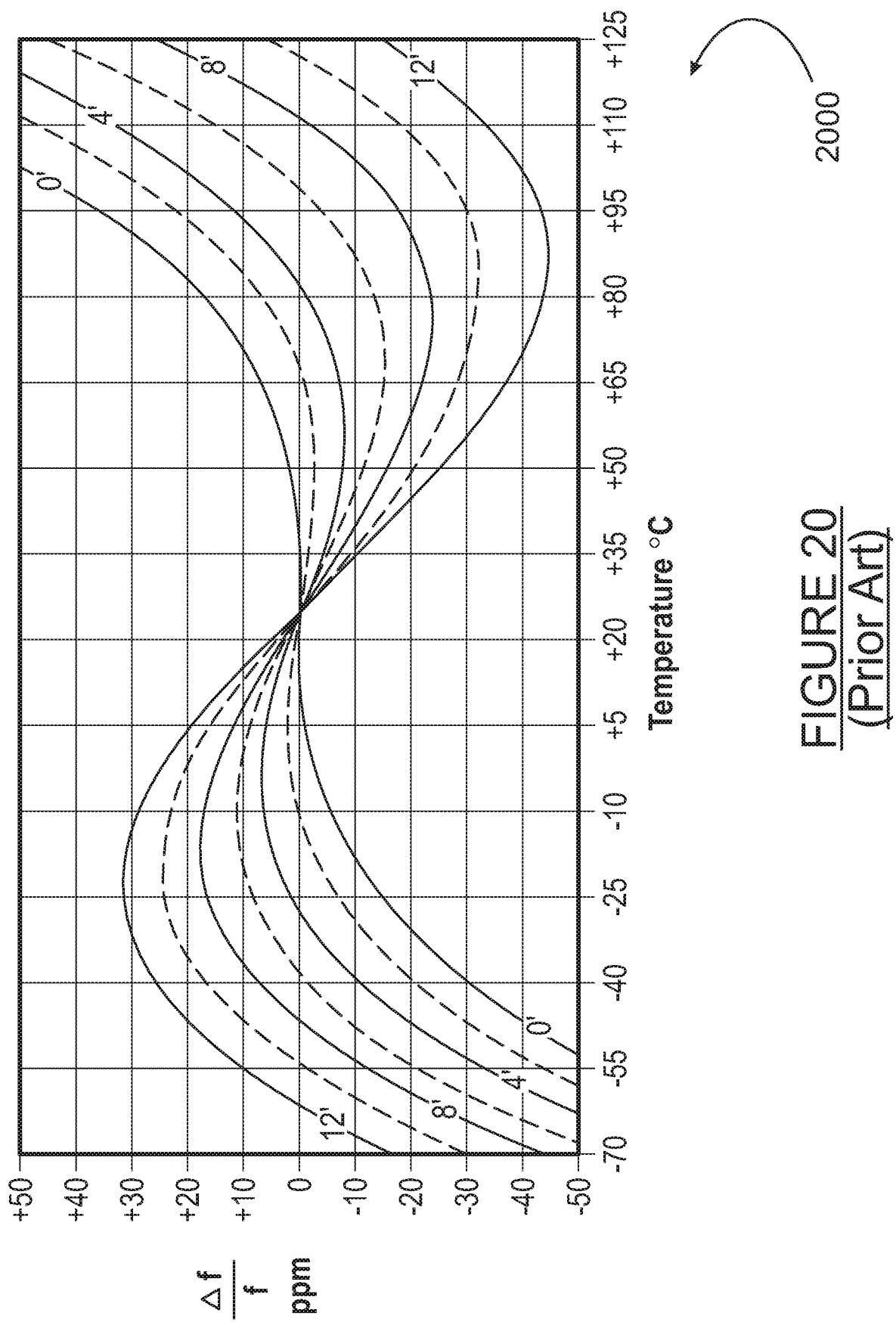
FIG. 20 is a graph of frequency variation of a piezoelectric crystal on a vertical axis vs. temperature on a horizontal axis, as known in the art.

As discussed earlier, it is also well known that crystal resonators and oscillators are sensitive to temperature. Specifically, the frequency of oscillation of a piezoelectric material is known to vary as a function of temperature. FIG. 20 is a graph 2000 of frequency variation on a vertical axis vs. temperature on a horizontal axis for a piezoelectric crystal, where the frequency variation (Δf/f) is measured in parts per million (ppm), as known in the art.

Various techniques have been employed to achieve temperature stability of crystal resonators and oscillators. A crystal oven is a temperature-controlled chamber used to maintain the quartz crystal in electronic crystal oscillators at a constant temperature, in order to prevent changes in the frequency due to variations in ambient temperature. An oscillator of this type is known as an oven-controlled crystal oscillator (OCXO, where "XO" is an old abbreviation for "crystal oscillator".) This type of oscillator achieves the highest frequency stability possible with a crystal by ensuring that the temperature of the crystal remains constant at a turn point. OCXOs are typically used to control the frequency of radio transmitters, cellular base stations, military communications equipment, and for measurement equipment.

A variation on the OCXO is also known wherein a thermal sensor, control amplifier and a heater are used, and the sensor is disposed directly upon the surface of the crystal resonator and the heater element is formed by depositing a resistive element directly upon the surface of the crystal. Inter-connection is then made between the resistive heater element and the sensor to an external control circuit in order to provide feedback control of the crystal temperature.

The OCXO and crystal-applied sensor/heater approaches can be improved by several aspect of the present disclosure. First, mechanically antiparallel mounting of twin resonators will improve Γ. Second, mode control enabling a beat frequency by dual mode produces a more accurate temperature sensor. These mode control and Γ control features enable a more compact, faster thermal response, and somewhat lower power oven controlled crystal oscillator, or oven controlled oscillator with other types of resonators. Furthermore, intrinsic control of spurious modes via asymmetric resonator properties may also be used advantageously in OCXO devices and other controlled-temperature resonator/oscillator devices.

There is a potentially interesting very low power OCXO device that could be enabled by the use of the pixel and wedge/dual wedge technology. The electronic frequency pull range and the pixel frequency adjust range can be independent of each other. The choice for crystal in the OCXO is usually AT or SC cut, both of which have a frequency versus temperature curve that follows a cubic function. The AT cut performance is shown in FIG. 20. There are two points on the curve defined as the upper turning point and lower turning point. A definition of a turn point is where dF/dT=0. In other words, around a turn point, small changes in temperature create almost no change in frequency. The crystal is usually specially cut and calibrated to make the target frequency and the upper turn point coincide at a point about 5 C above the maximum operating temperature range, and the oven is used to maintain the temperature of the crystal at the turn point. This increased stability has value in some applications, but consumes power proportional to the difference in temperature between the oven set point and ambient temperatures (which could be for example −40 C).

The electronic pull range is often accomplished by means of changing the crystal's load capacitance. A secondary effect of changing the load capacitance is that it moves the turn points in the frequency versus temperature curve. This move can be quite significant at small values of load capacitance. If the oven can maintain a set point 5 C above ambient and the turn point can be moved to 5 C above ambient then the power can be reduced. If the turn point is moved by means of the load capacitance any (unwanted) frequency shift this caused could be nullified by independent frequency adjustment by pixels. If the power is low enough, there is potentially a better way to provide the heat than with a thin film of nichrome. When crystals are used in circuits they dissipate power according to their impedance and the signal strength coupled to them. In the dual mode temperature sensing approach, often the third overtone is chosen for the output frequency as well as for the signal that generates part of the beat frequency. There are constraints on this output such that the phase noise is optimized. There is much less constraint on the fundamental signal that is generated as the second part of the beat frequency. The power dissipation in this mode can vary widely without any undue effect on the other (and may in some cases improve the other). The beat frequency is still generated and still has high accuracy. By changing the power dissipated in the crystal to cause a 5 C rise in temperature, the crystal's own internal resistance generates the heat. The heat is more uniformly generated and more quickly distributed compared to a thin film heater. Furthermore, in this approach, the need for provision of power to the thin film heater is eliminated. In some cases, additional pairs of electrodes can be used to separate out the temperature sensing function from the output frequency function, allowing more design latitude for either or both.

For non-temperature-controlled devices, where external circuitry is traditionally used to pull a resonator back to a target frequency due to temperature-induced drift, pixel projection of electrodes on a wedge-shaped crystal also offers an alternative technique for frequency correction. That is, the location of the pixel-projected electrode on the wedge or tapered crystal affects the frequency of vibration, and this projection location can be adjusted to compensate for temperature-induced frequency drift. This technique is fully compatible with all of the mode control and acceleration sensitivity control features discussed above.

Many concepts have been described In the preceding discussion, including: the use of asymmetric resonator electrodes for obtaining a composite signal with intrinsic mode control; types of mode control, including spurious mode suppression, reduced insertion loss/spurious loss ratio, third overtone and higher designs, etc.; many means of achieving resonator asymmetry, including differing electrode areas, electrode materials, electrode positioning, asymmetric mounting, and projection vs. mass loading electrodes; pixel projection of electrodes; wedge-shaped and tapered crystals, especially with pixel projection; Γ control via mechanically anti-parallel mounting of two or more pairs of electrodes; and improved temperature compensation techniques. Now that all of these topics and techniques have been discussed, several other applications become evident for the presently disclosed monolithic composite resonator devices with intrinsic mode control and Γ control features, and are discussed below.

The possibility of transmitting and receiving data by means of projecting electrodes has also been disclosed, although only in the context of a simple pulse. The potential exists for more advanced communication by coupling means to and from pixels (i.e., the circuit 1220 of FIG. 12) on the projection surface facing the gap to the crystal. The pixels and control circuits can be multiplexed (switched) to accomplish this function, a portion can be multiplexed, or a portion could be dedicated, and combinations thereof. The data transferred could be used for programming or re-programming pixels for electrode configurations when multiplexed back to the primary function. The data could be sensor data intended for storage and later read out, etc. The multiplexed use of pixels for communication applies to BAW, SAW, FBAR, HBAR and other resonators to the degree it is practical.

The preferred embodiment for projection of pixels, discussed above relative to FIG. 12, is a square of metal prepared by thick film, or more preferably thin film techniques. Also included are various doping methods which can be employed to make semiconductors conductive. Other shapes such as rectangles, circles and the like are within the scope. The cross section of these pixels prepared by the above common techniques tends to be roughly rectangular, that is the square of metal has essentially flat upper and lower surfaces. It is known that electric field strength emanating from tapered points is stronger than those from flat surfaces. In cases where pixels are more useful emanating from tapered points, the projection surface may be shaped accordingly, in addition to the more common flat profile. Shapes such as hillocks, steps, etc. are also envisioned. The various profiles and shapes of pixel arrangements can be on either side of the resonators, on a suitable material across an upper gap from the resonator, on a suitable material across a lower gap from the resonator or in any combination of these.

In the case of quartz crystals, beveled blanks are common, such as the pipe beveling discussed earlier. The end result is blanks that were originally flat and parallel on the two principle faces, now have a tapered contour. The taper is greatest in the long direction of the rectangular blanks, but it is not possible to prevent some taper in the short direction. This method is then less preferable than the etching method for the forming of a precision dual wedge profile. However, beveling has the advantage of being already in common practice and at low cost. By using the pixel based electrodes with independent control of gain and phase as discussed earlier, the degradation caused by the unwanted beveling in the width direction can be partially and in some cases completely compensated. This allows many resonators to extend to lower frequency range with less or no compromise from beveling.

Crystal beveling can be viewed as a type of mode control, in that it takes a certain amount of beveling time to insure the ESR is lower at the fundamental in some cases than the third overtone as discussed previously. On the other hand, there have been studies that claim that $\Gamma$ suffers as beveling increases. With some independent control of the modes by way of pixels, asymmetric resonator electrodes and other methods described, adequate mode control may be achieved with less beveling, which makes $\Gamma$ lower in general, and results in less $\Gamma$ after various compensation techniques, both intrinsic and active.

Pixels connected to variable gain and phase amplifiers as discussed above, and the image so projected, can have the effect of emulating a contour when desired or suppressing a contour when and where it is not desired. The pixels have thus far been described generally as on or off, where the off state is considered variously as electrically floating, tri-state, high impedance, isolated, etc. Other degrees of freedom exist in which the pixel can be on, but for example 180 degrees out of phase with adjacent pixels. This may provide options for additional levels of suppression for spurious modes that occur at particular locations on the resonator as compared to simple floating. Any amplitude or phase for each pixel as is convenient for tasks related to mode control and performance enhancement are envisioned in the present disclosure.

Programmable pixels with sufficient packaging and pin out could have an option for field update potential. For example, if simulations after product deployment showed a better or higher margin mode control by changing one or both pixel based electrode areas, the upgrade could be enabled after customer install. That is, there is potential for software upgrade of resonator performance, or upgrade to address a customer problem.

At the factory level, programming pixels could stave off certain customer design issues. For example, to the degree there were no major compromises elsewhere, every crystal could have the same resistance. This would make it easier for a customer to stay within a crystal's drive level specifications and improve the confidence for start-up since the range of conditions and number of variables affecting start up would be reduced.

There is prior art in the area of quartz crystal microbalance that could benefit from the principles described herein. For example, there is a known chemical sensor in which rows and columns of resonator electrodes are formed on the crystal, but the crystal is flat, and no provision is made for the resonators to be mechanically anti-parallel relative to mounting points (they are depicted in the prior art in the direction to make $\Gamma$ uncontrolled, random and additive.) A similar base structure of rows and columns of resonator electrodes could be created, but with the techniques of the present disclosure applied to provide intrinsic mode control and $\Gamma$ control. In addition, certain dielectric and conductive signatures of chemicals disposed between the electrode(s) and resonator(s) can be sensed in addition to those directly adding mass to the system.

In the area of filters, including monolithic crystal filters constructed with the pixel and wedge technique, the option to move the center frequency of the filter by means of moving pixels according to the present disclosure is envisioned. The ability to dynamically adjust the lateral gap between resonators is also envisioned. In addition, the present disclosure applies to an arrangement in which each resonator has a similar one mounted mechanically anti-parallel which improves $\Gamma$ and mode control.

The preferred embodiment described relative to FIGS. 11 and 12 is to have a captive IC for controlling pixels, however, the present disclosure also makes provision for a package in which no IC is present and some or all of the pixels are routed to pads or pins outside the package. An external IC of any compatible design by any parts can then interface to the crystal to obtain some or all of the benefits described.

The preferred embodiment described relative to FIGS. 13A-13D calls for the resonator to be flat, wedge or dual wedge shaped and the projection surfaces facing it to essentially be flat. Provision was made that the pixels on these surfaces could have various shapes and profiles. In addition, the projection surfaces themselves facing the resonators could be flat, wedge or dual wedge shaped, or have smaller surface features intended to increase the pixel projection effectiveness as discussed above.

In addition, the electrode itself, i.e. the metal or conductor material, can be wedge or right triangle shaped by etching or other methods. The tapered mass loading effect will affect modes, including spurious modes and also frequency pull range. The interaction of tapered mass loading electrodes with pixels in projected electrodes extends options for mode control and other properties.

Most of the preceding discussion was focused on the use of a crystal as the piezoelectric material. However, it should be understood that the principles of the present disclosure can be applied to any suitable resonator material—including dielectrics, ceramics, thin film materials, etc.

The concept of mechanically antiparallel mounting for Γ control can be extended beyond a single pair of resonators mounted on opposite sides of a single mount line. In this case, each resonator has a partner which is located mechanically antiparallel with respect to a mounting point.

In another embodiment, when used in a circuit off the resonant frequency, pixel projection electrodes and wedge crystal construction make possible a high precision programmable capacitor.

Another option for pixel electrode projection on a wedge or tapered crystal may be described as an internal hold-off. This would allow the crystal resonance to start in some mode or condition which is relatively easy to achieve, then "move" the resonance to a mode which is more difficult to start but easy to continue after it starts.

A phase-locked loop (PLL) is a control system that generates an output signal whose phase is related to the phase of an input signal. A voltage-controlled oscillator (VCO) is an electronic oscillator whose oscillation frequency is controlled by a voltage input, where the applied input voltage determines the instantaneous oscillation frequency. A VCO is an integral part of a phase-locked loop. The VCO in a PLL could be replaced by a wedge shaped crystal with pixel projection. This could improve the Q factor compared to LC type VCOs. Pixel based SAW could also be applied in a PLL. Pixel projection could be used to make BAW and SAW resonators on one AT cut crystal substrate. Pixel projection could also be used to make BAW and FBAR resonators on one AT cut crystal substrate.

The device configurations and techniques disclosed above can be employed for providing many types of performance enhancement in a single-crystal resonator device (or resonator using any piezoelectric material). By introducing an asymmetric size, shape or some other parameter between the two resonators (or two sets of resonators) on the crystal, different resonant responses can be obtained and combined to provide intrinsic mode control, which can be combined with other design considerations to obtain acceleration sensitivity control, frequency vs. temperature improvements, and other benefits. These benefits are achievable in passive resonator devices, actively tuned resonator devices, and up-integrated devices such as oscillators. The resulting performance improvements and/or reduced part count enable electronic devices such as mobile phones and radar systems which use these resonators to be made smaller, faster, more reliable and less expensive.

In the preceding discussion, especially as related to FIGS. 11-13, the projection of virtual electrodes across a gap onto the piezoelectric material was discussed. In particular, the pixel-based projection of electrodes was disclosed, where the pixel-based projected electrodes are used either in combination with or in lieu of conventional mass-loading (e.g., metal) electrodes.

The preceding discussion of pixel-based projected electrodes was in the context of monolithic composite resonator devices having two or more pairs of electrodes on a single piezoelectric element. However, the concept of pixel-based projected electrodes is applicable not only to composite resonator devices with more than one resonator, but to many types of resonators and related devices, including those with only a single resonator on a crystal or other piezoelectric element.

Pixel based projected electrodes offer a tremendous amount of flexibility and adaptability in implementation. For example, the choice of pixels, i.e. on/off from a row and column array defines the control of the projected electrode "image". Optional magnitude and phase control of "on" pixels provides independent adjustment of one relative to the next. Independent control of each pixel can be used for any purpose, among them reducing spurious responses of the resonator so defined.

The resonator can be formed with projected electrodes on opposite faces of a resonator material as in the case of transverse shear. The resonator can be formed with projected electrodes on the same face of the resonator as in the case of lateral field electrodes. There can be more than one pair of electrodes projected on a single resonator material. Each pair of electrodes can be deliberately isolated from the next as needed. Alternatively, pairs of resonators may be formed in which the response is deliberately coupled to form a composite resonator, as discussed in detail in preceding sections of this disclosure.

There can be pixel projected electrodes on several discrete materials instead of a single material, each generating a frequency thereby. The materials could vary markedly in thickness, material composition, and other properties, with all pixels generated by, or controlled by, one integrated circuit die, or in some cases one die per side. There can be more than one resonator material/technology covered or influenced by the pixels simultaneously. For example, quartz/BAW, ZnO/FBAR, sapphire/electrostrictive resonators, Lithium niobate/SAW, certain silicon/MEMS and combinations of these.

The devices can be configured in many programmable and controllable ways—including resonators, filters, oscillators, TCXOs, VCXOs, VCOs, PLL-XOs (all discussed above), etc. Adaptive control of the pixel pattern may be used to achieve desired response characteristics, to compensate for temperature or vibration, and for other purposes. The embodiments mentioned above, and others, are described in detail below. It is to be understood that the devices disclosed in these embodiments may be interconnected in any suitable manner to create integrated or composite systems—including directly physically nesting individual devices together, connecting devices via a communications bus, etc.

Figure 21:
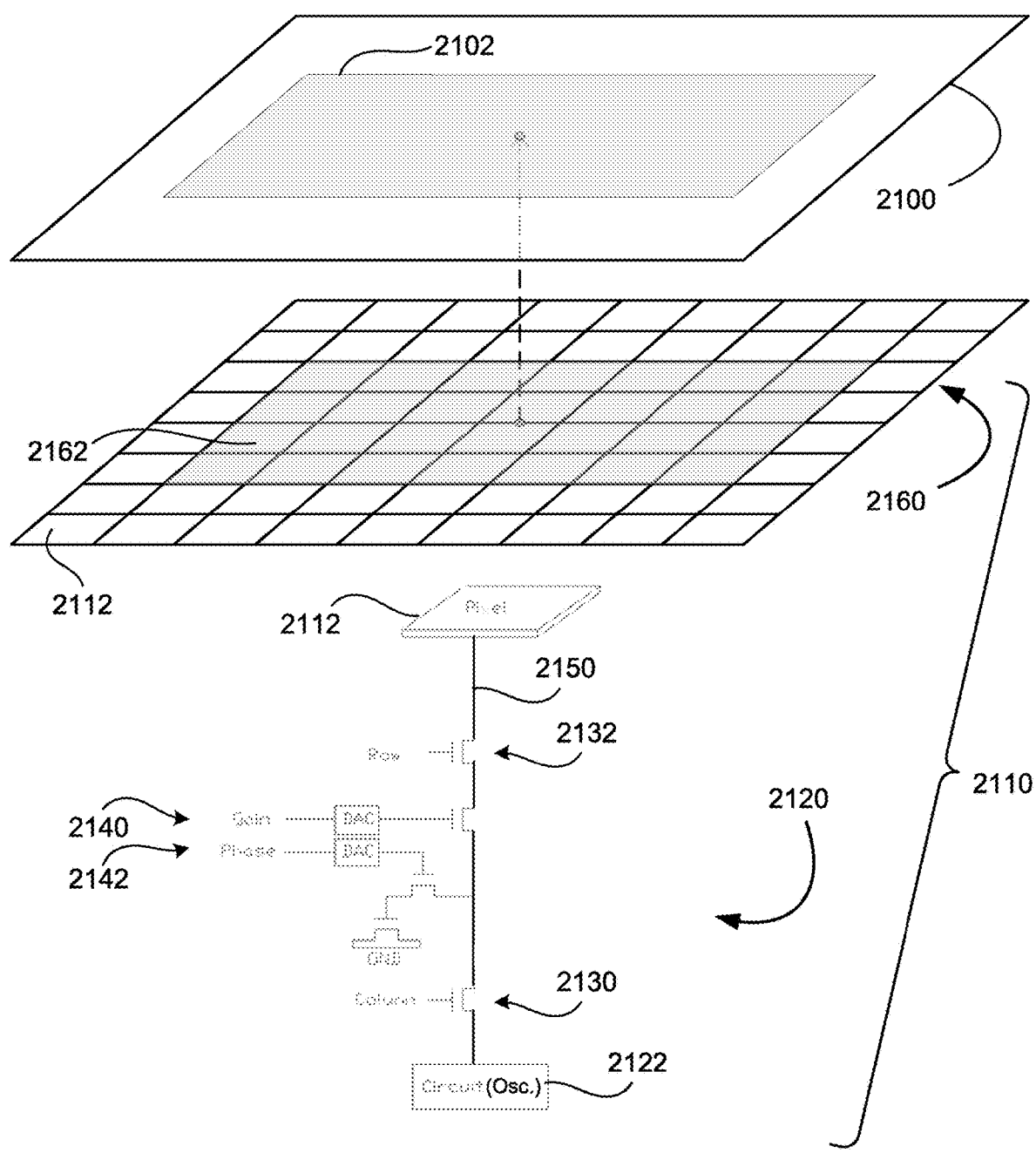
FIG. 21 is an illustration of a pixel-projection single electrode system, according to an embodiment of the present disclosure.

FIG. 21 is an illustration of a pixel-projection single electrode system, according to an embodiment of the present disclosure. The system of FIG. 21 is the same as the system of FIG. 12, except FIG. 21 includes only a single resonator electrode. FIG. 21 is included in order to clearly disclose the application of pixel based electrode projection in single electrode devices. The pixel-projection system of FIG. 21 includes a crystal 2100 which may have no physical electrodes applied to it, and a projection system 2110. In a preferred embodiment, the projection system 2110 is a semiconductor device configured with a switching circuit 2120 and a top metal layer 2160 which serves as a projection surface for projecting pixels of electromagnetic (EM) energy to, and receiving pixels of EM energy from, the crystal 2100. An identical projection system 2110 may optionally be located above the crystal 2100, in the same manner as described previously with respect to FIGS. 11A-11C.

The projection system 2110 includes a grid of pixels 2112, arranged in rows and columns, shown both in the top metal layer 2160 and (one) at the top of the switching circuit 2120 below. Each of the pixels 2112 is electrically isolated from its neighbors by a strip of insulation or dielectric material, so that each of the pixels 2112 can independently project EM signals. The pixel-projection single resonator system can be connected to an oscillator circuit 2122, whereby the resonator system provides the desired resonant amplification. A signal from the oscillator circuit 2122 is coupled to the pixel

2112 by way of a column control switch 2130 and a row control switch 2132. The switches 1230 and 1232 may be FET switches in the semiconductor device, or some other technology, and control the particular pixel 2112 which is projected by way of row and column selection.

An optional gain control branch 2140 enables gain control for each individual pixel's projection, and an optional phase control branch 2142 enables phase control for each individual pixel's projection, in the manner discussed previously for FIG. 12. Gain control and phase control may be pre-established and remain static throughout the usage of the resonator system, or gain and phase control may be dynamically adapted by a microprocessor or other device (ASIC, etc.) during resonator system usage based on external circuit conditions, environmental conditions, etc.

It is to be understood that the projection system 2110 can both send EM energy signals to the pixels 2112 and receive EM energy signals back from the pixels 2112, such as by using a multiplexing approach, as also discussed previously with respect to FIG. 12. It is also noted that the top metal layer 2160 cannot have other solid metal (conductor) layers above it, but may have an insulating or dielectric layer above it, or an alternate grid of metal pixels and insulating squares, where the pixels of EM energy are transmitted through the insulating or dielectric layer which serves to attenuate the signals in a known manner. This construction is discussed further below.

The projection system 2110 ultimately projects a signal upward (toward the crystal 2100) from some of the pixels 2112 on the top metal layer 2160. Shown toward the center of FIG. 21 is a pixel area 2162 (shaded pixels) which projects a (virtual) projected electrode 2102 on the crystal 2100. FIG. 21 represents a fundamental embodiment of the present disclosure, including pixel based projection of the single electrode 2102 across a gap onto the crystal 2100.

When compared to a single resonator device having a metal electrode and using the same crystal 2100, the pixel based projected electrode 2102 offers many advantages. First, the frequency response (see previous discussion of FIG. 3) may be tuned via amplitude and phase control of individual pixels (including leaving some pixels off) in order to minimize spurious modes or achieve other desired effects. Second, the pixels may be controlled to compensate for (counteract) changes in the frequency response due to temperature, externally-applied vibration, etc.

Certain types of resonators require electrodes on only one side of the crystal. Others require electrodes on both sides. Accordingly, a second semiconductor projecting pixels across a gap (that is, another projection system 2110 above the crystal 2100) may be included, for projecting a second independent image or images on the opposite side from the first. The resonator material (the crystal 2100) between the semiconductor materials can be completely free of all metallization (physical electrodes), or it may have metal physical electrodes. The projection system(s) 2110 can project an image larger, smaller or the same size as any metallization on the crystal 2100, as shown previously in FIGS. 11A-11C. The signals transmitted and received can be single tone or more than one tone.

Another embodiment of the pixel based electrode across a gap would include a separation of the pixels from the semiconductor device, but letting them remain controlled by the semiconductor device. This allows a trade-off between the cost of the IC with increased area to support the pixels directly versus the added complexity to form the pixels on a lower cost dielectric or semiconductor material and interconnecting the IC to the pixels. An example and advantage of this embodiment is that it would allow the pieces in closest proximity to the resonator material to potentially be the same material as the resonator material or a better match with respect to coefficient of thermal expansion than certain semiconductor materials. Though interconnection adds complexity, the separation technique has potential where one IC controls pixels on both sides. Constructions and embodiments are discussed further below.

Each pixel at minimum can be independently controlled with respect to on and off. In addition, each can have its own amplifier for controlling the magnitude of the signal(s) received or transmitted by the pixel. Each can have its own phase shifter for controlling the phase, as discussed above. It is also possible to aggregate the combined effect of all or some portion of the enabled pixels without amplifying or phase shifting or post amplifying and phase shifting for further processing. In this way, wide latitude is afforded to the designer for "drawing" electrodes of various shapes and combinations and "projecting" them onto the resonator material. Pixels which adversely affect mode control, for example by amplifying spurious modes, are left "off".

The pixels 2112 shown in FIG. 21 are square or rectangular shape. However, other pixel shapes and patterns may be employed as suitable and advantageous, as discussed earlier. Other elements and features may also be added as discussed earlier with respect to FIG. 12—including a second electrode which is asymmetric from the first, variable crystal thickness, and combination of virtual (pixel projection) and physical (metal layer) electrodes. Other combinations will occur to those skilled in the art.

Pixel projection of dual electrodes across a gap onto wedge shaped or tapered crystals was shown in FIGS. 13A-13D and discussed previously. The advantages of pixel projection of electrodes onto non-uniform thickness crystals are also applicable to single resonator devices, according to the following discussion.

In FIG. 13A, a dual wedge shaped crystal 1300 with a pixel-projection electrode system was depicted, where a resonator electrode was projected onto each end of the piezoelectric element 1300 and the two resonator signals were combined in a composite resonator device. It is to be understood that a single-ended wedge shaped crystal with pixel projection is also an advantageous embodiment. In the case of a single wedge crystal 1300 (i.e., the right half of FIG. 13A), only the pixel-projection electrode system 1320 having pixels 1322 is provided. As mentioned previously, pixels can be projected on both sides ("top" and "bottom") of the wedge shaped crystal 1300, or on only one side. In the case of one side, there can be metallization on the opposite side of the crystal 1300, or conductive material on a surface across a gap, combinations of these and also the option of neither.

Techniques for creating wedge shaped or tapered resonators were discussed earlier with respect to FIG. 13A. Also discussed and shown earlier were other non-uniform crystal shapes—including an inclined shape crystal, an inclined shape on top of a secondary substrate, and a crystal with multiple wedges and plateaus. Any of these non-uniform thickness crystals may be used with pixel projection of electrodes to achieve a resonator system with frequency response characteristics which are readily adjustable by moving the projected virtual electrode (via pixel on/off control) to a different thickness location on the crystal. This type of frequency response adjustment can be employed to compensate for temperature-induced frequency drift, in one example.

The elements and features of the devices shown in FIGS. 13 and 21—with pixel based electrodes operating across a gap, on/off control of individual pixels, gain and phase control of "on" pixels, and projection onto parts of a crystal having different thicknesses—provide numerous advantages over prior art devices. Techniques for constructing a pixel projection system, and embodiments of various devices employing pixel based electrode projection, will be described in the discussion that follows.

A preferred embodiment for constructing a pixel projection system was shown in FIG. 21 and described above. That construction of a projection system includes a semiconductor device configured with a switching circuit and a metal layer (top or near top) which serves as a projection surface for projecting pixels of EM energy to, and receiving pixels of EM energy from, the crystal which is located in close proximity across a small gap. The top metal layer may be etched or treated in a way to define discrete pixels, with the gaps between the metal pixels 2112 filled with an insulating material, thereby providing design latitude to the characteristics of projection. Gaps between pixels, or alternately overlapping of pixel patterns on the crystal, may be employed for optimal effect. The semiconductor device (IC) may include all of the switching, gain and phase control and other elements needed for pixel projection.

Figure 22A:
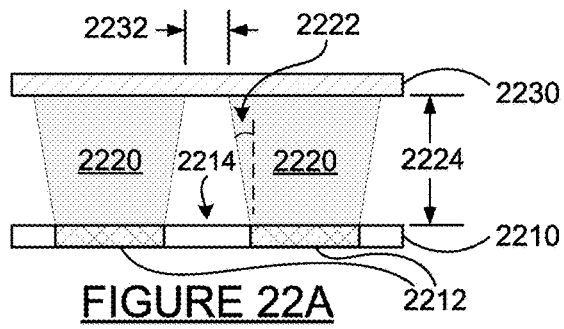
FIGS. 22A, 22B and 22C are side view illustrations of a pixel-projection system projecting pixels of electromagnetic energy onto a piezoelectric element, according to embodiments of the present disclosure.
Figure 22B:
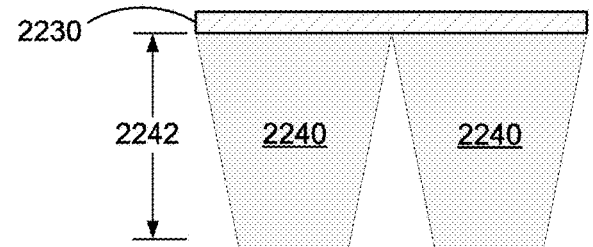
Figure 22C:
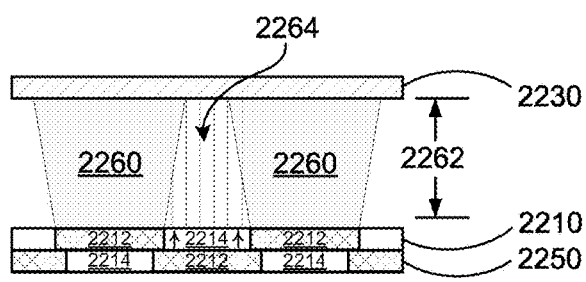

FIGS. 22A, 22B and 22C are side view illustrations of a pixel-projection system projecting pixels of electromagnetic energy onto a piezoelectric element, according to embodiments of the present disclosure. In order for each pixel projection element to be able to independently project an EM signal as needed, the metal projection element (the top metal layer 2160 in FIG. 21) may be etched or treated in a way to define individual pixel elements, with the resulting small gap between individual pixel elements filled by an insulating or dielectric material. Various projection system designs are discussed below which account for the gap between pixels and achieve the desired characteristics of the virtual electrode on the piezoelectric element.

In FIG. 22A, a projection element 2210 is equivalent to the top metal layer 2160 of FIG. 21, and includes individual metal pixel projectors 2212 separated by a strip of insulating material 2214. The width of the strip 2214 (the gap between projecting pixels) may be wider or narrower, depending on manufacturing process capabilities and desired EM pixel characteristics. It is to be understood that each of the pixel projectors 2212 has a rectangular or square projection surface. Each of the pixel projectors 2212 projects a pixel of EM energy 2220 toward a piezoelectric element (crystal) 2230, as discussed previously. The EM pixels 2220 spreads at an angle of diffusion 2222. Based on the width of the strip 2214, the diffusion angle 2222 and an air gap height 2224, a gap 2232 remains on the piezoelectric element 2230 where no EM pixel energy impinges. In some applications, gaps such as the gap 2232 may be intentionally used to create a desired frequency response from the piezoelectric element 2230. However, in other applications, it may be desirable to minimize or eliminate the gap 2232.

In FIG. 22B, the projection element 2210 is the same as in FIG. 22A, with the individual metal pixel projectors 2212 separated by the strip of insulating material 2214. Each of the pixel projectors 2212 projects a pixel of EM energy 2240 toward the piezoelectric element (crystal) 2230, as before. However, in FIG. 22B, an air gap height 2242 is larger and is designed to eliminate the gap 2232 in the projected electrode on the piezoelectric element 2230. In this embodiment, the projected electrode on the piezoelectric element is a contiguous area, as shown in the projected electrode 2102 of FIG. 21.

In FIG. 22C, the projection element 2210 is the same as before, and is still the top layer of the semiconductor device. However, in this embodiment, a second projection element 2250 has been added, in a layer below the top layer. In one embodiment, the projection element 2250 has the same construction as the projection element 2210 (including the metal pixel projectors 2212 separated by the strip of insulating material 2214), but the projection element 2250 is positioned so that the metal pixel projectors 2212 in the element 2250 align with the strips of insulating material 2214 in the element 2210, and vice versa. In this way, the pixel projector 2212 in the element 2250 can project its EM energy through the insulating material 2214 directly above it to produce an attenuated pixel of EM energy 2264 filling the gap between direct pixels 2260. A thin layer of insulating or dielectric material (not shown) may be added between the element 2210 and the element 2250 in order to prevent direct contact between the metal pixel projectors 2212.

The embodiment shown in FIG. 22C offers many design parameters which can be configured to achieve a desired response characteristic in the piezoelectric element 2230. These design parameters include the width (area) of the metal pixel projectors 2212, the width of the strip of insulating material 2214, a thickness (not numbered) of the projection elements 2210 and 2250, an air gap height 2262 of the direct pixels 2260, and material properties (permittivity) of the insulating material. In addition, the gain and phase control of individual ones of the pixel projectors 2212 can be controlled to achieve the desired response. For example, the gain of the pixel projectors 2212 in the element 2250 could be greater than the gain of the pixel projectors 2212 in the element 2210, in order to balance the attenuated pixel 2264 with the direct pixels 2260. Furthermore, the design of the element 2250 could be different (different size pixels) than the element 2210, and more than two layers could be used. All of these design parameters may be tailored to achieve the desired resonant response for a particular application.

Another important consideration in pixel based projection of electrodes onto a piezoelectric element is that, in many cases, the size (area) of the IC die (the projection system) will not be the same as the size (area) of the electrode to be projected onto the crystal. In such cases, a means of converging (shrinking) or diverging (enlarging) the projected pattern of pixels is needed. It is expected that the more common situation will be where the IC die is smaller than the desired electrode area on the crystal. For example, it may be desirable to use a readily available IC die which is one mm square, and want to pixel-project an electrode of two mm square on the crystal. Therefore, this case (where the pixel pattern needs to diverge, or be enlarged in projection, will primarily be discussed below. Similar techniques could be used to converge (shrink or tighten) a pixel projection pattern.

Figure 23:
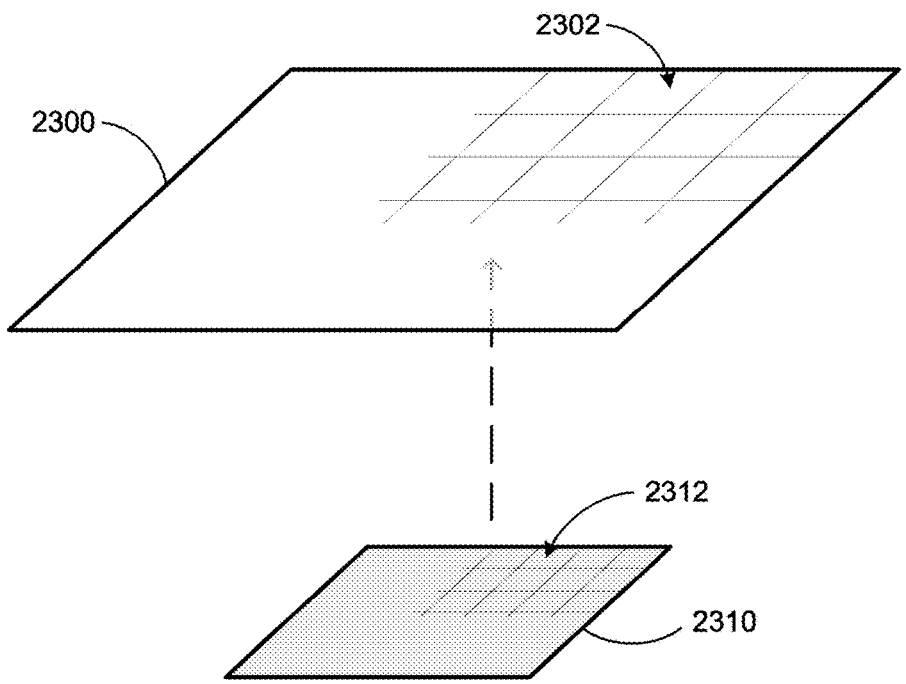
FIG. 23 is an illustration of a pixel-projection electrode system, where the projected electrode is expanded in size during projection, according to an embodiment of the present disclosure.

FIG. 23 is an illustration of a pixel-projection electrode system, where the projected electrode is expanded in size during projection, according to an embodiment of the present disclosure. A piezoelectric element or crystal 2300 has an electrode projected upon its lower surface in the form of a grid of electrode pixels 2302. A projection system 2310, such as an IC die with a top metal surface as discussed earlier, projects a grid of pixels 2312. Each one of the pixels 2312 projected by the projection system 2310 corresponds with one of the electrode pixels 2302 on the crystal 2300.

Consider, for example, that the projection system 2310 has a size of 1 mm×1 mm (area=1 mm$^2$), and the crystal 2300 has a size of 2 mm×2 mm (area=4 mm$^2$). Because of this size difference, the pixel pattern must be enlarged and redirected as it is projected onto the crystal 2300, so that each of the individual pixels 2312 on the projection system 2310 is directed to the corresponding individual pixel 2302 on the crystal 2300. Several construction embodiments are envisioned for producing the pixel projection enlargement/redirection effect shown in FIG. 23.

There exists an electromagnetic equivalent to an optical lens, where EM waves are refracted when traveling through a medium in which their velocity is different. Such an EM lens comprising a shaped material or materials, including metamaterials, could be placed in the space between the projection system 2310 and the crystal 2300 to provide the needed refraction.

Figure 24:
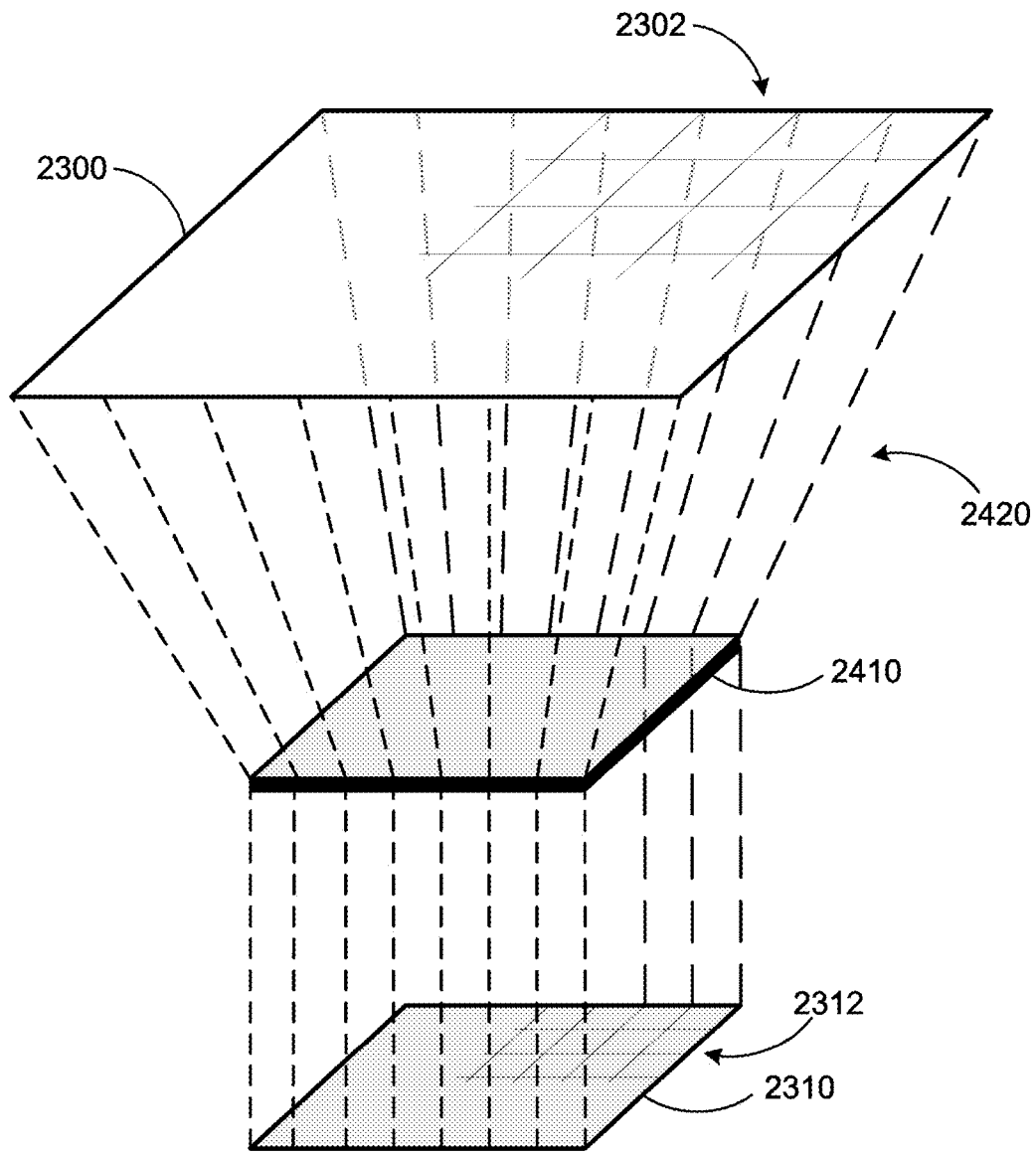
FIG. 24 is an illustration of an electromagnetic (EM) lens placed between a projection system and a crystal for pixel redirection, according to an embodiment of the present disclosure.

FIG. 24 is an illustration of an electromagnetic (EM) lens 2410 placed between the projection system 2310 and the crystal 2300 for pixel redirection, according to an embodiment of the present disclosure. The projection system 2310 projects its pixels 2312 perpendicular to its surface. When each pixel of EM energy hits the EM lens 2410, the pixel is refracted and expanded in a manner similar to an optical lens, as shown by dashed lines 2420. The EM lens 2410 is configured such that each of the pixels 2312, upon passing through the lens 2410, is redirected to the corresponding electrode pixel 2302. Vertical distances are exaggerated in FIG. 24 for clarity of illustration.

Figure 25A:
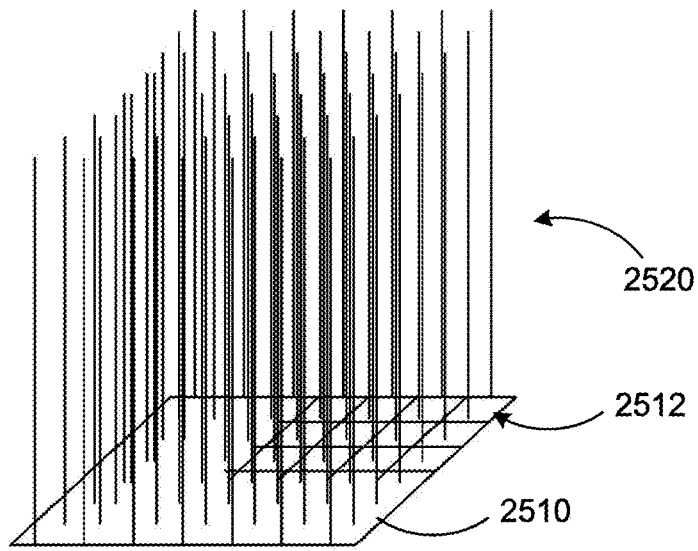
FIGS. 25A and 25B are illustrations of an array of guide elements placed between a projection system and a crystal for pixel redirection, according to an embodiment of the present disclosure.
Figure 25B:
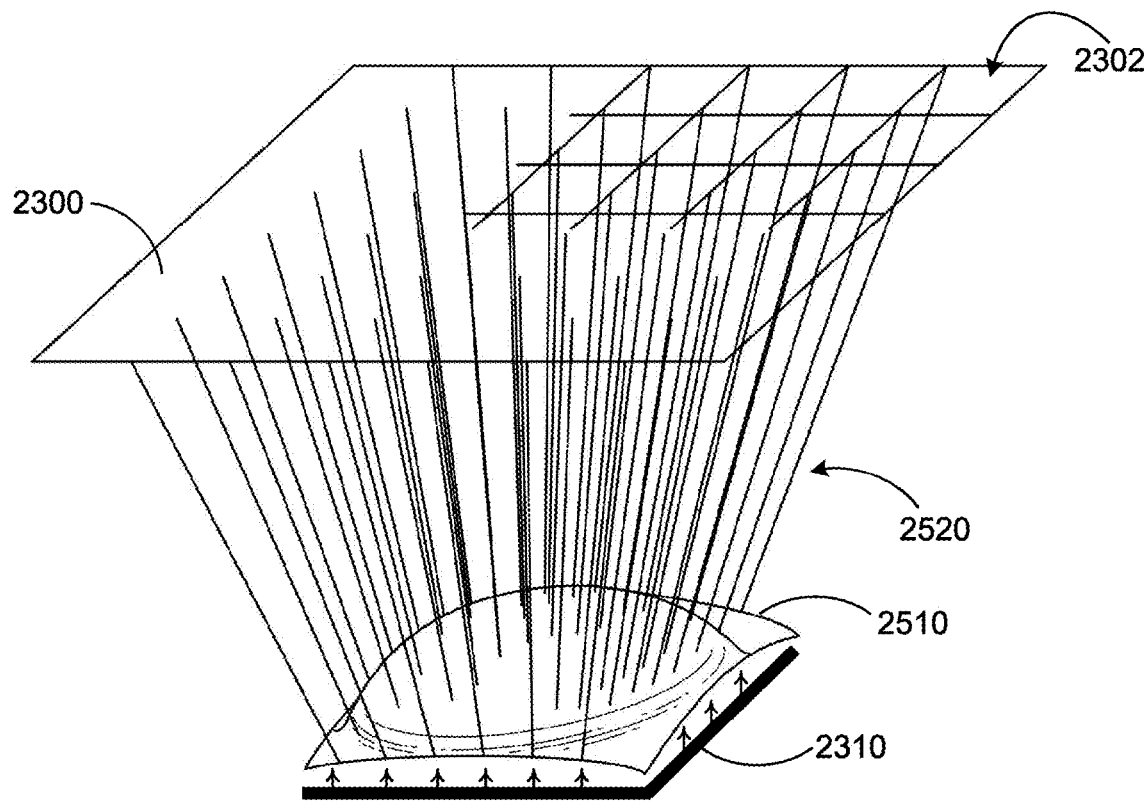

FIGS. 25A and 25B are illustrations of an array of guide elements placed between the projection system 2310 and the crystal 2300 for pixel redirection, according to an embodiment of the present disclosure. Carbon nanotubes offer one possible means of enlarging or shrinking the pixel projection as shown in FIGS. 25A and 25B. In particular, this technique would begin by growing a "forest" of carbon nanotubes 2520 on a flat piece of a pliable substrate 2510, as shown in FIG. 25A. The pliable substrate 2510 has a size which matches that of the projection system 2310 (shown in FIG. 25B, and previously in FIG. 23), where each patch 2512 of the substrate 2510 is equivalent in size to one of the pixels 2312 (FIG. 23). Each of the patches 2512 of the substrate 2510 includes at least one of the carbon nanotubes 2520, so that there is at least one of the carbon nanotubes 2520 for each of the pixels 2312.

The pliable substrate 2510 is then bent into a convex-upward shape and placed in proximity to the projection system 2310, as shown in FIG. 25B. The projection system 2310 projects its pixels directly upward onto the bottom of the substrate 2510, as shown at the bottom of FIG. 25B. The curved shape of the substrate 2510 causes the carbon nanotubes 2520 to flare out in a pattern such that the EM energy of each of the pixels 2312 is directed to a corresponding one of the electrode pixels 2302 on the crystal 2300. This approach provides the pixel pattern enlargement needed for the electrode on the crystal 2300. Conversely, the pliable substrate 2510 could be bent into a concave-upward shape for any application where the pixel pattern needs to be shrunk in projection.

There is also a technique of making conductive nanowires in polymethyl methacrylate (PMMA) template materials. Nanowires of this type could be formed in a matrix similar to the carbon nanotubes 2520 of FIG. 25B, where the nanowires would similarly direct the EM energy of the pixels 2312 to an expanded electrode pixel pattern on the crystal 2300. In this case, instead of dissolving the template to release the wires, if the nanowires were left embedded in the template material, they would be electrically insulated from one another better than free standing carbon nanotubes. PMMA is a type of plastic and could be formed to spread the image as discussed above relative to the pliable substrate. Other types of plastics could also be envisioned. Also, stiffeners (such as epoxy) could be added after forming the plastic to its final convex shape, so that the shape would not distort with temperature, especially soldering temperature.

Another construction embodiment which is envisioned for producing the pixel projection enlargement effect illustrated in FIG. 23 involves the use of a pair of IC dies nested together into an assembly, where the larger of the two IC dies has a size corresponding to the desired projected electrode on the crystal 2300. In this embodiment, the size amplification is not achieved by a spreading or divergence of the projected pixels, but rather by internal interconnect paths between the two IC dies in the assembly. Illustrations and discussion of this embodiment are provided below.

FIGS. 26A-26D are illustrations of progressive steps of manufacturing a pixel projection system comprising two IC dies nested together, according to an embodiment of the present disclosure. FIG. 27 is an illustration of a pixel projection system 2700, which is the end result of the fabrication steps of FIGS. 26A-26D, projecting a pixel-based electrode onto a surface of a crystal 2710, according to an embodiment of the present disclosure.

The idea behind constructing a pixel projection system from two IC dies nested together is that a first IC which includes the logic processing and circuitry for pixel projection (on/off control, gain and phase control, etc. to achieve the desired resonance behavior) should be kept as small as possible, because this type of IC die is expensive on a per-unit-area basis. A second, larger IC can be used to physically perform the projection of the pixels in the desired electrode size, where this larger IC die can be produced at a much lower cost because it will require no processing of transistors, and no sub-micron line widths. By embedding the first IC in the second IC and making the required interconnects, a compact, cost-effective, right-sized projection system is achieved with the required circuitry and programmability.

Figure 26A:
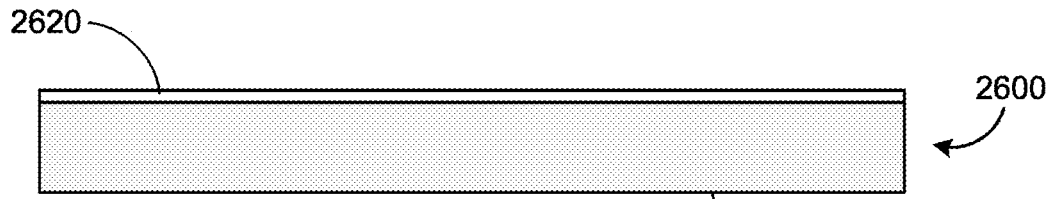
FIGS. 26A-26D are illustrations of progressive steps of manufacturing a pixel projection system comprising two IC dies nested together, according to an embodiment of the present disclosure.
Figure 27:
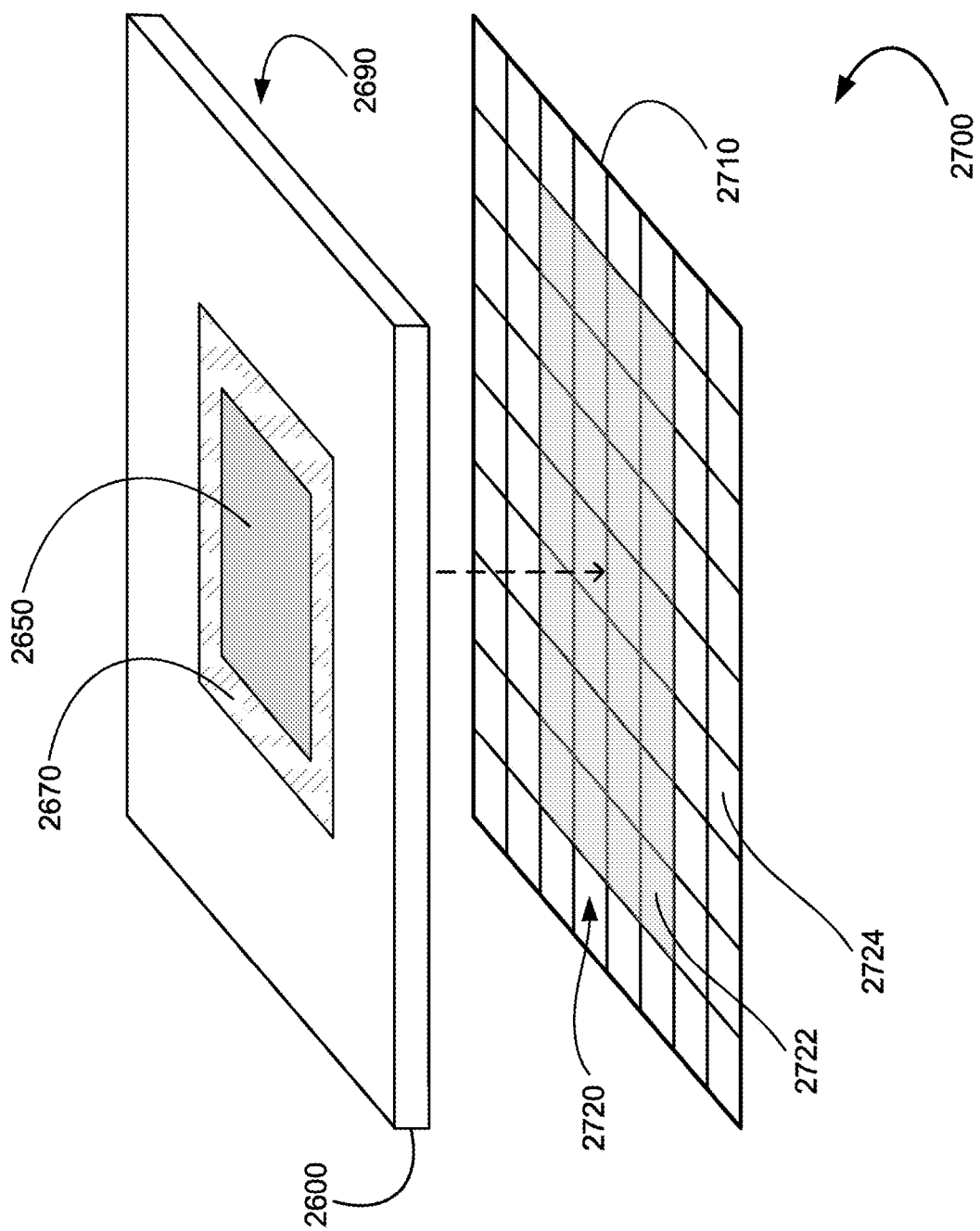
FIG. 27 is an illustration of a pixel projection system, which is the end result of the fabrication steps of FIGS. 26A-26D, projecting a pixel-based electrode onto a surface of a crystal, according to an embodiment of the present disclosure.

FIG. 26A is a side, cross-sectional view illustration of an integrated circuit (IC) die 2600 which will be used to fabricate a pixel projection system, according to an embodiment of the present disclosure. The IC die 2600 has a size selected to match the desired pixel projection pattern on a crystal, as discussed above. The IC die 2600 is simple in construction. The IC die 2600 comprises a base semiconductor layer 2610 (typically silicon) and a silicon dioxide layer 2620 serving as a diffusion mask.

The processing of the IC die 2600 can be done by a "post-fab" company such as an advanced packaging company. The IC die 2600 can be processed without "fab level" equipment and costs. No transistors need to be processed on the IC die 2600, no sub-micron line widths are required, and no sub-micron mask alignment is required. Each process in the production of the IC die 2600 is coarse compared to foundry level precision, which allows the cost of the IC die 2600 to be kept very low. As an example, the starting material for the simple IC die 2600 could be <100> P-type silicon, test grade, 300 mm diameter×775 μm thick, which at the present time costs a fraction of a penny per square millimeter.

Figure 26B:
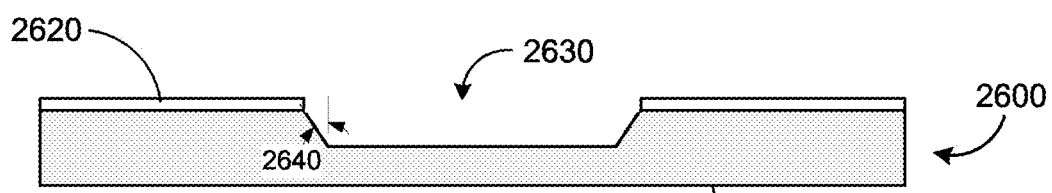

FIG. 26B is a side, cross-sectional view illustration of the IC die 2600 at a subsequent processing step. In FIG. 26B, a divot 2630 is etched into the IC die 2600 using, for example, potassium hydroxide and water as an etchant. If the material is <100> P-type silicon, then the etchant makes an angle 2640 relative to vertical of about 35 degrees. This is a timed etch that is stopped before a hole forms all the way through the base semiconductor layer 2610. An additional target of the etch timing is to make the depth of the divot 2630 the same height as the fabrication-quality IC which is going to be placed therein.

Figure 26C:
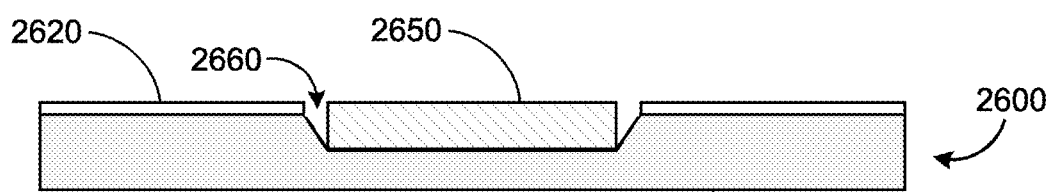

FIG. 26C is a side, cross-sectional view illustration of the IC die 2600 at a subsequent processing step, where an IC die 2650 is placed in the divot 2630. The IC die 2650 is produced at a high end fabrication facility at generally high start-up (mask) costs and high per unit area cost. As discussed earlier, the IC die 2650 includes the logic processing and circuitry for pixel projection (on/off control, gain, phase, etc. to achieve the desired resonance behavior), and because of the higher unit-area cost should be kept as small as possible. As an example, at the present time, 0.25 µm 5 metal layer CMOS costs several cents per square millimeter after dicing, which is at least 15 times more expensive than the IC die 2600.

The following specifications are listed in order to provide an understanding of the size and required capabilities of the IC die 2650. It was mentioned earlier that the IC die 2650 may have a size of about 1 mm×1 mm. This size die could accommodate a 100×100 array of pixels (10,000 pixels) which are 10 µm square. However, the transistor density for a CMOS die is high enough to easily control many more than 10,000 pixels. The 0.25 µm 5 metal layer CMOS of the IC die 2650 can support a transistor density of approximately 125,000 transistors/$mm^2$. In contrast, the pixel control circuitry would require only a few thousand transistors—that is, at a minimum, one per row (100) and one per column (100) position, plus more transistors in order to control magnitude and phase. The point is, the transistor density of the fab grade IC die 2650 is not a limiting factor for pixel count; rather, the cost per unit area is the limiting factor (at least for many applications). This is the reason for using the small IC die 2650 for pixel programming circuitry, and the large IC die 2600 for true-size pixel projection of the electrode.

In order to assemble the IC dies 2600 and 2650, conductive epoxy can be dispensed into the divot 2630 and the fab grade IC die 2650 "pick and placed" into the divot 2630 and the epoxy cured. The <100> P-type silicon material of the simple IC die 2600 is chosen because its thermal expansion coefficient best matches that of the fab grade IC die 2650 which is embedded therein. When the IC die 2650 is cemented into the divot 2630 of the IC die 2600, a "moat" 2660 remains around the periphery of the IC die 2650. The moat 2660 is the gap caused by the 35 degree angle produced by the etching process, where the fab grade IC die 2650 will have a 90 degree side wall after going through a dicing saw.

Next, it is necessary to planarize the composite mechanical structure of FIG. 26C by filling in the moat 2660. A material or series of materials that may include spin-on glass could be used for planarizing. An advantage of spin-on glass is that it dispenses as a liquid and so, it seeks it own level. It does not have to be spun; dip, spray, and drip are alternates.

Figure 26D:
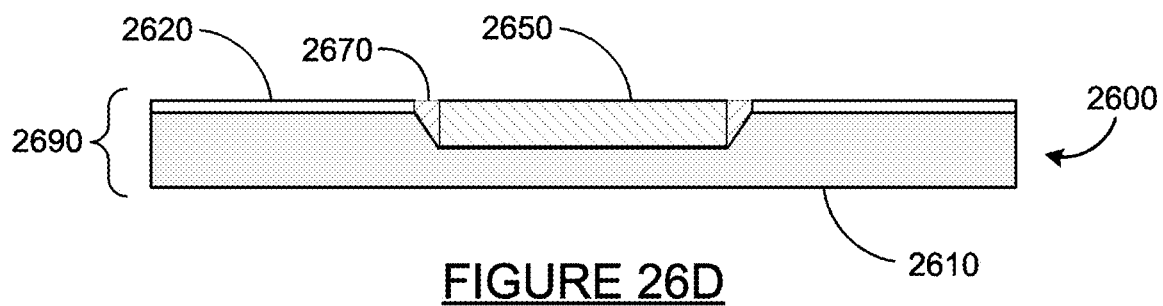

FIG. 26D is a side, cross-sectional view illustration of an IC assembly 2690 comprising the IC die 2650 nested within the IC die 2600, according to an embodiment of the present disclosure. In FIG. 26D, the moat 2660 is filled in with a filler material 2670, such as the spin-on glass mentioned above. It is desirable to prevent the spin-on glass from getting on the fab grade IC 2650, in order to avoid covering the interconnect "pads". If the spin-on glass gets on the fab grade IC 2650 and covers the pads, etching down to the pads is required to make an interconnect.

As shown in FIG. 26D, the assembly 2690 is structurally complete. Next, a metallization step is needed to electrically interconnect the IC dies 2650 and 2600. There are different techniques to choose from for cost-effectively performing this step. Shadow masks with 10 µm features can be obtained for a very reasonable cost, as the mask alignment for 10 µm can be done manually with an optical microscope, and no stepper required. A mask design that connects the small pads on the fab grade IC 2650 to bigger pads on the simple IC 2600 is developed. It is understood that leaving room for 10 µm wide interconnect paths affects the pixel count, but only slightly. The pattern of interconnects and bigger pixel pads may be done for example by copper evaporation through the mask. The metal crosses the moat filler 2670 without needing a wire bond. In this way, numerous interconnection "wires" are formed simultaneously and at low cost.

Alternatively, a subtractive method could be used. Throughout FIGS. 26A-26D, although only a single instance of the ICs 2600 and 2650 are shown, it is to be understood that the processing would preferably be performed on an entire wafer (such as a 300 mm diameter wafer) containing thousands of the simple IC dies 2600. A uniform layer of metal could be sputtered which covers the entire wafer, including all of the simple ICs 2600 and fab grade ICs 2650. A photoresist could be spun on, patterned, etc. in the known fashion. This would allow metal etching line and space widths down to 1 µm interconnecting pads that are 10 µm×10 µm. Thus, this technique requires less routing space but no more alignment accuracy than the shadow mask method described previously.

There is also the possibility to fill the moat 2660 with a flexible material rather than rigid glass. There is also the possibility to construct a temporary "hump" over which the metal is formed and patterned. The metal is made thicker for this option. The hump is etched away after the metal is formed making a free standing "arch". These options are meant to provide stress relief for the metal interconnect as it bridges the moat 2660 if needed.

Using one of the techniques described above, electrical interconnection is established between the fab grade IC 2650 and the simple IC 2600. The assembly 2690 therefore contains the pixel processing power in the fab grade IC 2650 which is kept small in order to reduce cost, and contains the desired pixel projection size and shape in the simple IC 2600. The outer periphery of the simple IC 2600 could have a number of 100 µm×100 µm pads to facilitate wire bonding to some further package. For example, the fab grade IC 2650 could be 1×1 mm in size, the simple IC 2600 could be 3×3 mm and an oscillator ceramic package could be 7×5 mm, in one embodiment.

Alternatively, the simple IC 2600 itself could be made to serve as a portion of the package. Sealing could be done to either another simple IC, a simple IC/fab IC combination, or some other material and encompassing the piezoelectric material upon which the pixelated electrode images are to be projected.

Though the primary intent of the above discussion of construction of the two-IC assembly 2690 is to implement a means to "spread" the effective area from which to project pixel images, many high I/O count devices could benefit from this technology. Based on the preferred embodiment described above, alternative implementations and extensions will occur to those familiar with the art.

FIG. 27 is an isometric view illustration of a pixel projection resonator system 2700, according to an embodiment of the present disclosure. The system 2700 includes the two-IC assembly 2690 of FIG. 26D and a piezoelectric crystal 2710. The two-IC assembly 2690 includes the simple IC 2600, along with the embedded fab grade IC 2650 surrounded by the moat filler 2670. The bottom surface (not visible) of the simple IC 2600 is metalized for pixel projection, as discussed earlier.

The crystal 2710 is approximately the same size as the simple IC 2600, such that the simple IC 2600 can project electrode pixels onto the crystal 2710 without requiring shrinking or enlarging the pixel pattern upon projection. A virtual electrode 2720 is projected onto the crystal 2710 by a pattern of "on" pixels 2722. Other pixels 2724 remain off. The "off" pixels 2724 do not contribute to the electrode 2720 as currently depicted, but may be turned on at any time to enlarge the electrode 2720, for example. Some of the pixels currently depicted as the "on" pixels 2722 within the electrode 2720 may be turned off during resonator operation, or may be controlled for gain and/or phase, in order to fine tune the resonance behavior of the crystal 2710.

As discussed many times above, a pixel-based virtual electrode may be projected onto the "top" of a crystal, or the "bottom" of the crystal, or both, depending on the application. Of course, "top", "bottom", "up" and "down" are all simply convenient terms to describe orientation in the drawings, and don't signify any gravity-based constraint on designs. In other words, FIGS. 21 and 23-27 could be flipped upside down and be equally applicable.

Using any of the above techniques, it is possible to construct a pixel projection system using one or more IC dies and optionally having the projection pattern expanded or contracted to create a desired electrode area on a crystal or other material. Even on a uniform thickness crystal, controlling the pixel pattern of the virtual electrode (on/off, gain and phase control of individual pixels) enables the frequency response of the crystal to be tuned to enhance desirable characteristics (such as a target mode) and/or suppress undesirable characteristics (such as spurious modes). When wedge shaped crystals are included, the tuning opportunities are even greater—including pixel modulation to move the electrode to a thicker or thinner portion of the crystal in order to compensate for temperature-induced frequency drift, for example.

Given the preceding discussion of pixel projection of a virtual electrode onto a piezoelectric element to create a resonator or oscillator device, many other spin-off applications may be envisioned, as discussed below.

It was discussed at length in the earlier disclosure of composite resonator devices that acceleration sensitivity is a key consideration in resonators. Specifically, "gamma" (Γ) cancellation, or partial cancellation of the acceleration sensitivity vector through mechanically antiparallel mounting, was disclosed for composite resonator devices. In another technique, U.S. Pat. No. 5,963,098 by MacMullen discloses an FM discriminator style vibration canceller circuit. MacMullen describes a 90 degree phase shifter made of a potted inductor, and expressly warns against using a quartz device as part of this shifter.

The vibration canceller circuit could be improved, however, if there was more than one resonator and the difference between the two with respect to vibration was known (or knowable through test). For example, if a resonator in the FM discriminator 90 degree phase shifter was exactly double the gamma of the resonator in the oscillator, the gain of the amplifier could be adjusted (by a factor of two) and the cancellation would proceed as before. Any ratio, not just integer, is possible if it is known and within the adjustment range of the amplifier. It also does not have to be a single ratio for the entire acoustic frequency band; different bands could have different weights as is known in the art for audio equalizers. The advantage is that no bulky inductor is required in the phase shifter. To the degree to which ESR adjustment and gamma match are independent, with pixel projection there is the ability to adjust the Q of the discriminator by changing the ESR of the resonator until it ideally just covers the band of vibration frequencies of interest, for example 2 KHz.

As an example, consider a design where one side of a center mounted dual resonator has mass loading electrodes and is used as the VCXO. The other side of the resonator in this design is bare and controlled by virtual electrodes from pixel projection. The Q for the virtual electrode side is made deliberately lower for wider vibration frequency band cancellation. This design is not a composite resonator as disclosed and shown previously in FIGS. 10 and 11. Rather, in the design discussed here, the second side is acting as a vibration sensor for the first.

A similar concept would be to run the vibration canceller open loop. That is, to dispense entirely with the FM discriminator described above. In this embodiment, a monolithic crystal with two independent devices (isolated electrically and acoustically from each other) could be used, or two separate crystals (having the same acceleration sensitivity vector Γ) could be used.

Figure 28:
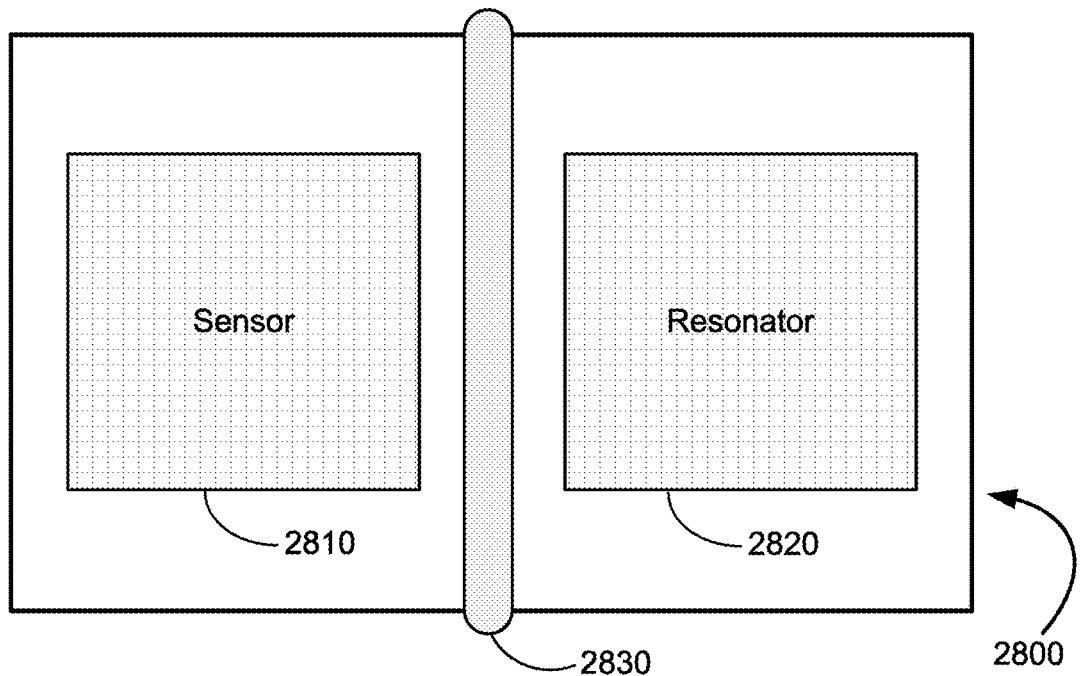
FIG. 28 is a top-view illustration of a crystal with two independent devices functioning as a vibration sensor and a resonator, according to an embodiment of the present disclosure.
Figure 29:
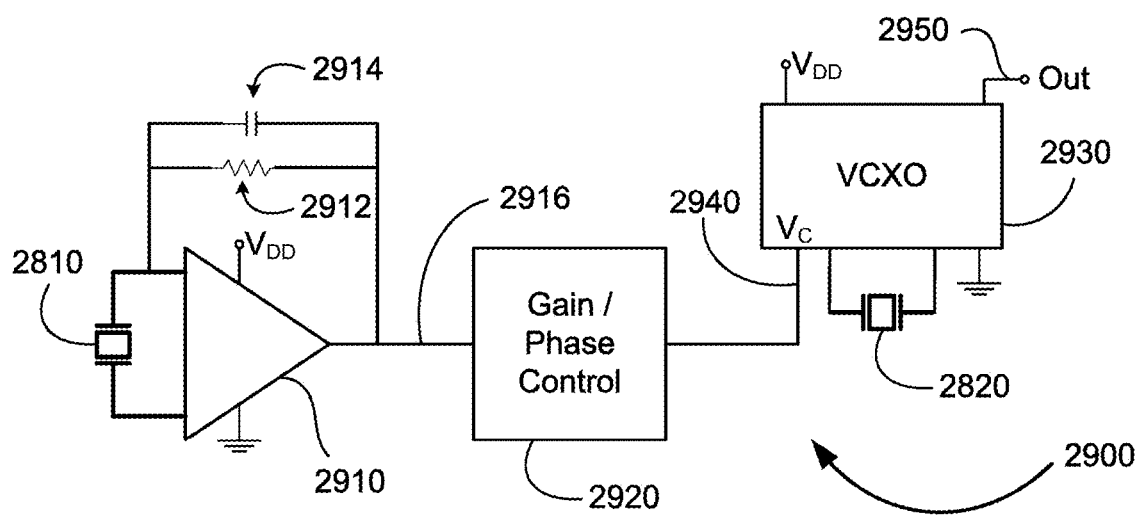
FIG. 29 is a schematic diagram illustration of an oscillator device having open loop vibration cancellation using the sensor and the resonator of FIG. 28, according to an embodiment of the present disclosure.

FIG. 28 is a top-view illustration of a crystal with two independent devices functioning as a vibration sensor and a resonator, according to an embodiment of the present disclosure. FIG. 29 is a schematic diagram illustration of an oscillator device having open loop vibration cancellation using the devices of FIG. 28, according to an embodiment of the present disclosure.

In FIG. 28, a crystal 2800 includes a sensor 2810 and a resonator 2820. The sensor 2810 and the resonator 2820 are on opposite sides of a mounting strip 2830, where the sensor 2810 and the resonator 2820 are electrically and mechanically (acoustically) isolated from each other. However, by virtue of being on the same crystal 2800, the sensor 2810 and the resonator 2820 will have similar acceleration sensitivity. The sensor 2810 and the resonator 2820 are preferably created using pixel projection electrodes as described above, although physical electrodes may be used instead or in conjunction.

FIG. 29 is a schematic diagram illustration of an oscillator device 2900 having open loop vibration cancellation using the sensor 2810 and the resonator 2820 of FIG. 28, according to an embodiment of the present disclosure. The sensor 2810 is not part of an oscillator circuit; rather, its purpose is to amplify any noise that comes from the crystal 2800 due to external vibration i.e. at baseband, any signal generated from about 20 Hz to 2 KHz. The sensor 2810 then is connected to an amplifier 2910, which generates a voltage in response to the sensor signal. The amplifier 2910 has a resistor 2912 and a capacitor 2914 coupled in parallel. The output of the amplifier 2910 is provided on a line 2916 to a gain/phase control module 2920, where the gain and phase of the amplified output signal from the sensor 2810 are controlled as appropriate for use as a VCXO input signal. The intention is for the sensed vibration signal from the sensor 2810 to be applied 180° out of phase as a correction/control signal to the VCXO.

As shown to the right in FIG. 29, the resonator 2820 is used as the resonant device in a voltage controlled crystal oscillator (VCXO) circuit 2930. The gain/phase control module 2920 provides its output signal on a line 2940 to a control voltage ($V_C$) input of the VCXO 2930. Besides the control voltage ($V_C$) input, the other connection pins/pads of the VCXO 2930 include a power signal (drain voltage $V_{DD}$) and ground, as discussed earlier, along with an output pin 2950 where the VCXO output signal is provided for use by various electronic systems.

The sensor 2810 may be located on the same crystal as the resonator 2820, and electrically and mechanically isolated from each other, as shown in FIG. 28. The sensor 2810 and the resonator 2820 may also be placed on individual crystals which are of the same cut, orientation and lineage, so as to have the same acceleration sensitivity. In the case of separate crystals, when the output of the sensor amplifier 2910 is connected to the input port ($V_C$) of the VCXO 2930, it will cancel the vibration of the VCXO 2930 to the extent that the two crystals match. In the case of a single crystal 2800 as in FIG. 28, there is a high degree of intrinsic matching between the sensor 2810 and the resonator 2820. As described here, the vibration canceller of FIGS. 28 and 29 provides effective open-loop cancellation of a crystal's acceleration sensitivity vector, and reduces parts count, size, and power compared to the FM discriminator vibration canceller described above.

Pixel projection and wedge shape techniques can also be used to make a variable capacitor. For example, referring again to FIG. 22, consider that the crystal 2200 is replaced with a dielectric material. Moving a virtual electrode of a given area to a thinner section of the dielectric material will cause the capacitance to increase, and vice versa.

Pixel projection and wedge shape techniques may be used to extend the properties of various types of acoustic/piezoelectric delay lines. For example, such delay lines can more easily be variable, dynamic, temperature compensated, reconfigurable, etc., using the programming and tuning flexibility afforded by pixel-based electrode projection. That is, as shown in FIGS. 21 and 22, the on/off status, gain and phase of individual pixels can be adjusted, along with the location of the virtual electrode on a piezoelectric element (which may be tapered), in order to achieve the desired characteristics.

U.S. Pat. No. 7,788,979 to Vetelino discloses a spiral conductor photolithographically constructed on piezoelectric materials to make transducers for sensing a property—such as viscosity—of a material to which the sensor is exposed. The pattern however once constructed is not-reconfigurable. Furthermore, the mass loading effect of the metallic electrodes deposited on the piezoelectric material changes the resonant behavior of the piezoelectric material, thus necessitating extreme precision in electrode thickness when printing. The use of projected electrodes eliminates the variability associated with electrode mass loading. The use of pixel-based projected electrodes allows the shape of the spiral to be changed, either during pre-application programming, or in an adaptive manner during operation.

Figure 30:
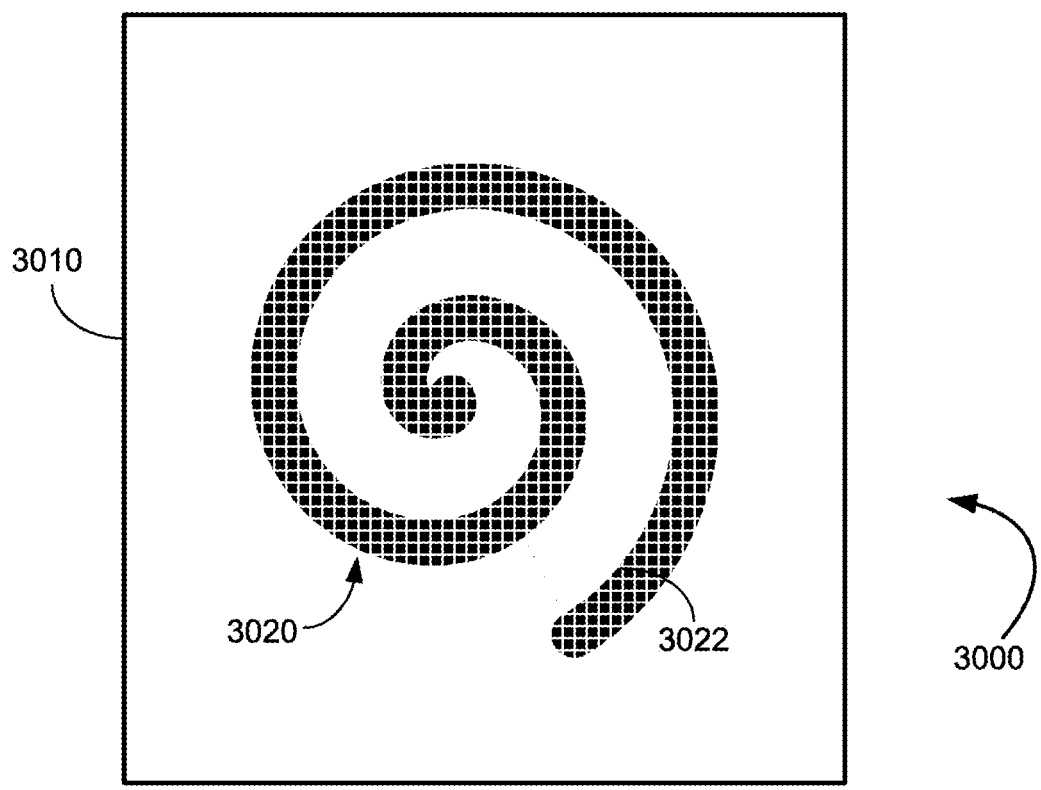
FIG. 30 is an illustration of a sensor including a piezoelectric element such as a crystal and a projected spiral electrode, according to an embodiment of the present disclosure.

FIG. 30 is an illustration of a sensor 3000 including a piezoelectric element such as a crystal 3010 and a projected spiral electrode 3020, according to an embodiment of the present disclosure. The spiral electrode 3020 is comprised of pixels 3022 projected from a projection system, which may be any of the types of pixel projection systems disclosed above. The projected spiral electrode 3020 uses a rectangular grid of pixels 3022 which are small in comparison to the spiral size. The small pixels 3022 may be advantageous in many applications, where a rectangular grid of pixels can be used to draw any shape and size of spiral on the crystal 3010, and the shape and size of the spiral determines the sensor response. Furthermore, different portions of the spiral electrode 3020 may be modulated differently through on/off control and gain/phase control to achieve the desired sensor response behavior. Other shapes besides circular spirals may also be used—such as oval, rectangular, etc.

It is also known in the art to induce motion into an electrode-free piezoelectric surface by means of a coil operating across a gap. In a manner similar to the projected spiral electrodes of FIG. 30, a physical coil can be replaced with projected pixels that are dynamically reconfigurable.

U.S. Pat. No. 5,051,643 to Dworsky discloses making micro-electro-mechanical systems (MEMS) RF switches/relays and MEMS capacitors by means of controlling a biasing voltage to pull in or actuate a mechanically moving member. Instead of a single large electrode on one or both sides of the mechanically moving member, it is proposed here that the electrode can be broken into pixels which can make a similar pattern if desired, or dynamically change to other patterns as needed. Additionally, the magnitude (gain, amplitude) of each pixel can be varied. This could be useful for example to compensate for stresses or manufacturing variations in the moving member so that its motion could be made or kept uniform. One example of such an electronic device is a resonator, where the resonant material is a semiconductor material including silicon processed into a MEMS structure, and the pixels are projected onto the semiconductor material at locations which enhance the properties of the MEMS structure. Such MEMS structures may include relays, switches, resonators and the like. Actuation or excitation can be electrostatic from a reconfigurable electrode area defined by the pixels.

The field of acoustic metamaterials, virtual phononic crystal structures and virtual band gap structures may also be improved by the pixel projection techniques of the present disclosure. It is known to control acoustic wave propagation through the use of lattice structures, matrices of holes drilled through a resonant material, etc., which isolates the resonator from "anchor losses" and other detrimental effects. The diameter and pitch of the holes are designed to achieve a desired frequency response. Pixel-based projection of electrodes—such as including a regularly-spaced matrix of "off" pixels interspersed among the "on" pixels of the electrode—may be used to stimulate the same diameter and pitch areas to achieve a similar response without drilling holes. In some cases, physical holes may still be drilled but the pixels act upon the holes to make the effective diameter (or other property) adjustable with respect to the frequency response.

Metamaterials are materials engineered to have a property that is not found in naturally occurring materials. They are made from assemblies of multiple elements fashioned from composite materials such as metals, plastics, etc. The materials are usually arranged in repeating patterns, at scales that are smaller than the wavelengths of the phenomena they influence. Metamaterials derive their properties not from the properties of the base materials, but from their newly designed structures. Their precise shape, geometry, size, orientation and arrangement gives them their smart properties capable of manipulating electromagnetic waves—by blocking, absorbing, enhancing, or bending waves, to achieve benefits that go beyond what is possible with conventional materials.

Metamaterials may be ideally suited to use in pixel projection electrode systems, either in the projection/transmitting system, or the substrate (resonant material) on which the pixels are projected, or both. In the projection system, metamaterials may be designed with a matrix grid corresponding to the size of the projected pixels, thus enhancing and sharpening the projection of the individual pixels. In this case, the metamaterial may be applied to the projecting face of an IC die (such as the bottom face of the simple IC 2600 of FIG. 26D), or the metamaterial may be used as a projecting device separate from a controlling IC. In the substrate or material upon which the pixels are projected, metamaterial properties may be desirable in the creation of antennas, resonators and other devices.

In FIG. 19, discussed previously, one half of a monolithic composite SAW/BAW resonator device was shown, where intrinsic mode control was achieved by using asymmetric resonators on the two sides of the crystal. This design could be used in a non-composite device as well, where this is just a single SAW/BAW combination. One application of such a design would be as a filter, where the BAW "resonator" in the center of FIG. 19 is replaced with a BAW filter. If the SAW electrodes 1910/1920/1940/1950 are virtual electrodes formed by pixel projection, the result would be a narrow band BAW crystal filter where the upconverted center frequency is controlled via the pixel based SAW. Other advantageous combinations of wedge shaped crystal, pixel projection and/or mass loading electrodes would result in a movable wide band filter response.

The pixel projection system embodiments discussed previously may advantageously be employed in a variety of antenna applications. Pixel-projection electrodes may be used in traditional transmit/receive antenna and receive-only applications, in both resonant and non-resonant designs. For example, in the SAW/BAW device just discussed above, the BAW area in the center could be replaced with a patch (or similar) antenna. Other resonant two-dimensional "patch" antennas could be constructed using a piezoelectric material with pixel-projected electrodes, resulting in a dynamically configurable antenna design.

In addition to using pixel projection to adjust antenna characteristics, the converse is possible and disclosed here as well. An example of a non-resonant antenna (for receive only) application involves using the metal lid of a resonator package (see FIGS. 1 and 5) as a broadband antenna, where EM signals impinging on the metal lid are converted into data, and the data is used for programming an IC inside the package. The programming data can, for example, be used for controlling which pixels are on and off, and optionally their magnitude and phase.

The antenna types and devices mentioned above could have a wide range of end-use applications, from wearable medical devices which amplify signals such as audio (hearing aids) or pressure (heart rate), to wireless battery chargers and any number of "Internet of Things" (IoT) applications. In all cases, the use of pixel projection of electrodes results in an antenna which is configurable and adaptive, and may be able to use existing device structure as the antenna surface.

In some of the pixel projection system embodiments discussed previously, a large number of electrical interconnects in a small physical space are required, such as to interconnect a pixel computing IC with a secondary projection device. In some of these applications, a via may be used for the interconnection. A via (Latin for path or way, also an acronym for "vertical interconnect access") is an electrical connection between layers in a physical electronic circuit that goes through the plane of one or more adjacent layers. In integrated circuit design, a via is a small opening in an insulating layer that allows a conductive connection between different layers. A via on an integrated circuit can also include a through-chip via or through-silicon via (TSV). A via connecting the lowest layer of metal to diffusion or poly is typically called a contact. A variety of via types and construction techniques may be used for the interconnect purposes discussed here.

Figure 31:
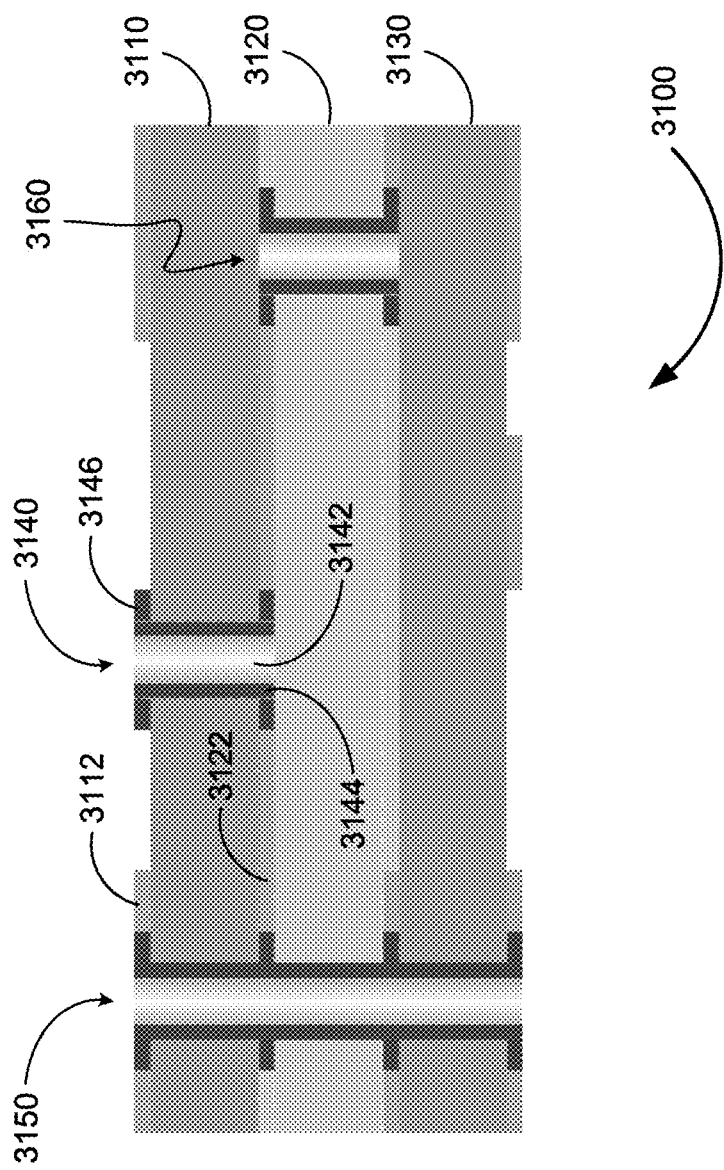
FIG. 31 is a cross-sectional illustration of a circuit assembly including different types of vias, as known in the art.

FIG. 31 is a cross-sectional illustration of a circuit assembly 3100 including different types of vias, as known in the art. Layers 3110, 3120 and 3130 are different layers creating a stacked structure in the assembly 3100, which could be a printed circuit board assembly or an integrated circuit. The layers 3110, 3120 and 3130 are comprised of a non-conducting material, or may be a semi-conducting material. Each of the layers 3110, 3120 and 3130 has one or more conductive plating layers on one or both surfaces, including the conductive layer 3112 on the top of the layer 3110 and the conductive layer 3122 on the top of the layer 3120.

A blind via 3140 passes through the layer 3110, allowing contact from the conductive layer 3122 to the top of the assembly 3100. The blind via 3140 comprises a hole 3142 through the layer 3110, a conductive "barrel" 3144 around the wall of the hole 3142, and a contact pad 3146 on each end of the barrel 3144. An "antipad" is a clearance hole between a barrel and a conductive layer to which it is not connected.

A through-hole via 3150 passes all the way through the stacked structure of the assembly 3100, providing contact from the conductive layer 3112 to the conductive layer 3122 and additional conductive layers through the thickness of the stack, and also providing contact pads at the top and bottom of the assembly 3100. A buried via 3160 is not exposed to either the top or bottom surface of the assembly 3100, but rather connects conductive layers internal to the stack.

The concept of a via, providing a conductive path through one or more layers in an assembly, may have application to the pixel projection of electrodes in several different ways. One application is the traditional use of a via—for connecting a point on one layer to a point on another layer—as is required in the two-IC nested assembly of FIGS. 26 and 27. Another application of vias is to form the actual pixel projection array itself—that is, to conduct EM energy from a projection source through one or more layers by way of the vias. Various construction techniques and applications for vias are discussed below, where in each case the goal is a via array which has small size, low cost, hermeticity (airtightness), low residual stress, and high strength compared to alternative fabrication methods.

Some techniques for forming vias and/or pixels could come from the principle of thermal gradient zone melting (TGZM). TGZM is a process by which a liquid zone in or on a solid can be caused to move through or across it by supplying a temperature gradient across the zone. In one example, the solid is single-crystal silicon and the liquid is aluminum. Applying TGZM, as the molten zone moves through the wafer, it leaves in its wake a highly conductive channel of single crystal silicon doped with aluminum.

In a further development of the embodiment discussed above, a TGZM via may be constructed as above, where the aluminum doped silicon is subsequently etched away. U.S. Pat. No. 4,681,657 to Hwang discloses techniques for preferential chemical etching composition for doped silicon. Once etched away, the result would then be access to the bare silicon in the side walls of the hole (which is preferentially lightly doped p type). It would then be possible to thermally grow an oxide layer on the silicon and refill the hole with a conductive material. This would increase the electrical isolation between vias, which would be advantageous in some applications.

It may be advantageous to include TGZM structures in the construction of resonator/oscillator packages, such as in pixel projection from an IC die. It may also be advantageous to include TGZM structures in the construction of frequency control devices, antennas, sensors, MEMS switches and capacitors, etc.

TGZM may also be used to create a multi-layer structure including many blind vias. Blind vias may be constructed by providing TGZM vias through a first bulk material, then interconnecting to a metal trace, one on each side of the TGZM via, then over-coating the trace and via with an insulating material that buries the via below the surface. The metal traces can then be routed to a new location, for example, to "spread" the pixels. An opening can then be etched through the thin insulating layer and a non-TGZM via can be formed at this new location. In such multi-layer structures, each layer may have the option of being a different material. Furthermore, through selection of appropriate materials, a TGZM via may be formed which—upon migrating through an intended material (such as the layer 3110 of FIG. 31)—stops or slows substantially upon encountering a second material (such as the layer 3120), thus allowing precise forming of the vias through particular layers of a multi-layer structure. A TGZM via may also be formed which, upon encountering a second conductive material (such as the conductive layer 3122 of FIG. 31), will make a reliable electrical interconnect to that second conductive material.

Another advantageous embodiment is a TGZM via and pixel array through and on a dielectric material such as glass that can be subsequently slumped or formed over a mold, making it possible after forming to project a pixel image that converges or diverges according the curvature. This is a combination of the TGZM via construction technique discussed above with the geometric "lens" formation of FIGS. 25A and 25B discussed previously.

The above techniques may be applicable to many different types of materials—including making vias or pixel arrays on crystalline materials, including silicon and other semiconductors; making vias or pixel arrays on non-semiconductor crystalline materials, including piezoelectric crystalline materials such as quartz, and further optionally including causing acoustic coupling between two adjacent TGZM vias in a piezoelectric solid; and making vias or pixel arrays on thin film crystalline solids, such as described above relative to the FBAR device of FIG. 16. Other material applications include making vias or pixel arrays on polycrystalline solids such as polycrystalline silicon, and also sol gel materials; and making vias or pixel arrays on amorphous solids having random order throughout and no short or long range crystalline structure, such as glass and thermally grown silicon dioxide.

The creation of trans-layer coupling mechanisms in multi-layer structures also has the potential to benefit from making other structures besides via which spontaneously occur, i.e. branching, tapers, angles, etc. and which can be controlled, including providing electrical or optical bias to influence the properties or speed with which these structures are formed.

The concept of the "antipad" was mentioned above in the discussion of FIG. 31. A related concept would be to make (annular) guard rings around vias, electrically isolated from the vias, with properties intended to acoustically, electrically or optically isolate the vias one from the next. Another advantageous embodiment would be to make such a guard ring structure that can switch between isolation and coupling with controllable degrees in between.

Throughout the discussion of pixel based electrodes projected across a gap, it has been described how the control of individual pixels (on/off, gain and phase of each) can be used to tune the response characteristics of the piezoelectric element—such as to diminish spurious modes, enhance a target mode such as fundamental, etc. Any and all software required for such pixel-based electrode control—including one-time programming of resonators and other devices, as well as active and adaptive control techniques which adjust pixels in real time based on environmental factors such as temperature and vibration, whether explicitly described or implied in the preceding discussion—is considered to be part of the present disclosure.

Furthermore, any simulations tools and models describing the design and performance of the disclosed pixel-based electrode devices—including both theoretical models and empirical models—are also considered to be part of the present disclosure.

It is to be understood that the software applications and modules described above are executed on one or more computing devices having a processor and a memory module. For example, the one-time and adaptive pixel control software will typically run on an IC that is part of the device, such as the fab grade IC die 2650 of FIG. 26. The simulation tools and models will typically be executed on an office computer or a server, and may also be run on the IC that is part of the device in order to allow adaptive device control based on the simulation model.

The pixel projected electrode configurations and techniques disclosed above can be employed for providing many types of performance enhancement in a resonator or other device. By changing electrode characteristics via on/off, gain and phase control of individual pixels, optionally including tapered crystal shapes, different resonant responses can be obtained which provide tailored mode control, and can be combined with other design elements to obtain acceleration sensitivity control, frequency vs. temperature improvements, and other benefits. The resulting performance improvements and/or reduced part count enable electronic devices such as mobile phones and radar systems which use these devices to be made smaller, faster, more reliable and less expensive.

The foregoing discussion describes merely exemplary embodiments of the disclosed devices. One skilled in the art will readily recognize from such discussion and from the accompanying drawings and claims that various changes, modifications and variations can be made therein without departing from the spirit and scope of the disclosed techniques as defined in the following claims.

What is claimed is:

1. A resonator device comprising:
    a piezoelectric element; and
    a projection element located opposite a first face of the piezoelectric element across a gap, where the projection element projects electromagnetic waves as an array of individual pixels collectively forming a virtual electrode onto the piezoelectric element and receives electromagnetic waves in the form of the pixels back from the piezoelectric element,
    where the resonator device provides an output signal from the projection element, said output signal being characterized by a resonant response of the piezoelectric element.

2. The resonator device according to claim 1 wherein each of the individual pixels is controllable to be on or off, controllable in gain and controllable in phase.

3. The resonator device according to claim 1 further comprising a projection control circuit coupled to the projection element, where the projection control circuit includes a gain control element and a phase control element, said control elements being used to modulate a projection signal to each of the individual pixels in order to produce a desired resonant response characteristic in the output signal.

4. The resonator device according to claim 1 wherein pixel control signals are computed by a device external to the resonator device and provided to the projection element, where the pixel control signals include a gain control and a phase control for each of the individual pixels in order to produce a desired resonant response characteristic in the output signal.

5. The resonator device according to claim 1 wherein the piezoelectric element has a non-uniform thickness, and the pixels are projected onto the piezoelectric element at locations which are selected based on the thickness to produce a desired resonant response characteristic in the output signal.

6. The resonator device according to claim 5 wherein the pixels are projected onto the piezoelectric element at locations which are modified in order to compensate for temperature-induced frequency drift of the output signal.

7. The resonator device according to claim 5 wherein the piezoelectric element has a cross-sectional shape of a wedge, a taper, or a wedge with one or more plateaus.

8. The resonator device according to claim 1 wherein the pixels have a shape of square, rectangular, round, triangular or hexagonal.

9. The resonator device according to claim 1 further comprising an intermediate element between the projection element and the piezoelectric element, where the intermediate element redirects and resizes the array of individual pixels such that the virtual electrode on the piezoelectric element is larger or smaller than the array of pixels on the projection element.

10. The resonator device according to claim 9 wherein the intermediate element is an electromagnetic lens device.

11. The resonator device according to claim 9 wherein the intermediate element is an array of carbon nanotubes attached at one end to a substrate, where the substrate is formed into a convex or concave shape causing the carbon nanotubes to redirect the pixels to form the virtual electrode which is enlarged or condensed relative to the projection element.

12. The resonator device according to claim 9 wherein the intermediate element is an array of conductive nanowires embedded in a matrix material, where the matrix material is formed into a convex or concave shape causing the nanowires to redirect the pixels to form the virtual electrode which is enlarged or condensed relative to the projection element.

13. The resonator device according to claim 1 wherein the projection element comprises a surface metal layer of a semiconductor device.

14. The resonator device according to claim 13 wherein the surface metal layer is divided into a plurality of individual pixel projectors separated by an insulating material.

15. The resonator device according to claim 13 wherein the projection element further comprises an additional metal layer below the surface metal layer, where the individual pixel projectors in the additional metal layer project pixels of EM energy through the insulating material in the surface metal layer to the piezoelectric element.

16. The resonator device according to claim 13 wherein the semiconductor device is sized to project the pixels of the virtual electrode onto the piezoelectric element without resizing or redirection.

17. The resonator device according to claim 16 wherein the semiconductor device is a first integrated circuit (IC) die, and a second IC die is embedded into a divot etched into the first IC die, where the second IC die includes a projection control circuit configured to compute on/off status, gain and phase of each individual pixel, and the projection control circuit in the second IC die is coupled to the projection element on the first IC die by a plurality of interconnects.

18. The resonator device according to claim 17 wherein the interconnects between the first IC die and the second IC die are formed as metal traces, where each metal trace connects a pad on the second IC die to a pad on the first IC die.

19. The resonator device according to claim 17 wherein the interconnects between the first IC die and the second IC die include vias passing through layers of the first IC die or the second IC die.

20. The resonator device according to claim 17 further comprising one or more additional interconnected pairs of the first IC die and the second IC die.

21. The resonator device according to claim 1 wherein the projection element has a projection surface made of a metamaterial having a grid structure configured to match a size of the pixels.

22. The resonator device according to claim 1 further comprising at least one physical electrode applied to the piezoelectric element, where a signal from the physical electrode is incorporated into the output signal.

23. The resonator device according to claim 22 wherein at least one physical electrode is applied to the first face of the piezoelectric element, and the physical electrode and the virtual electrode have areas which at least partially overlap.

24. The resonator device according to claim 22 wherein at least one physical electrode is applied to a second face of the piezoelectric element where no virtual electrode is projected.

25. The resonator device according to claim 1 wherein the resonator device is used in an oscillator circuit, including but not limited to a temperature controlled crystal oscillator, a voltage controlled crystal oscillator, a voltage controlled oscillator, or a phase locked loop oscillator.

26. The resonator device according to claim 1 wherein the resonator device is used in a voltage controlled crystal oscillator (VCXO), and a second projection element is located opposite the first face of the piezoelectric element, where the second projection element projects a pixel-based sensor electrode onto the piezoelectric element, where the sensor electrode and the virtual electrode of the resonator device do not overlap, and a sensor output signal from the second projection element is phase-modulated, gain-modulated and provided as a control voltage input signal to the VCXO.

27. The resonator device according to claim 26 wherein the sensor electrode has a location on the piezoelectric element which is mechanically and electrically isolated from a location of the virtual electrode of the resonator device, and the control voltage input signal offsets an acceleration sensitivity vector of the resonator device in the VCXO.

28. The resonator device according to claim 1 further comprising a second projection element located opposite a second face of the piezoelectric element, where the second projection element projects a second virtual electrode onto the piezoelectric element.

29. An electronic device comprising:
a first element; and
a projection element located opposite a face of the first element across a gap, where the projection element projects electromagnetic waves as a plurality of individual pixels collectively forming a virtual electrode onto the first element and receives electromagnetic waves in the form of the pixels back from the first element, where the electronic device provides an output signal from the first element, said output signal being characterized by a response of the first element to the electromagnetic waves projected by the projection element.

30. The electronic device according to claim 29 wherein the electronic device is a resonator, the first element is a piezoelectric crystal, and the output signal has a greatest amplitude at a resonant frequency of the piezoelectric element.

31. The electronic device according to claim 30 wherein the piezoelectric crystal has a non-uniform thickness, and the pixels are projected onto the piezoelectric element at locations which are selected based on the thickness to produce a desired resonant response characteristic in the output signal, including adjusting the locations in order to compensate for temperature-induced frequency drift of the output signal.

32. The electronic device according to claim 29 wherein the electronic device is a capacitor, the first element is a dielectric material having a non-uniform thickness, and the pixels are projected onto the first element at locations which are selected based on the thickness to produce a desired capacitance.

33. The electronic device according to claim 29 wherein the first element is a piezoelectric element, the electronic device is a sensor configured to sense a property of a substance in contact with the piezoelectric element, and the pixels form a spiral-shaped electrode on the piezoelectric element, where a size and shape of the spiral-shaped electrode are selected to achieve desired sensor characteristics.

34. The electronic device according to claim 29 wherein the electronic device is a resonator, the first element is a dielectric material with a high Q factor, said dielectric material including sapphire, and the pixels are projected onto the first element at locations which are selected to provide a resonance using electrostatic excitation properties of the dielectric material.

35. The electronic device according to claim 29 wherein the electronic device is a resonator, the first element is a semiconductor material, said semiconductor material including silicon processed into a micro-electro-mechanical systems (MEMS) structure, and the pixels are projected onto the first element at locations and amplitudes which are selected to enhance resonance properties of the MEMS structure.

36. The electronic device according to claim 29 wherein the projection element comprises a metal layer of a semiconductor device, where the semiconductor device is a first integrated circuit (IC) die, and a second IC die is embedded into a divot etched into the first IC die, where the second IC die includes a projection control circuit configured to compute on/off status, gain and phase of each individual pixel, and the projection control circuit in the second IC die is coupled to the projection element on the first IC die by a plurality of interconnects, and where the interconnects between the first IC die and the second IC die are formed as metal traces, where each metal trace connects a pad on the second IC die to a pad on the first IC die.

37. A resonator device comprising:

a piezoelectric element;

a semiconductor device comprising a projection element located opposite a first face of the piezoelectric element across a gap, where the projection element projects electromagnetic waves as an array of individual pixels collectively forming a virtual electrode onto the piezoelectric element and receives electromagnetic waves in the form of the pixels back from the piezoelectric element, said semiconductor device further comprising a projection control circuit coupled to the projection element, where the projection control circuit computes a projection signal including on/off status, gain and phase for each of the individual pixels in order to tune a resonant response of the piezoelectric element; and a base body and a lid forming a package enclosing the piezoelectric element and the semiconductor device, where the resonator device provides an output signal from the semiconductor device, said output signal being characterized by the resonant response of the piezoelectric element.

* * * * *